United States Patent
Datta et al.

(10) Patent No.: US 7,836,597 B2
(45) Date of Patent: Nov. 23, 2010

(54) METHOD OF FABRICATING HIGH SURFACE TO VOLUME RATIO STRUCTURES AND THEIR INTEGRATION IN MICROHEAT EXCHANGERS FOR LIQUID COOLING SYSTEM

(75) Inventors: Madhav Datta, Milpitas, CA (US); Mark McMaster, Menlo Park, CA (US); Rick Brewer, Union City, CA (US); Peng Zhou, Albany, CA (US); Paul Tsao, Los Altos, CA (US); Girish Upadhaya, Austin, TX (US); Mark Munch, Los Altos Hills, CA (US)

(73) Assignee: Cooligy Inc., Mountain View, CA (US)

( * ) Notice: Subject to any disclaimer, the term of this patent is extended or adjusted under 35 U.S.C. 154(b) by 693 days.

(21) Appl. No.: 11/326,690

(22) Filed: Jan. 6, 2006

(65) Prior Publication Data

US 2008/0210405 A1    Sep. 4, 2008

Related U.S. Application Data

(63) Continuation-in-part of application No. 10/680,584, filed on Oct. 6, 2003, now Pat. No. 7,000,684, which is a continuation-in-part of application No. 10/439,635, filed on May 16, 2003, now Pat. No. 6,988,534, application No. 11/326,690, which is a continuation-in-part of application No. 10/439,912, filed on May 16, 2003, now Pat. No. 6,986,382, and a continuation-in-part of application No. 10/612,241, filed on Jul. 1, 2003, now Pat. No. 7,156,159.

(60) Provisional application No. 60/642,284, filed on Jan. 7, 2005, provisional application No. 60/455,729, filed on Mar. 17, 2003, provisional application No. 60/442,383, filed on Jan. 24, 2003, provisional application No. 60/423,009, filed on Nov. 1, 2002.

(51) Int. Cl.
*B23P 15/26* (2006.01)
*F28D 15/00* (2006.01)

(52) U.S. Cl. .................. 29/890.041; 29/890.03; 29/890.032; 29/890.039; 165/104.33; 257/E23.098

(58) Field of Classification Search .......... 29/890.03, 29/890.039, 890.41, 890.032; 165/104.33; 257/E23.098

See application file for complete search history.

(56) References Cited

U.S. PATENT DOCUMENTS 596,062 A    12/1897    Firey (Continued)

FOREIGN PATENT DOCUMENTS

CN    97212126.9    3/1997

(Continued)

OTHER PUBLICATIONS

Stephen C. Jacobson et al., "Fused Quartz Substrates for Microchip Electrophoresis", Analytical Chemistry, vol. 67, No. 13, Jul. 1, 1995, pp. 2059-2063.

(Continued)

*Primary Examiner*—David P Bryant
*Assistant Examiner*—Sarang Afzali
(74) *Attorney, Agent, or Firm*—Haverstock & Owens LLP

(57) ABSTRACT

An structure and method of manufacturing a microstructure for use in a heat exchanger is disclosed. The heat exchanger comprises a manifold layer and an microstructured region. The manifold layer comprises a structure to deliver fluid to the microstructured region. The microstructured region is formed from multiple windowed layers formed from heat conductive layers through which a plurality of microscaled apertures have been formed by a wet etching process. The plurality of windowed layers are then coupled together to form a composite microstructure.

16 Claims, 24 Drawing Sheets

U.S. PATENT DOCUMENTS

| | | |
|---|---|---|
| 2,039,593 A | 5/1936 | Hubbuch et al. |
| 2,273,505 A | 2/1942 | Florian |
| 3,361,195 A | 1/1968 | Meyerhoff et al. |
| 3,524,497 A | 8/1970 | Chu et al. ..................... 165/80 |
| 3,771,219 A | 11/1973 | Tuzi et al. |
| 3,800,510 A | 4/1974 | Lamond |
| 3,817,321 A | 6/1974 | von Cube et al. |
| 3,852,806 A | 12/1974 | Corman et al. ................. 357/82 |
| 3,904,262 A | 9/1975 | Cutchaw ..................... 339/17 |
| 3,948,316 A | 4/1976 | Souriau |
| 3,993,123 A | 11/1976 | Chu et al. ..................... 165/80 |
| 4,109,707 A | 8/1978 | Wilson et al. |
| 4,203,488 A | 5/1980 | Johnson et al. |
| 4,211,208 A | 7/1980 | Lindner |
| 4,235,285 A | 11/1980 | Johnson et al. |
| 4,296,455 A | 10/1981 | Leaycraft et al. ............. 361/383 |
| 4,312,012 A | 1/1982 | Frieser et al. |
| 4,332,291 A | 6/1982 | Mulock-Bentley ........... 165/76 |
| 4,345,267 A | 8/1982 | Corman et al. |
| 4,392,362 A | 7/1983 | Little |
| 4,409,079 A | 10/1983 | Miyazaki et al. |
| 4,450,472 A | 5/1984 | Tuckerman et al. |
| 4,467,861 A | 8/1984 | Kiseev et al. |
| 4,474,172 A | 10/1984 | Burke ......................... 126/449 |
| 4,485,429 A | 11/1984 | Mittal |
| 4,494,171 A | 1/1985 | Bland et al. .................. 361/386 |
| 4,497,875 A | 2/1985 | Arakawa et al. |
| 4,516,632 A | 5/1985 | Swift et al. |
| 4,540,115 A | 9/1985 | Hawrylo |
| 4,561,040 A | 12/1985 | Eastman et al. |
| 4,567,505 A | 1/1986 | Pease et al. |
| 4,573,067 A | 2/1986 | Tuckerman et al. |
| 4,574,876 A | 3/1986 | Aid |
| 4,644,385 A | 2/1987 | Nakanishi et al. |
| 4,698,661 A | 10/1987 | Bessonneau et al. .......... 357/74 |
| 4,716,494 A | 12/1987 | Bright et al. |
| 4,758,926 A | 7/1988 | Herrell et al. |
| 4,791,983 A | 12/1988 | Nicol et al. ................. 165/80.4 |
| 4,793,405 A | 12/1988 | Diggelmann et al. ... 165/104.33 |
| 4,866,570 A | 9/1989 | Porter |
| 4,868,712 A | 9/1989 | Woodman |
| 4,884,331 A | 12/1989 | Hinshaw ..................... 29/558 |
| 4,893,174 A | 1/1990 | Yamada et al. |
| 4,894,709 A | 1/1990 | Phillips et al. |
| 4,896,719 A | 1/1990 | O'Neill et al. |
| 4,903,761 A | 2/1990 | Cima |
| 4,908,112 A | 3/1990 | Pace |
| 4,938,280 A | 7/1990 | Clark |
| 4,978,638 A | 12/1990 | Buller et al. |
| 5,009,760 A | 4/1991 | Zare et al. |
| 5,016,090 A | 5/1991 | Galyon et al. |
| 5,016,138 A | 5/1991 | Woodman |
| 5,043,797 A | 8/1991 | Lopes |
| 5,057,908 A | 10/1991 | Weber |
| 5,070,040 A | 12/1991 | Pankove |
| 5,083,194 A | 1/1992 | Bartilson |
| 5,088,005 A | 2/1992 | Ciaccio |
| 5,099,311 A | 3/1992 | Bonde et al. |
| 5,099,910 A | 3/1992 | Walpole et al. |
| 5,105,430 A | 4/1992 | Mundinger et al. ........... 372/35 |
| 5,125,451 A | 6/1992 | Matthews |
| 5,131,233 A | 7/1992 | Cray et al. |
| 5,145,001 A | 9/1992 | Valenzuela .................. 165/164 |
| 5,161,089 A | 11/1992 | Chu et al. |
| 5,199,487 A | 4/1993 | DiFrancesco et al. ....... 165/168 |
| 5,203,401 A | 4/1993 | Hamburgen et al. |
| 5,218,515 A | 6/1993 | Bernhardt |
| 5,228,502 A | 7/1993 | Chu et al. |
| 5,232,047 A | 8/1993 | Matthews |
| 5,239,200 A | 8/1993 | Messina et al. |
| 5,239,443 A | 8/1993 | Fahey et al. |
| 5,247,800 A | 9/1993 | Mruzek et al. ................ 62/51.1 |
| 5,263,251 A | 11/1993 | Matthews |
| 5,265,670 A | 11/1993 | Zingher |
| 5,269,372 A | 12/1993 | Chu et al. |
| 5,274,920 A | 1/1994 | Matthews |
| 5,275,237 A | 1/1994 | Rolfson et al. |
| 5,294,834 A | 3/1994 | Fatemi et al. ................ 257/745 |
| 5,299,635 A | 4/1994 | Abraham ..................... 165/173 |
| 5,307,236 A | 4/1994 | Rio et al. ..................... 361/720 |
| 5,308,429 A | 5/1994 | Bradley |
| 5,309,319 A | 5/1994 | Messina |
| 5,310,440 A | 5/1994 | Zingher |
| 5,316,077 A | 5/1994 | Reichard |
| 5,317,805 A | 6/1994 | Hoopman et al. |
| 5,325,265 A | 6/1994 | Turlik et al. |
| 5,346,000 A | 9/1994 | Schlitt |
| 5,380,956 A | 1/1995 | Loo et al. |
| 5,383,340 A | 1/1995 | Larson et al. |
| 5,386,143 A | 1/1995 | Fitch |
| 5,388,635 A | 2/1995 | Gruber et al. |
| 5,397,919 A | 3/1995 | Tata et al. |
| 5,421,943 A | 6/1995 | Tam et al. |
| 5,424,918 A | 6/1995 | Felps et al. .................. 361/704 |
| 5,427,174 A | 6/1995 | Lomolino, Sr. et al. |
| 5,436,793 A | 7/1995 | Sanwo et al. |
| 5,459,099 A | 10/1995 | Hsu |
| 5,490,117 A | 2/1996 | Oda et al. |
| 5,508,234 A | 4/1996 | Dusablon, Sr. et al. |
| 5,514,832 A | 5/1996 | Dusablon, Sr. et al. |
| 5,514,906 A | 5/1996 | Love et al. |
| 5,520,244 A | 5/1996 | Mundinger et al. .... 165/104.33 |
| 5,526,875 A | 6/1996 | Lin .......................... 165/80.3 |
| 5,534,328 A * | 7/1996 | Ashmead et al. ............. 428/166 |
| 5,544,696 A | 8/1996 | Leland |
| 5,548,605 A | 8/1996 | Benett et al. |
| 5,564,497 A | 10/1996 | Fukuoka et al. .............. 165/152 |
| 5,575,929 A | 11/1996 | Yu et al. |
| 5,585,069 A | 12/1996 | Zanzucchi et al. |
| 5,590,242 A | 12/1996 | Juang et al. .................. 395/2.54 |
| 5,641,400 A | 6/1997 | Kaltenbach et al. |
| 5,658,831 A | 8/1997 | Layton et al. |
| 5,675,473 A | 10/1997 | McDunn et al. |
| 5,676,198 A | 10/1997 | Schneider et al. |
| 5,692,558 A | 12/1997 | Hamilton et al. |
| 5,696,405 A | 12/1997 | Weld |
| 5,718,628 A | 2/1998 | Nakazato et al. |
| 5,726,495 A | 3/1998 | Aihara et al. ................ 257/722 |
| 5,727,618 A | 3/1998 | Mundinger et al. |
| 5,731,954 A | 3/1998 | Cheon ........................ 361/699 |
| 5,740,013 A | 4/1998 | Roesner et al. |
| 5,757,070 A | 5/1998 | Fritz |
| 5,761,037 A | 6/1998 | Anderson et al. ............ 361/700 |
| 5,763,951 A | 6/1998 | Hamilton et al. |
| 5,768,104 A | 6/1998 | Salmonson et al. |
| 5,774,779 A | 6/1998 | Tuchinskiy |
| 5,800,690 A | 9/1998 | Chow et al. |
| 5,801,442 A | 9/1998 | Hamilton et al. |
| 5,810,077 A | 9/1998 | Nakamura et al. .......... 165/153 |
| 5,811,062 A | 9/1998 | Wegeng et al. .............. 422/129 |
| 5,829,514 A | 11/1998 | Smith et al. .................... 165/78 |
| 5,830,806 A | 11/1998 | Hudson et al. .............. 438/690 |
| 5,835,345 A | 11/1998 | Staskus et al. |
| 5,858,188 A | 1/1999 | Soane et al. |
| 5,863,708 A | 1/1999 | Zanzucchi et al. |
| 5,870,823 A | 2/1999 | Bezama et al. |
| 5,874,795 A | 2/1999 | Sakamoto |
| 5,880,524 A | 3/1999 | Xie |
| 5,886,870 A | 3/1999 | Omori |
| 5,896,869 A | 4/1999 | Maniscalco et al. |
| 5,901,037 A | 5/1999 | Hamilton et al. |
| 5,909,057 A | 6/1999 | McCormick et al. ........ 257/704 |
| 5,921,087 A | 7/1999 | Bhatia et al. |
| 5,936,192 A | 8/1999 | Tauchi |

| | | | | | | |
|---|---|---|---|---|---|---|
| 5,937,557 A | 8/1999 | Bowker et al. ............... 42/70.1 | | 6,397,932 B1 | 6/2002 | Calaman et al. |
| 5,945,217 A | 8/1999 | Hanrahan | | 6,400,012 B1 | 6/2002 | Miller et al. |
| 5,953,701 A | 9/1999 | Neti et al. .................... 704/254 | | 6,406,605 B1 | 6/2002 | Moles |
| 5,960,384 A | 9/1999 | Brash ............................ 704/9 | | 6,415,860 B1 | 7/2002 | Kelly et al. |
| 5,964,092 A | 10/1999 | Tozuka et al. | | 6,417,060 B2 | 7/2002 | Tavkhelidze et al. |
| 5,965,001 A | 10/1999 | Chow et al. | | 6,424,531 B1 | 7/2002 | Bhatti et al. |
| 5,978,220 A | 11/1999 | Frey et al. | | 6,431,260 B1 | 8/2002 | Agonafer et al. |
| 5,983,997 A | 11/1999 | Hou ........................... 165/144 | | 6,437,981 B1 | 8/2002 | Newton et al. |
| 5,993,750 A | 11/1999 | Ghosh et al. | | 6,438,984 B1 | 8/2002 | Novotny et al. |
| 5,997,713 A | 12/1999 | Beetz, Jr. et al. | | 6,443,222 B1 | 9/2002 | Yun et al. |
| 5,998,240 A | 12/1999 | Hamilton et al. | | 6,444,461 B1 | 9/2002 | Knapp et al. |
| 6,007,309 A | 12/1999 | Hartley | | 6,449,157 B1 | 9/2002 | Chu |
| 6,012,902 A | 1/2000 | Parce | | 6,449,162 B1 | 9/2002 | Corbin, Jr. et al. |
| 6,014,312 A | 1/2000 | Schulz-Harder et al. | | 6,457,515 B1 | 10/2002 | Vafai et al. |
| 6,019,165 A | 2/2000 | Batchelder | | 6,459,581 B1 | 10/2002 | Newton et al. |
| 6,021,045 A | 2/2000 | Johnson | | 6,459,582 B1 | 10/2002 | Ali et al. |
| 6,034,872 A | 3/2000 | Chrysler et al. | | 6,466,442 B2 | 10/2002 | Lin |
| 6,039,114 A | 3/2000 | Becker et al. | | 6,469,893 B1 | 10/2002 | Frutschy et al. ............. 361/700 |
| 6,054,034 A | 4/2000 | Soane et al. | | 6,477,045 B1 | 11/2002 | Wang |
| 6,057,597 A | 5/2000 | Farnworth et al. .......... 257/710 | | 6,478,258 B1 | 11/2002 | Yee ............................. 244/163 |
| 6,068,752 A | 5/2000 | Dubrow et al. | | 6,492,200 B1 | 12/2002 | Park et al. |
| 6,084,178 A | 7/2000 | Cromwell .................... 174/35 | | 6,508,301 B2 | 1/2003 | Marsala ...................... 165/80.4 |
| 6,086,330 A | 7/2000 | Press et al. .................. 416/223 | | 6,519,151 B2 | 2/2003 | Chu et al. |
| 6,090,251 A | 7/2000 | Sundberg et al. | | 6,527,835 B1 | 3/2003 | Manginell et al. ............. 96/102 |
| 6,096,656 A | 8/2000 | Matzke et al. | | 6,533,029 B1 | 3/2003 | Phillips |
| 6,100,541 A | 8/2000 | Nagle et al. | | 6,533,840 B2 * | 3/2003 | Martin et al. ................... 95/45 |
| 6,101,715 A | 8/2000 | Fuesser et al. | | 6,536,510 B2 | 3/2003 | Khrustalev et al. ..... 165/104.33 |
| 6,105,373 A | 8/2000 | Watanabe et al. ............. 62/3.7 | | 6,536,516 B2 | 3/2003 | Davies et al. |
| 6,119,729 A | 9/2000 | Oberholzer | | 6,537,437 B1 | 3/2003 | Galambos et al. |
| 6,126,723 A | 10/2000 | Drost et al. | | 6,543,521 B1 | 4/2003 | Sato et al. |
| 6,129,145 A | 10/2000 | Yamamoto et al. | | 6,553,253 B1 | 4/2003 | Chang |
| 6,129,260 A | 10/2000 | Andrus et al. | | 6,562,662 B2 | 5/2003 | Shishido et al. ............. 438/125 |
| 6,131,650 A | 10/2000 | North et al. | | 6,574,597 B1 | 6/2003 | Mohri et al. ................. 704/251 |
| 6,140,860 A | 10/2000 | Sandhu et al. | | 6,578,626 B1 | 6/2003 | Calaman et al. |
| 6,146,103 A | 11/2000 | Lee et al. | | 6,581,388 B2 | 6/2003 | Novotny et al. |
| 6,159,353 A | 12/2000 | West et al. | | 6,587,343 B2 | 7/2003 | Novotny et al. |
| 6,166,907 A | 12/2000 | Chien .......................... 361/699 | | 6,588,498 B1 | 7/2003 | Reyzin et al. |
| 6,167,948 B1 | 1/2001 | Thomas | | 6,591,625 B1 | 7/2003 | Simon |
| 6,174,675 B1 | 1/2001 | Chow et al. | | 6,600,220 B2 | 7/2003 | Barber et al. |
| 6,176,962 B1 | 1/2001 | Soane et al. | | 6,601,643 B2 | 8/2003 | Cho et al. |
| 6,186,660 B1 | 2/2001 | Kopf-Sill et al. | | 6,606,251 B1 | 8/2003 | Kenny, Jr. et al. |
| 6,196,307 B1 | 3/2001 | Ozmat ......................... 165/185 | | 6,609,560 B2 | 8/2003 | Cho et al. |
| 6,206,022 B1 | 3/2001 | Tsai et al. | | 6,632,655 B1 | 10/2003 | Mehta et al. |
| 6,210,986 B1 | 4/2001 | Arnold et al. | | 6,632,719 B1 | 10/2003 | DeBoer et al. |
| 6,216,343 B1 | 4/2001 | Leland et al. | | 6,643,132 B2 | 11/2003 | Faneuf et al. ............... 361/700 |
| 6,221,226 B1 | 4/2001 | Kopf-Sill | | 6,651,452 B2 | 11/2003 | Lecke et al. |
| 6,227,287 B1 | 5/2001 | Tanaka et al. ............... 165/80.4 | | 6,651,735 B2 | 11/2003 | Cho et al. |
| 6,234,240 B1 | 5/2001 | Cheon | | 6,657,121 B2 | 12/2003 | Garner ....................... 174/16.3 |
| 6,238,538 B1 | 5/2001 | Parce et al. | | 6,675,875 B1 | 1/2004 | Vafai et al. ................. 165/80.4 |
| 6,253,832 B1 | 7/2001 | Hallefalt | | 6,679,315 B2 | 1/2004 | Cosley et al. ............... 165/80.4 |
| 6,253,835 B1 | 7/2001 | Chu et al. | | 6,700,785 B2 | 3/2004 | Berry et al. ................. 361/726 |
| 6,257,320 B1 | 7/2001 | Wargo | | 6,729,383 B1 | 5/2004 | Cannell et al. |
| 6,293,333 B1 * | 9/2001 | Ponnappan et al. .... 165/104.26 | | 6,743,664 B2 | 6/2004 | Liang et al. |
| 6,301,109 B1 | 10/2001 | Chu et al. | | 6,757,169 B2 | 6/2004 | Kondo et al. ................ 361/699 |
| 6,313,992 B1 | 11/2001 | Hildebrandt | | 6,763,880 B1 | 7/2004 | Shih ............................ 165/80.4 |
| 6,317,326 B1 | 11/2001 | Vogel et al. | | 6,775,137 B2 | 8/2004 | Chu et al. |
| 6,321,791 B1 | 11/2001 | Chow | | 6,787,052 B1 | 9/2004 | Vaganov ....................... 216/57 |
| 6,322,753 B1 | 11/2001 | Lindberg et al. | | 6,787,899 B2 | 9/2004 | Rinella et al. ............... 257/712 |
| 6,324,058 B1 | 11/2001 | Hsiao | | 6,795,312 B2 | 9/2004 | Narakino et al. ............ 361/687 |
| 6,324,075 B1 | 11/2001 | Unrein et al. ............... 361/816 | | 6,796,372 B2 | 9/2004 | Bear ..................... 165/104.21 |
| 6,330,907 B1 | 12/2001 | Ogushi et al. | | 6,807,056 B2 | 10/2004 | Kondo et al. ................ 361/689 |
| 6,336,497 B1 | 1/2002 | Lin | | 6,819,563 B1 | 11/2004 | Chu et al. |
| 6,337,794 B1 | 1/2002 | Agonafer et al. | | 6,826,922 B2 | 12/2004 | Patel et al. ..................... 62/185 |
| 6,347,036 B1 | 2/2002 | Yeager et al. | | 6,829,142 B2 | 12/2004 | Belady et al. ............... 361/687 |
| 6,351,384 B1 | 2/2002 | Daikoku et al. | | 6,836,131 B2 | 12/2004 | Cader et al. ................. 324/760 |
| 6,360,814 B1 | 3/2002 | Tanaka et al. ............ 165/104.33 | | 6,863,117 B2 | 3/2005 | Valenzuela |
| 6,366,462 B1 | 4/2002 | Chu et al. | | 6,865,081 B2 | 3/2005 | Meyer et al. ................. 361/699 |
| 6,366,467 B1 | 4/2002 | Patel et al. | | 6,881,039 B2 | 4/2005 | Corbin et al. |
| 6,367,544 B1 | 4/2002 | Calaman | | 6,882,543 B2 | 4/2005 | Kenny, Jr. et al. |
| 6,381,846 B2 | 5/2002 | Insley et al. ............... 29/890.39 | | 6,896,612 B1 | 5/2005 | Novotny |
| 6,385,044 B1 | 5/2002 | Colbert et al. ............... 361/700 | | 6,903,929 B2 | 6/2005 | Prasher et al. ............. 361/699 |
| 6,388,317 B1 | 5/2002 | Reese | | 6,924,981 B2 | 8/2005 | Chu et al. |
| 6,396,706 B1 | 5/2002 | Wohlfarth ................... 361/760 | | 6,934,154 B2 | 8/2005 | Prasher et al. ............. 361/699 |

| | | |
|---|---|---|
| 6,942,018 B2 | 9/2005 | Goodson et al. ............ 165/80.4 |
| 6,955,212 B1 | 10/2005 | Hsieh ..................... 165/80.4 |
| 6,967,842 B2 | 11/2005 | Aoki et al. ................. 361/701 |
| 6,972,485 B2 | 12/2005 | Kong et al. ................. 257/704 |
| 6,973,801 B1 | 12/2005 | Campbell et al. |
| 6,986,382 B2 | 1/2006 | Upadhya et al. ........... 165/80.4 |
| 6,988,534 B2 | 1/2006 | Kenny et al. |
| 6,988,535 B2 | 1/2006 | Upadhya et al. |
| 6,992,891 B2 | 1/2006 | Mallik et al. ............... 361/704 |
| 6,994,151 B2 | 2/2006 | Zhou et al. |
| 7,000,684 B2 | 2/2006 | Kenny et al. |
| 7,009,843 B2 | 3/2006 | Lee et al. ................... 361/704 |
| 7,017,654 B2 | 3/2006 | Kenny et al. |
| 7,019,973 B2 | 3/2006 | Kenny, Jr. et al. |
| 7,021,012 B2 | 4/2006 | Zeng et al. |
| 7,021,369 B2 | 4/2006 | Werner et al. |
| 7,044,196 B2 | 5/2006 | Shook et al. |
| 7,050,308 B2 | 5/2006 | Kenny, Jr. et al. |
| 7,051,802 B2 | 5/2006 | Baer |
| 7,061,104 B2 | 6/2006 | Kenny, Jr. et al. |
| 7,077,634 B2 | 7/2006 | Munch et al. |
| 7,086,839 B2 | 8/2006 | Kenny et al. |
| 7,090,001 B2 | 8/2006 | Zhou et al. |
| 7,120,021 B2 | 10/2006 | Hamman .................... 361/699 |
| 7,154,749 B2 | 12/2006 | Stefanoski et al. ........... 361/695 |
| 7,178,512 B1 | 2/2007 | Merten |
| 7,184,269 B2 | 2/2007 | Campbell et al. ............ 361/700 |
| 7,188,662 B2 | 3/2007 | Brewer et al. |
| 7,201,214 B2 | 4/2007 | Munch et al. |
| 7,243,704 B2 | 7/2007 | Tustaniwskyi et al. ........ 165/80 |
| 7,254,957 B2 | 8/2007 | Weber et al. ............... 62/259.2 |
| 7,278,549 B2 | 10/2007 | Munch et al. |
| 7,280,363 B2 | 10/2007 | Reyzin et al. ............... 361/719 |
| 7,293,423 B2 | 11/2007 | Upadhya et al. |
| 7,295,444 B1 | 11/2007 | Wang |
| 7,301,773 B2 | 11/2007 | Brewer et al. ............... 361/719 |
| 7,334,630 B2 | 2/2008 | Goodson et al. ......... 165/104.33 |
| 7,342,789 B2 | 3/2008 | Hall et al. |
| 7,344,363 B2 | 3/2008 | Munch et al. |
| 7,385,810 B2 | 6/2008 | Chu et al. |
| 7,402,029 B2 | 7/2008 | Munch et al. |
| 7,430,118 B1 | 9/2008 | Noteboom et al. |
| 7,434,412 B1 | 10/2008 | Miyahira |
| 7,449,122 B2 | 11/2008 | Corbin et al. |
| 7,455,103 B2 | 11/2008 | Sato et al. ................... 165/299 |
| 7,462,852 B2 * | 12/2008 | Appleby et al. .......... 250/505.1 |
| 2001/0016985 A1 | 8/2001 | Insley et al. |
| 2001/0024820 A1 | 9/2001 | Mastromatteo et al. |
| 2001/0042616 A1 | 11/2001 | Baer |
| 2001/0045270 A1 | 11/2001 | Bhatti et al. |
| 2001/0046703 A1 | 11/2001 | Burns et al. |
| 2002/0031948 A1 | 3/2002 | Yasufuku et al. ............ 439/625 |
| 2002/0039279 A1 | 4/2002 | Ishikawa et al. |
| 2002/0051341 A1 | 5/2002 | Frutschy et al. ............. 361/700 |
| 2002/0075645 A1 | 6/2002 | Kitano et al. |
| 2002/0079095 A1 | 6/2002 | Davies et al. |
| 2002/0121105 A1 | 9/2002 | McCarthy, Jr. et al. ........ 62/500 |
| 2002/0134543 A1 | 9/2002 | Estes et al. ................. 165/277 |
| 2002/0152761 A1 | 10/2002 | Patel et al. ................ 62/259.2 |
| 2003/0062149 A1 | 4/2003 | Goodson et al. |
| 2003/0077474 A1 | 4/2003 | Rabinkin et al. |
| 2003/0097846 A1 | 5/2003 | Novotny et al. .............. 62/3.7 |
| 2003/0121274 A1 | 7/2003 | Wightman |
| 2003/0123228 A1 | 7/2003 | Bhatia et al. ................ 361/705 |
| 2003/0213580 A1 | 11/2003 | Philpott et al. |
| 2004/0008483 A1 | 1/2004 | Cheon ....................... 361/687 |
| 2004/0040695 A1 | 3/2004 | Chesser et al. |
| 2004/0052049 A1 | 3/2004 | Wu et al. |
| 2004/0089008 A1 | 5/2004 | Tilton et al. |
| 2004/0099410 A1 | 5/2004 | Ghosh ........................ 165/185 |
| 2004/0112571 A1 | 6/2004 | Kenny et al. ............... 165/80.3 |
| 2004/0112585 A1 | 6/2004 | Goodson et al. ............. 165/299 |
| 2004/0125561 A1 | 7/2004 | Gwin et al. |
| 2004/0160741 A1 | 8/2004 | Moss et al. |
| 2004/0188069 A1 | 9/2004 | Tomioka et al. |
| 2004/0188076 A1 | 9/2004 | Lee ............................ 165/174 |
| 2004/0206477 A1 | 10/2004 | Kenny et al. ............... 165/80.4 |
| 2004/0216863 A1 | 11/2004 | Hu ............................. 165/110 |
| 2004/0221604 A1 | 11/2004 | Ota et al. ................... 62/259.2 |
| 2005/0061013 A1 | 3/2005 | Bond |
| 2005/0082666 A1 | 4/2005 | Lee et al. .................... 257/728 |
| 2005/0083657 A1 | 4/2005 | Hamman ................... 361/699 |
| 2005/0117298 A1 | 6/2005 | Koga et al. ................. 361/699 |
| 2005/0133200 A1 | 6/2005 | Malone et al. ............. 165/80.4 |
| 2005/0168949 A1 | 8/2005 | Tilton et al. ................ 361/699 |
| 2005/0231914 A1 | 10/2005 | Mikubo et al. .............. 361/699 |
| 2005/0247433 A1 | 11/2005 | Corrado et al. ............ 165/80.4 |
| 2005/0257532 A1 | 11/2005 | Ikeda et al. ................... 62/3.7 |
| 2005/0259393 A1 | 11/2005 | Vinson et al. ............... 361/690 |
| 2005/0270742 A1 | 12/2005 | Brewer et al. .............. 361/696 |
| 2006/0037739 A1 | 2/2006 | Utsunomiya ........... 165/104.33 |
| 2006/0056156 A1 | 3/2006 | Long et al. .................. 361/704 |
| 2006/0060333 A1 | 3/2006 | Chordia et al. ......... 165/104.33 |
| 2006/0102999 A1 | 5/2006 | Tustaniwskyi et al. ....... 257/688 |
| 2006/0133039 A1 | 6/2006 | Belady ........................ 361/699 |
| 2006/0137863 A1 | 6/2006 | Lee et al. ................ 165/104.33 |
| 2006/0139882 A1 | 6/2006 | Mikubo et al. .............. 361/699 |
| 2006/0161311 A1 | 7/2006 | Vinson et al. ............... 700/300 |
| 2006/0187639 A1 | 8/2006 | Carswell .................... 361/699 |
| 2006/0245987 A1 | 11/2006 | Schmidt |
| 2007/0115634 A1 | 5/2007 | Laing ......................... 361/699 |
| 2007/0152352 A1 | 7/2007 | McKinnell et al. |
| 2007/0211428 A1 | 9/2007 | Doll |
| 2007/0297136 A1 | 12/2007 | Konshak |
| 2008/0013283 A1 | 1/2008 | Gilbert et al. ............... 361/715 |
| 2008/0018212 A1 | 1/2008 | Spearing et al. |
| 2008/0110963 A1 | 5/2008 | Lin et al. |
| 2008/0285228 A1 | 11/2008 | Koch et al. |

FOREIGN PATENT DOCUMENTS

| | | |
|---|---|---|
| DE | 3314069 A | 11/1986 |
| DE | 42 42 841 A1 | 11/1997 |
| DE | 29717480 U1 | 2/1998 |
| DE | 197 10 716 C2 | 9/1998 |
| DE | 69413012 T2 | 3/1999 |
| DE | 69511875 T2 | 3/2000 |
| DE | 3-540-67777-1 | 1/2001 |
| DE | 10141525 A1 | 3/2003 |
| EP | 0720720 B1 | 1/1998 |
| EP | 0845728 A2 | 3/1998 |
| EP | 1 153 690 A1 | 11/2001 |
| EP | 1 154 476 A1 | 11/2001 |
| EP | 1 520 993 A2 | 6/2005 |
| JP | 64-024447 | 1/1989 |
| JP | 5304383 AA | 11/1993 |
| JP | 6-326226 | 11/1994 |
| JP | 9-102568 | 4/1997 |
| JP | 10-99592 | 4/1998 |
| JP | 10223811 | 8/1998 |
| JP | 2000-277540 | 10/2000 |
| JP | 2001-326311 | 11/2001 |
| JP | 306614 | 3/2005 |
| TW | 183247 | 5/1992 |
| TW | 402680 | 9/2000 |
| TW | 449040 | 8/2001 |
| TW | 49131 | 6/2002 |
| TW | 495062 | 7/2002 |
| TW | 0502102 | 9/2002 |
| TW | 510490 | 11/2002 |
| TW | 516810 | 1/2003 |
| TW | 0306614 | 2/2007 |
| WO | WO 01/25711 A1 | 4/2001 |
| WO | WO 2004/036040 A1 | 4/2004 |
| WO | WO 2004/076857 A3 | 9/2004 |

| | | |
|---|---|---|
| WO | 2005080901 A1 | 9/2005 |
| WO | 2007006590 A2 | 1/2007 |

OTHER PUBLICATIONS

Kendra V. Sharp et al., "Liquid Flows in Microchannels", 2002, vol. 6, pp. 6-1 to 6-38.

Shuchi Shoji et al., "Microflow devices and systems", J. Micromech. Microeng. 4 (1994), pp. 157-171, printed in the U.K.

Angela Rasmussen et al., "Fabrication Techniques to Realize CMOS-Compatible Microfluidic Microchannels", Journal of Microelectromechanical Systems, vol. 10, No. 2, Jun. 2001, pp. 286-297.

J. H. Wang et al., "Thermal-Hydraulic Characteristic of Micro Heat Exchangers", 1991, DSC-vol. 32, Micromechanical Sensors, Actuators, and Systems, pp. 331-339.

Gad Hetsroni et al., "Nonuniform Temperature Distribution in Electronic Devices Cooled by Flow in Parallel Microchannels", IEEE Transactions on Components and Packaging Technologies, Mar. 2001, vol. 24, No. 1, pp. 16-23.

X. F. Peng et al., "Heat Transfer Characteristics of Water Flowing through Microchannels", Experimental Heat Transfer, vol. 7, 1994, pp. 265-283.

Linan Jiang et al., "Forced Convection Boiling in a Microchannel Heat Sink", Journal of Microelectromechanical Systems, vol. 10, No. 1, Mar. 2001, pp. 80-87.

Muhammad M. Rahman et al., "Experimental Measurements of Fluid Flow and Heat Transfer in Microchannel Cooling Passages in a Chip Substrate", 1993, EEP-vol. 4-2, Advances in Electronic Packaging, pp. 685-692.

X. F. Peng et al., "Forced convection and flow boiling heat transfer for liquid flowing through Microchannels", 1993, Int. J. Heat Mass Transfer, vol. 36, No. 14, pp. 3421-3427.

Lung-Jieh Yang et al., "A Micro Fluidic System of Micro Channels with On-Site Sensors by Silicon Bulk Micromachining", Sep. 1999, Microfluidic Devices and Systems II, vol. 3877, pp. 267-272.

G. Mohiuddin Mala et al., "Heat transfer and fluid flow in microchannels", 1997, Int. J. Heat Mass transfer, vol. 40, No. 13, pp. 3079-3088, printed in Great Britain.

J. M. Cuta et al., "Fabrication and Testing of Micro-Channel Heat Exchangers", SPIE vol. 2640, 1995, pp. 152-160.

Linan Jiang et al., "A Micro-Channel Heat Sink with Integrated Temperature Sensors for Phase Transition Study", IEEE 1999, pp. 159-164.

Linan Jiang et al., "Fabrication and characterization of a microsystem for a micro-scale heat transfer study", J. Micromech. Microeng. 9 (1999) pp. 422-428, printed in the U.K.

M. B. Bowers et al., "High flux boiling in low flow rate, low pressure drop mini-channel and micro-channel heat sinks", 1994, Int. J. Heat Mass Transfer, vol. 37, No. 2, pp. 321-332.

Yogendra Joshi, "Heat out of small packages", Dec. 2001, Mechanical Engineering, pp. 56-58.

A. Rostami et al., "Liquid Flow and Heat Transfer in Microchannels: A Review", 2000, Heat and Technology, vol. 18, No. 2, pp. 59-68.

Lian Zhang et al., "Measurements and Modeling of Two-Phase Flow in Microchannels with Nearly Constant Heat Flux Boundary Conditions", Journal of Microelectromechanical Systems, vol. 11, No. 1, Feb. 2002, pp. 12-19.

Muhammad Mustafizur Rahman, "Measurements of Heat Transfer in Microchannel Heat Sinks", Int. Comm. Heat Mass Transfer, vol. 27, No. 4, May 2000, pp. 495-506.

Issam Mudawar et al., "Enhancement of Critical Heat Flux from High Power Microelectronic Heat Sources in a Flow Channel", Journal of Electronic Packaging, Sep. 1990, vol. 112, pp. 241-248.

Nelson Kuan, "Experimental Evaluation of Micro Heat Exchanges Fabricated in Silicon", 1996, HTD-vol. 331, National Heat Transfer Conference, vol. 9, pp. 131-136.

E. W. Kreutz et al., "Simulation of micro-channel heat sinks for optoelectronic microsystems", Microelectronics Journal 31(2000), pp. 787-790.

J. C. Y. Koh et al., "Heat Transfer of Microstructures for Integrated Circuits", 1986, Int. Comm. Heat Mass Transfer, vol. 13, pp. 89-98.

Snezana Konecni et al., "Convection Cooling of Microelectronic Chips", 1992, InterSociety Conference on Thermal Phenomena, pp. 138-144.

Michael B. Kleiner et al., "High Performance Forced Air Cooling Scheme Employing Microchannel Heat Exchangers", Dec. 1995, IEEE Transactions on Components, Packaging, and Manufacturing Technology-Part A, vol. 18, No. 4, pp. 795-804.

Jerry K. Keska Ph. D. et al., "An Experimental Study on an Enhanced Microchannel Heat Sink for Microelectronics Applications", EEP-vol. 26-2, Advances in Electronic Packaging, 1999, vol. 2, pp. 1235-1259.

Shung-Wen Kang et al., "The Performance Test and Analysis of Silicon-Based Microchannel Heat Sink", Jul. 1999, Terahertz and Gigahertz Photonics, vol. 3795, pp. 259-270.

Joseph C. Tramontana, "Semiconductor Laser Body Heat Sink", Xerox Disclosure Journal, vol. 10, No. 6, Nov./Dec. 1985, pp. 379-381.

Sarah Arulanandam et al., "Liquid transport in rectangular microchannels by electroosmotic pumping", Colloids and Surfaces A: Physicochemical and Engineering Aspects 161 (2000), pp. 89-102.

Jeffery D. Barner et al., "Thermal Ink Jet Print Head Carriage with Integral Liquid Cooling Capabilities", Xerox Disclosure Journal-vol. 21, No. 1, Jan./Feb. 1996, pp. 33-34.

"Autonomous displacement of a solution in a microchannel by another solution", Research Disclosure, Jun. 2001, pp. 1046-1047.

John M. Waldvogel, "Aluminum Silicon Carbide Phase Change Heat Spreader", Motorola, Jun. 1999, Technical Developments, pp. 226-230.

James P. Slupe et al., "An idea for maintaining a stable thermal environment for electronic devices", Research Disclosure, Aug. 2001, p. 1312.

John M. Waldvogel, "A Heat Transfer Enhancement Method for Forced Convection Bonded-Fin Heatsinks", Motorola, Dec. 1997, Technical Developments, pp. 158-159.

"Thin Heat Pipe for Cooling Components on Printed Circuit Boards", IBM Technical Disclosure Bulletin, vol. 34, No. 7B, Dec. 1991, pp. 321-321.

R. C. Chu et al., "Process for Nucleate Boiling Enhancement", IBM Technical Disclosure Bulletin, vol. 18, No. 7, Dec. 1975, p. 2227.

J. Riseman, "Structure for Cooling by Nucleate Boiling", IBM Technical Disclosure Bulletin, vol. 18, No. 11, Apr. 1976, p. 3700.

"Integrally Grooved Semiconductor Chip and Heat Sink", Oct. 1971, IBM Technical Disclosure Bulletin, vol. 14, No. 5, p. 1425.

"Enhanced Cooling of Thermal Conduction Module", IBM Technical Disclosure Bulletin, vol. 30, No. 5, Oct. 1987, p. 426.

"Heat Exchanger Modules for Data Processor with Valves Operated by Pressure from Cooling Water Pump", IBM Technical Disclosure Bulletin, vol. 30, No. 5, Oct. 1987, p. 419.

"Cold Plate for Thermal Conduction Module with Inlet for Cooling Water Near Highest Power Chips", IBM Technical Disclosure Bulletin, vol. 30, No. 5, Oct. 1987, p. 413.

"Circuit Module Cooling with Coaxial Bellows Providing Inlet, Outlet and Redundant Connections to Water-Cooled Element", IBM Technical Bulletin, vol. 30, No. 5, Oct. 1987, pp. 345-347.

"Piping System with Valves Controlled by Processor for Heating Circuit Modules in a Selected Temperature Profile for Sealing Integrity Test Under Temperature Stress", IBM Technical Disclosure Bulletin, vol. 30, No. 5, Oct. 1987, p. 336.

"Cooling System for Chip Carrier on Card", IBM Technical Disclosure Bulletin, vol. 31, No. 4, Sep. 1988, pp. 39-40.

"Chip Cooling Device", IBM Technical Disclosure Bulletin, vol. 30, No. 9, Feb. 1988, pp. 435-436.

W. E. Ahearn et al., "Silicon Heat Sink Method to Control Integrated Circuit Chip Operating Temperatures", IBM Technical Disclosure Bulletin, vol. 21, No. 8, Jan. 1979, pp. 3378-3380.

N. P. Bailey et al., "Cooling Device for Controlled Rectifier", IBM Technical Disclosure Bulletin, vol. 21, No. 11, Apr. 1979, pp. 4609-4610.

W. J. Kleinfelder et al., "Liquid-Filled Bellows Heat Sink", IBM Technical Disclosure Bulletin, vol. 21, No. 10, Mar. 1979, pp. 4125-4126.

R. P. Chrisfield et al., "Distributed Power/Thermal Control", IBM Technical Disclosure Bulletin, vol. 22, No. 3, Aug. 1979, pp. 1131-1132.

A. J. Arnold et al., "Heat Sink Design for Cooling Modules in a Forced Air Environment", IBM Technical Disclosure Bulletin, vol. 22, No. 6, Nov. 1979, pp. 2297-2298.

A. J. Arnold "Structure for the Removal of Heat from an Integrated Circuit Module", IBM Technical Disclosure Bulletin, vol. 22, No. 6, Nov. 1979, pp. 2294-2296.

U. P. Hwang et al., "Cold Plate for Thermal Conduction Module with Improved Flow Pattern and Flexible Base", IBM Technical Disclosure Bulletin, vol. 25, No. 9, Feb. 1983, p. 4517.

K. C. Gallagher et al., "Cooling System for Data Processor with Flow Restricter in Secondary Loop to Limit Bypass-Cooling Water Flow", IBM Technical Disclosure Bulletin, vol. 26, No. 5, Oct. 1983, p. 2658.

R. C. Chu et al., "Silicon Heat Sink for Semiconductor Chip", IBM Technical Disclosure Bulletin, vol. 24, No. 11A, Apr. 1982, p. 5743.

J. M. Eldridge et al., "Heat-Pipe Vapor Cooling Etched Silicon Structure", IBM Technical Disclosure Bulletin, vol. 25, No. 8, Jan. 1983, pp. 4118-4119.

J. R. Skobern, "Thermoelectrically Cooled Module", IBM Technical Disclose Bulletin, vol. 27, No. 1A, Jun. 1984, p. 30.

M. J. Brady et al., "Etched Silicon Integrated Circuit Heat Sink", IBM Technical Disclosure Bulletin, vol. 27, No. 1B, Jun. 1984, p. 627.

H. D. Edmonds et al., "Heat Exchange Element for Semiconductor Device Cooling", IBM Technical Disclosure Bulletin, vol. 23, No. 3, Aug. 1980, p. 1057.

R. W. Noth, "Heat Transfer from Silicon Chips and Wafers", IBM Technical Disclosure Bulletin, vol. 17, No. 12, May 1975, p. 3544.

"Forced Boiling Cooling System with Jet Enhancement for Critical Heat Flux Extension", IBM Technical Disclosure Bulletin, vol. 39, No. 10, Oct. 1996, p. 143.

"Miniature Heat Exchanger for Corrosive Media", IBM Technical Disclosure Bulletin, vol. 38, No. 01, Jan. 1995, pp. 55-56.

"Self-Contained Active Heat Dissipation Device", IBM Technical Disclosure Bulletin, vol. 39, No. 04, Apr. 1996, pp. 115-116.

C. J. Keller et al., "Jet Cooling Cup for Cooling Semiconductor Devices", IBM Technical Disclosure Bulletin, vol. 20, No. 9, Feb. 1978, pp. 3575-3576.

B. J. Ronkese, "Centerless Ceramic Package with Directly Connected Heat Sink", IBM Technical Disclosure Bulletin, vol. 20, No. 9, Feb. 1978, p. 3577-3578.

K. S. Sachar, "Liquid Jet Cooling of Integrated Circuit Chips", vol. 20, No. 9, Feb. 1978, pp. 3727-3728.

A. H. Johnson, "Device Cooling", IBM Technical Disclosure Bulletin, vol. 20, No. 10, Mar. 1978, pp. 3919-3920.

R. D. Durand et al., "Flexible Thermal Conductor for Electronic Module", IBM Technical Disclosure Bulletin, vol. 20, No. 11A, Apr. 1978, p. 4343.

D. Balderes et al., "Liquid Cooling of a Multichip Module Package", IBM Technical Disclosure Bulletin, vol. 20, No. 11A, Apr. 1978, pp. 4336-4337.

J. A. Dorler et al., "Temperature Triggerable Fluid Coupling System for cooling Semiconductor Dies", IBM Technical Disclosure Bulletin, vol. 20, No. 11A, Apr. 1978, pp. 4386-4388.

V. W. Antonetti et al., "Integrated Module Heat Exchanger", IBM Technical Disclosure Bulletin, vol. 20, No. 11A, Apr. 1978, p. 4498.

P. Hwang et al., "Conduction Cooling Module", IBM Technical Disclosure Bulletin, vol. 20, No. 11A, Apr. 1978, pp. 4334-4335.

A. J. Arnold et al., "Electronic Packaging Structure", IBM Technical Disclosure Bulletin, vol. 20, No. 11B, Apr. 1978, pp. 4820-4822.

V. Y. Doo et al., "High Performance Package for Memory", IBM Technical Disclosure Bulletin, vol. 21, No. 2, Jul. 1978, pp. 585-586.

"Multi-Chip Package with Cooling by a Spreader Plate in Contact with a Chip having Cylindrical Holes Mating with an Inverse Frame Providing Water Flow Within its Pins", IBM Technical Disclosure Bulletin, vol. 31, No. 5, Oct. 1988, pp. 141-142.

J. Landrock et al., "Cooling System for Semiconductor Chips", IBM Technical Disclosure Bulletin, vol. 23, No. 4, Sep. 1980, p. 1483.

E. P. Damm, Jr., "Convection Cooling Apparatus", IBM Technical Disclosure Bulletin, vol. 20, No. 7, Dec. 1977, pp. 2755-2756.

"Circuit Package with Circulating Boiling Liquid and Local Heat Exchanger to Limit Vapor in Coolant Outlet", IBM Technical Disclosure Bulletin, vol. 31, No. 12, May 1989, p. 34.

"Circuit Module Cooling with Multiple Pistons Contacting a Heat Spreader/Electrical Buffer Plate in Contact with Chip", IBM Technical Disclosure Bulletin, vol. 31, No. 12, May 1989, p. 5-7.

"TCM-Like Circuit Module with Local Heat Sink Resting on Chip and Chip Separated From Coolant by Bellows with Pins and Deflector Plate Attached to Local Heat Sink and Extending Above Bellows into Region of Coolant Flow", IBM Technical Disclosure Bulletin, vol. 31, No. 11, Apr. 1989, pp. 305-306.

"Water-Cooled Circuit Module with Grooves Forming Water Passages Near Heat-Producing Devices", IBM Technical Disclosure Bulletin, vol. 31, No. 12, May 1989, pp. 49-50.

"Cold Plate Conduction Module with Only Peripheral Mounting Bolts, Large Surface Fin Inserts and Reduced Water Flow and Thermal Resistance", IBM Technical Disclosure Bulletin, vol. 31, No. 12, May 1989, p. 59.

"Thermal Control Hardware for Accelerated Run-In Testing of Multi-Chip Modules", IBM Technical Disclosure Bulletin, vol. 32, No. 5A, Oct. 1989, p. 129-130.

"Means of Removing More Heat From a TCM (Or Other Liquid-Cooled Logic Package) By Reducing the Coolant Temperature", IBM Technical Disclosure Bulletin, vol. 32, No. 5A, Oct. 1989, pp. 153-154.

E. G. Loeffel et al., "Liquid Cooled Module with Compliant Membrane", IBM Technical Disclosure Bulletin, vol. 20, No. 2, Jul. 1977, pp. 673-674.

V. Y. Doo et al., "Method of Effective Cooling of a High Power Silicon Chip", IBM Technical Disclosure Bulletin, vol. 20, No. 4, Sep. 1977, p. 1436-1437.

V. Y. Doo et al., Semiconductor Chip Cooling Package, IBM Technical Disclosure Bulletin, vol. 20, No. 4, Sep. 1977, pp. 1440-1441.

"Heat Sink Fabrication Method", IBM Technical Disclosure Bulletin, vol. 27, No. 10A, Mar. 1985, p. 5656-5657.

"Thermal Conduction Module with Liquid Dielectric and Pistons with Surface Treatment for Enhanced Nucleate Boiling", IBM Technical Disclosure Bulletin, vol. 27, No. 12, May 1985, p. 6904.

"Pin Fin Array Heat Pipe Apparatus", IBM Technical Disclosure Bulletin, vol. 37, No. 09, Sep. 1994, p. 171.

Youngcheol Joo et al., "Fabrication of Monolithic Microchannels for IC Chip Cooling", 1995, pp. 362-367.

Jaisree Moorthy et al., "Active control of electroosmotic flow in microchannels using light", Jan. 26, 2001, Sensors and Actuators B 75, pp. 223-229.

Andreas Manz et al., "Electroosmotic pumping and electrophoretic separations for miniaturized chemical analysis systems", Sep. 16, 1994, J.Micromech. Microeng. 4 (1994), pp. 257-265, printed in the U.K.

E. B. Cummings et al., "Irrotationality of uniform electroosmosis", Sep. 1999, Part of the SPIE Conference on Microfluidic Devices and Systems II, SPIE vol. 3877, pp. 180-189.

Haim H. Bau, "Optimization of conduits' shape in micro heat exchangers", Dec. 10, 1997, International Journal of Heat and Mass Transfer 41 (1998), pp. 2717-2723.

V. K. Dwivedi et al., "Fabrication of very smooth walls and bottoms of silicon microchannels for heat dissipation of semiconductor devices", Jan. 25, 2000, Microelectronics Journal 31 (2000), pp. 405-410.

M. B. Bowers et al.,, "Two-Phase Electronic Cooling Using Mini-Channel and Micro-Channel Heat Sinks: Part 2-Flow Rate and Pressure Drop Constraints", Dec. 1994, Journal of Electronic Packaging, vol. 116, pp. 298-305.

Meint J. de Boer et al., "Micromachining of Buried Micro Channels in Silicon", Mar. 2000, Journal of Microelectromechanical systems, vol. 9, No. 1, pp. 94-103.

S.B. Choi et al., "Fluid Flow and Heat Transfer in Microtubes", 1991, DSC-vol. 32, Micromechanical sensors, Actuators, and Systems, ASME 1991, pp. 123-134.

S. F. Choquette, M. Faghri et al., "Optimum Design of Microchannel Heat Sinks", DSC-vol. 59, Microelectromechanical Systems (MEMS), ASME 1996, pp. 115-126.

David Copeland et al., "Manifold Microchannel Heat Sinks: Theory and Experiment", EEP-vol. 10-2, Advances in Electronic Packaging ASME, 1995, pp. 829-835.

J. M. Cuta et al., "Forced Convection Heat Transfer in Parallel Channel Array Microchannel Heat Exchanger", PID-vol. 2 / HTD-vol. 338, Advances in Energy efficiency, Heat/Mass Transfer Enhancement, ASME 1996, pp. 17-23.

K. Fushinobu et al., "Heat Generation and Transport in Sub-Micron Semiconductor Devices", HTD-vol. 253, Heat Transfer on the Microscale, ASME 1993, pp. 21-28.

Charlotte Gillot et al. "Integrated Micro Heat Sink for Power Multichip Module", IEEE Transactions on Industry Applications, vol. 36, No. 1, Jan./Feb. 2000, pp. 217-221.

John Goodling, "Microchannel heat exchangers—a review", SPIE vol. 1997 High Heat Flux Engineering II (1993), pp. 66-82.

Koichiro Kawano et al., "Micro Channel Heat Exhanger for Cooling Electrical Equipment", HTD-vol. 361-3/PID-vol. 3, Proceedings of the ASME Heat Transfer Division—vol. 3, ASME 1998, pp. 173-188.

Chad Harris et al., "Design and Fabrication of a Cross Flow Micro Heat Exchanger", Dec. 2000, Journal of Microelectromechanical Systems, vol. 9, No. 4, pp. 502-508.

George M. Harpole et al., "Micro-Channel Heat Exchanger Optimization", 1991, Seventh IEEE Semi-Therm Symposium, pp. 59-63.

Pei-Xue Jiang et al., "Thermal-hydraulic performance of small scale micro-channel and porous-media heat-exchangers", International Journal of Heat and Mass Transfer 44 (2001), pp. 1039-1051.

X.N. Jiang et al. "Laminar Flow Through Microchannels Used for Microscale Cooling Systems", 1997, IEEE/CPMT Electronic Packaging Technology Conference, pp. 119-122.

David Bazeley Tuckerman, "Heat-Transfer Microstructures for Integrated Circuits", Feb. 1984, pp. ii-xix, pp. 1-141.

M Esashi, "Silicon micromachining for integrated microsystems", Vacuum/vol. 47/Nos. 6-8/1996, pp. 469-474.

T.S. Ravigururajan et al., "Effects of Heat Flux on Two-Phase Flow Characteristics of Refrigerant Flows in a Micro-Channel Heat Exchanger", HTD-vol. 329, National Heat Transfer Conference, vol. 7, ASME 1996, pp. 167-178.

T.S. Ravigrururajan et al., "Single-Phase Flow Thermal Performance Characteristics of a Parallel Micro-Channel Heat Exchanger", HTD-vol. 329, National Heat Transfer Conference, vol. 7, ASME 1996, pp. 157-166.

T.S. Ravigururajan et al. "Liquid Flow Characteristics in a Diamond-Pattern Micro-Heat-Exchanger", DSC-vol. 59 Microelectromechanical Systems (MEMS), ASME 1996, pp. 159-166.

T.S. Ravigururajan, "Impact of Channel Geometry on Two-Phase Flow Heat Transfer Characteristics of Refrigerants in Microchannel Heat Exchangers", May 1998, Journal of Heat Transfer, vol. 120, pp. 485-491.

J. Pfahler et al., "Liquid Transport in Micron and Submicron Channels", Mar. 1990, Sensors and Actuators, A21-A23 (1990), pp. 431-434.

Kenneth Pettigrew et al., "Performance of a MEMS based Micro Capillary Pumped Loop for Chip-Level Temperature Control", 2001, pp. 427-430.

C. Perret et al., "Microchannel integrated heat sinks in silicon technology", The 1998 IEEE, pp. 1051-1055.

X.F. Peng et al., "Convective heat transfer and flow friction for water flow in microchannel structures", 1996, Int. J. Heat Mass Transfer, vol. 39, No. 12, pp. 2599-2608, printed in Great Britain.

X.F. Peng et al., "Experimental investigation of heat transfer in flat plates with rectangular microchannels", 1994, Int. J. Heat Mass Transfer, vol. 38, No. 1, pp. 127-137, printed in Great Britain.

X.F. Peng et al., "Cooling Characteristics with Microchanneled Structures", 1994, Enhanced Heat Transfer, vol. 1, No. 4, pp. 315-326, printed in the United States of America.

X.F. Peng et al., "Enhancing the Critical Heat Flux Using Microchanneled Surfaces", 1998, Enhanced Heat Transfer, vol. 5, pp. 165-176, Printed in India.

Yoichi Murakami et al., "Parametric Optimization of Multichanneled Heat Sinks for VLSI Chip Cooling", Mar. 2001, IEEE Transactions on Components and Packaging Technologies, vol. 24, No. 1, pp. 2-9.

D. Mundinger et al., "High average power 2-D laser diode arrays on silicon microchannel coolers", CLEO '89/Friday Morning/404.

L.J. Missaggia et al., "Microchannel Heat Sinks for Two-Dimensional High-Power-Density Diode Laser Arrays", IEEE Journal of Quantum Electronics, vol. 25, No. 9, Sep. 1989, pp. 1988-1992.

M.J. Marongiu et al., "Enhancement of Multichip Modules (MCMs) Cooling by Incorporating MicroHeatPipes and Other High Thermal Conductivity Materials into Microchannel Heat Sinks", 1998, Electronic Components and Technology Conference, pp. 45-50.

C.R. Friedrich et al., "Micro heat exchangers fabricated by diamond machining", Jan. 1994, Precision Engineering, vol. 16, No. 1, pp. 56-59.

Mali Mahalingam, "Thermal Management in Semiconductor Device Packaging", Proceedings of the IEEE, vol. 73, No. 9, Sep. 1985, pp. 1396-1404.

T.M. Adams et al., "An experimental investigation of single-phase forced convection in microchannels", 1997, Int. J. Heat Mass Transfer, vol. 41, Nos. 6-7, pp. 851-857, Printed in Great Britain.

T.M. Adams et al., "Applicability of traditional turbulent single-phase forced convection correlations to non-circular microchannels", Int. J. Heat and Transfer 42 (1999), pp. 4411-4415.

Bassani Badran et al., "Experimental Results for Low-Temperature Silicon Micromachined Micro Heat Pipe Arrays Using Water and Methanol as Working Fluids", May 31, 1997, Experimental Heat Transfer, 10: pp. 253-272.

D. Jed Harrison et al., "Electroosmotic Pumping Within a Chemical Sensor System Integrated on Silicon", Jun. 26, 1991, pp. 792-795.

Kurt Seiler et al., "Electroosmotic Pumping and Valveless Control of Fluid Flow within a Manifold of Capillaries on a Glass Chip", 1994, Analytical Chemistry, vol. 66, No. 20, Oct. 15, 1994, pp. 3485-3491.

Philip H. Paul et al., "Electrokinetic Generation of High Pressures Using Porous Microstructures", 1998, Micro-Total Analysis Systems, pp. 49-52.

Gh. Mohiuddin Mala et al., "Flow characteristics of water through a microchannel between two parallel plates with electrokinetic effects", Oct. 1997, Int. J. Heat and Fluid Flow, vol. 18, No. 5, pp. 489-496.

W.E. Morf et al., "Partial electroosmotic pumping in complex capillary systems Part 1: Principles and general theoretical approach", Oct. 16, 2000, Sensors and Actuators B 72 (2001), pp. 266-272.

M. Esashi, "Silicon micromachining and micromachines", Wear, vol. 168, (1993), pp. 181-187.

Stephanus Buttgenbach et al., "Microflow devices for miniaturized chemical analysis systems", Nov. 1998, SPIE-Chemical Mircosensors and Applications, vol. 3539, pp. 51-61.

Sarah Arulanandam et al., "Liquid transport in rectangular microchannels by electroosmotic pumping", Colloids and Surfaces A: Physicochemical and Engineering Aspects, vol. 161 (2000), pp. 89-102.

Linan Jiang et al., "Closed-Loop Electroosmotic Microchannel Cooling System for VLSI Circuits", Mechanical Engineering Dept. Stanford University, pp. 1-27.

Susan L. R. Barker et al., "Fabrication, Derivatization and Applications of Plastic Microfluidic Devices", Proceedings of SPIE, vol. 4205, 2001, pp. 112-118.

Timothy E. McKnight et al., "Electroosmotically Induced Hydraulic Pumping with Integrated Electrodes on Microfluidic Devices", Aug. 15, 2001, Anal. Chem., vol. 73, No. 16, pp. 4045-4049.

Chris Bourne, "Cool Chips plc Receives Nanotech Manufacturing Patent", Jul. 31, 2002, pp. 1-2.

Frank Wagner et al., "Electroosmotic Flow Control in Micro Channels Produced by Scanning Excimer Laser Ablation", Proceedings of SPIE vol. 4088, 2000, pp. 337-340.

H. A. Goodman, "Data Processor Cooling With Connection To Maintain Flow Through Standby Pump", Dec. 1983, IBM Technical Disclosure Bulletin, vol. 26, No. 7A, p. 3325.

"Electroerosion Micropump", May 1990, IBM Technical Disclosure Bulletin, vol. 32, No. 12, pp. 342-343.

Shulin Zeng et al., "Fabrication and Characterization of Electrokinetic Micro Pumps", 2000 Inter Society Conference on Thermal Phenomena, pp. 31-35.

A. Manz et al., "Integrated Electroosmotic Pumps and Flow Manifolds for Total Chemical Analysis Systems", 1991, Inter. Conf. on Solid-State Sensors and Actuators, pp. 939-941.

O. T. Guenat et al., "Partial electroosmotic pumping in complex capillary systems Part: 2 Fabrication and application of a micro total analysis system suited for continuous volumetric nanontrations", Sensors and Actuators B 72 (2001) pp. 273-282.

J. G. Sunderland, "Electrokinetic dewatering and thickening. I. Introduction and historical review of electrokinetic applications", Feb. 4, 1987, Journal of Applied Electrochemistry, vol. 17, pp. 889-898.

J. C. Rife et al., "Acousto- and electroosmotic microfluidic controllers", Sep. 1998, Microfluidic Devices and Systems, vol. 3515, pp. 125-135.

Purnendu K Dasgupta et al. "Electroosmosis: A Reliable Fluid Propulsion System for Flow Injection Analysis", Jun. 1994, Anal. Chem., vol. 66, No. 11, pp. 1792-1798.

Ray Beach et al., "Modular Microchannel Cooled Heatsinks for High Average Power Laser Diode Arrays", Apr. 1992, IEEE Journal of Quantum Electronics, vol. 28, No. 4, pp. 966-976.

Roy W. Knight et al., "Optimal Thermal Design of Air Cooled Forced Convection Finned Heat Sinks—Experimental Verification", Oct. 1992, IEEE Transactions on Components, Hybrids, and Manufacturing Technology, vol. 15, No. 5, pp. 754-760.

Y. Zhuang et al., "Experimental study on local heat transfer with liquid impingement flow in two-dimensional micro-channels", Feb. 9, 1997, Int. J. Heat Mass Transfer, vol. 40, No. 17, pp. 4055-4059.

D. Yu et al., "An Experimental and Theoretical Investigation of Fluid Flow and Heat Transfer in Microtubes", 1995, ASME / JSME Thermal Engineering Conference, vol. 1, pp. 523-530.

Xiaoqing Yin et al., "Micro Heat Exchangers Consisting of Pin Arrays", Journal of Electronic Packaging, Mar. 1997, vol. 119, pp. 51-57.

X. Yin et al., "Uniform Channel Micro Heat Exchangers", Journal of Electronic Packaging, Jun. 1997, vol. 119, pp. 89-94.

Chun Yang et al., "Modeling forced liquid convection in rectangular microchannels with electrokinetic effects", International Journal of Heat and Mass Transfer 41 (1998), pp. 4229-4249.

Arel Weisberg et al., "Analysis of microchannels for integrated cooling", 1992, Int. J. Heat Mass Transfer, vol. 35, No. 10, pp. 2465-2473.

Roger S. Stanley et al., "Two-Phase Flow in Microchannels", 1997, DSC-vol. 62/HTD-vol. 354, MEMS, pp. 143-152.

B. X. Wang et al., "Experimental investigation on liquid forced-convection heat transfer through microchannelst", 1994, Int. J. Heat Mass Transfer, vol. 37, Suppl. 1, pp. 73-82.

Kambiz Vafai et al., "Analysis of two-layered micro-channel heat sink concept in electronic cooling", Int. J. Heat Mass Transfer, 42 (1999), pp. 2287-2297.

Gokturk Tunc et al., "Heat transfer in rectangular microchannels", Int. J. Heat Mass Transfer, 45 (2002), pp. 765-773.

D. B. Tuckerman et al., "High-Performance Heat Sinking for VLSI", May 1981, IEEE Electron Device Letters, vol. EDL-2, No. 5, pp. 126-29.

Bengt Sunden et al., "An Overview of Fabrication Methods and Fluid Flow and Heat Transfer Characteristics of Micro Channels", pp. 3-23.

David S. Shen et al., "Micro Heat Spreader Enhanced Heat Transfer in MCMs", 1995, pp. 189-194.

S. Sasaki et al., "Optimal Structure for Microgrooved Cooling Fin for High-Power LSI Devices", Electronic Letters, Dec. 4, 1986, vol. 22, No. 25.

Vijay K. Samalam, "Convective Heat Transfer in Microchannels", 1989, Journal of Electronic Materials, vol. 18, No. 5, pp. 611-617.

Sanjay K. Roy et al., "A Very High Heat Flux Microchannel Heat Exchanger for Cooling of Semiconductor Laser Diode Arrays", May 1996, IEEE Transactions on components, packaging, and manufacturing technology-part B, vol. 19, No. 2, pp. 444-451.

Charlotte Gillot et al., "Integrated Single and Two-Phase Micro Heat Sinks Under IGBT Chips", IEEE Transactions on Components and Packaging Technology, vol. 22, No. 3, Sep. 1999, pp. 384-389.

A.L. Pascuzzo et al., "Integrated Circuit Module Package Cooling Structure", IBM Technical Disclosure Bulletin, vol. 20, No. 10, Mar. 1978, pp. 3898-3899.

H. Krumm, "Chip Cooling", IBM Technical Disclosure Bulletin, vol. 20, No. 7, Dec. 1977, p. 2728.

Jae-Mo Koo et al., "Modeling of Two-Phase Microchannel Heat Sinks for VLSI Chips", Mech. Eng. Depart. of Stanford University, pp. 422-426.

Office Action mailed on Jun. 11, 2009, U.S. Appl. No. 10/698,179, pp. 1-17.

Office Action regarding Application U.S. Appl. No. 10/698,179, filed Oct. 30, 2003, Mail date of Office Action Nov. 4, 2009, which include 20 pages.

* cited by examiner

METHOD OF FABRICATING HIGH SURFACE TO VOLUME RATIO STRUCTURES AND THEIR INTEGRATION IN MICROHEAT EXCHANGERS FOR LIQUID COOLING SYSTEM

RELATED APPLICATION

This application is a continuation-in-part of U.S. patent application Ser. No. 10/680,584, filed Oct. 6, 2003 now U.S. Pat. No. 7,000,684 and entitled "METHOD AND APPARATUS FOR EFFICIENT VERTICAL FLUID DELIVERY FOR COOLING A HEAT PRODUCING DEVICE;" which is a continuation in part of U.S. patent application Ser. No. 10/439,635, filed on May 16, 2003 now U.S. Pat. No. 6,988,534 and entitled "METHODS FOR FLEXIBLE FLUID DELIVERY AND HOTSPOT COOLING BY MICRO-CHANNEL HEAT SINKS," which claims priority under 35 U.S.C. §119(e) of the co-pending U.S. Provisional Patent Application Ser. No. 60/423,009, filed Nov. 1, 2002 and entitled "METHODS FOR FLEXIBLE FLUID DELIVERY AND HOTSPOT COOLING BY MICROCHANNEL HEAT SINKS," Ser. No. 60/442,383, filed Jan. 24, 2003 and entitled "OPTIMIZED PLATE FIN HEAT EXCHANGER FOR CPU COOLING," and Ser. No. 60/455,729, filed Mar. 17, 2003 and entitled "MICROCHANNEL HEAT EXCHANGER APPARATUS WITH POROUS CONFIGURATION AND METHOD OF MANUFACTURING THEREOF", all of which are hereby incorporated by reference. This application is also a continuation-in-part of U.S. patent application Ser. No. 10/439,912 filed on May 16, 2003 now U.S. Pat. No. 6,986,382 and entitled "INTERWOVEN MANIFOLDS FOR PRESSURE DROP REDUCTION IN MICROCHANNEL HEAT EXCHANGERS," which claims priority under 35 U.S.C. §119(e) of the co-pending U.S. Provisional Patent Application Ser. No. 60/423,009, filed Nov. 1, 2002 and entitled "METHODS FOR FLEXIBLE FLUID DELIVERY AND HOTSPOT COOLING BY MICROCHANNEL HEAT SINKS," Ser. No. 60/442,383, filed Jan. 24, 2003 and entitled "OPTIMIZED PLATE FIN HEAT EXCHANGER FOR CPU COOLING," and Ser. No. 60/455,729, filed Mar. 17, 2003 and entitled "MICROCHANNEL HEAT EXCHANGER APPARATUS WITH POROUS CONFIGURATION AND METHOD OF MANUFACTURING THEREOF", all of which are hereby incorporated by reference. Also, this application is also a continuation-in-part of U.S. patent application Ser. No. 10/612,241, filed on Jul. 1, 2003 now U.S. Pat. No. 7,156,159 and entitled "MULTI-LEVEL MICROCHANNEL HEAT EXCHANGERS," which claims priority under 35 U.S.C. §119(e) of the co-pending U.S. provisional patent application Ser. No. 60/455,729, filed on Mar. 17, 2003, and entitled "MICROCHANNEL HEAT EXCHANGE WITH POROUS CONFIGURATION AND METHOD OF MANUFACTURING THEREOF," both of which are hereby incorporated by reference. Further, this application claims priority under 35 U.S.C. §119(e) of the co-pending U.S. provisional patent application Ser. No. 60/642,284, filed on Jan. 7, 2005, and entitled "FABRICATION OF HIGH SURFACE TO VOLUME RATIO STRUCTURES AND THEIR INTEGRATION IN MICRO-HEAT EXCHANGES FOR LIQUID COOLING SYSTEMS," which is hereby incorporated by reference.

FIELD OF THE INVENTION

This invention relates to the field of heat exchangers. More particularly, this invention relates to a method of fabricating high surface to volume ratio material structures from multiple layers, and to the integration of said structures into microstructured heat exchanger devices for effective heat extraction in liquid cooling systems.

BACKGROUND OF THE INVENTION

Effective heat transfer in a liquid cooling system requires a flowing liquid to be in contact with as much surface area as possible of the material that is thermally coupled to extract heat from the cooled device. Fabrication of a reliable and efficient High Surface to Volume Ratio Material (HSVRM) structure is therefore extremely critical for developing an effective micro-heat exchanger. Use of silicon micro-channels is one heat collector structure in liquid cooling systems previously proposed by the assignee of the present invention. For example, see co-pending U.S. patent application Ser. No. 10/643,684, filed on Aug. 18, 2003 and entitled "APPARATUS AND METHOD OF FORMING CHANNELS IN A HEAT-EXCHANGING DEVICE."

High aspect ratio channels are fabricated by anisotropic etching of silicon, which has found widespread use in micro-machining and MEMS. However, silicon has a low thermal conductivity relative to many other materials, and especially relative to true metals. Though methods for fabrication and designs for micro-heat exchangers from higher conductivity materials exist in the prior art, these either use expensive fabrication technologies or prescribe complicated structures without specifying economically feasible fabrication methods.

For example, U.S. Pat. No. 6,415,860 to K. W. Kelly et al. describes the use of LIGA formed micro-channels in a cross-flow micro-heat exchanger. The method described in the Kelley patent, which is hereby incorporated by reference, uses LIGA, a type of High Aspect Ratio Micromachining (HARM) well-known in the prior art. LIGA is multi-step process comprising lithography, electroplating and micro-molding which results in HSVRM structure but is costly due to its use of exotic materials and need for synchrotron radiation.

The method of U.S. Pat. No. 5,274,920 to J. A. Matthews describes a process of fabricating a micro-heat exchanger by laminating multiple plates with recessed regions together. This creates a microstructure comprising a plurality of microscopic slots. Though the structure of each plate is thoroughly described, the patent to Matthews, which is hereby incorporated by reference, describes no cost effective, scalable manufacturing method for the plates.

U.S. Pat. No. 6,014,312 to J. Schulz-Harder et al. describes a heat sink constructed by a set of layers each containing openings. The layers are stacked upon one another, creating a flow path. The patent, hereby incorporated by reference, describes polygonal ring structure openings but describes no method of fabrication for the layers.

BRIEF SUMMARY OF THE INVENTION

A heat exchanger circulates a cooling material, such as fluid, that absorbs heat from a heat-generating source and carries the heat away from the heat-generating source, thereby cooling the heat-generating source. The heat exchanger can thus be used to cool a variety of heat sources, such as semiconductor devices, batteries, motors, walls of process chambers, and any source that generates heat.

According to the present invention, a method of fabricating a heat exchanger comprising microstructures is presented. In one embodiment, the method comprises the steps of forming a plurality of microscaled apertures through a plurality of heat conductive layers using a material removal process to form a plurality of windowed layers; and the step of coupling the plurality of windowed layers together to form a composite microstructure.

In the preferred embodiment of the present invention, the heat conductive layers comprise copper, and the plurality of windowed layers formed from the heat conductive layers are coupled together by a brazing process. The brazing is preferably conducted in a furnace under vacuum or reducing atmosphere such as forming gas or pure hydrogen gas. Preferably the brazing is done with a brazing material comprising silver. Using silver, the furnace is preferably heated to around 850° C., a temperature at which silver diffuses into copper, forming a Cu—Ag inter-metallic complex alloy, which melts thereby providing an excellent thermal and mechanical bonding.

Because of the microscopic length scales of the apertures formed in the heat conductive layers, the brazing process is carefully controlled so that the brazing material does not completely or partially obstruct the apertures. Preferably, prior to brazing, silver is plated onto the heat conductive layers to a thickness varying between about 0.25 and about 2 micrometers for heat conductive layers of about 150 micrometer thickness.

The method of fabricating a heat exchanger preferably further comprises a step of aligning apertures in each of the plurality of windowed layers before coupling the plurality of windowed layers together. This alignment ensures that the composite microstructure resulting from the combination of the plurality of heat conductive layers has desired characteristics. For example, if microchannel structures are formed, alignment ensures that their aspect ratios will depend primarily on the number of heat conductive layers bonded together.

The present invention considers a wide range of processes for forming the windowed layers, including those based on material removal and those based on material deposition. Exemplary processes include, but are not limited to, laser drilling, laser machining, wet etching, LIGA, radiolithography, ion beam etching, chemical vapor deposition (CVD), physical vapor deposition (PVD), sputter deposition, evaporative deposition, molecular beam epitaxy, electroless plating and electrolytic plating. Though many of these are HARM processes, the present invention does not require a HARM process.

Preferably, the microscaled apertures are formed by a wet etching process. The preferred wet etching process is an isotropic wet etching process. In the preferred embodiment, where the heat conductive layers comprise copper, the process of forming the microscaled apertures may be through mask chemical etching (also known as Photo Chemical Machining or PCM), through mask electrochemical etching (also known as electroetching or electrochemical micromachining), or some other suitable wet etching process.

The composite microstructure formed by coupling together the plurality of heat conductive layers comprises a micromesh, a plurality of microchannels, or some other high surface to volume ratio material structure. In the present invention, a microstructure is constructed by forming microscaled apertures through each of the plurality of heat conductive layers, preferably using a wet etching process that comprises forming a first micropattern in a first side of the each heat conductive layer and a second micropattern in a second side of each heat conductive layer. In this way the first and second micropatterns are complementary to form continuous microchannels in the heat conductive layer. Alternatively, the first and second micropatterns are designed to form an overlapping micromesh structure in the heat conductive layer.

The plurality of heat conductive layers preferably have a thickness between about 50 and about 250 micrometers. Further, the microscaled apertures formed in the heat conductive layers preferably have dimensions between about 50 and about 300 micrometers.

In a further aspect of the present invention a method of fabricating a micro-heat exchanger comprising a heat conductive high surface to volume ratio material (HSVRM) structure is presented. The method comprises the steps of providing a lid structure made from a first material, coupling a manifold structure made from a second material and configured to distribute cooling fluid from the lid structure, forming a plurality of microscaled apertures through a plurality of heat conductive layers comprised of a heat conductive material using a material removal process to form a plurality of windowed layers. The method also comprises coupling the plurality of windowed layers together to form a composite HSVRM structure comprising the heat conductive material, wherein the particular microscaled aperture structures formed in each of the plurality of heat conductive layers are designed to form the composite HSVRM structure when the heat conductive layers are coupled together. The method further comprises coupling the composite HSVRM structure with the manifold structure and the lid structure so that the manifold layer is configured to deliver fluid to the HSVRM structure, and coupling a flat base structure comprising a third material with the composite HSVRM structure, the manifold structure, and the lid structure together to create the micro-heat exchanger.

In this aspect, the HSVRM structure is preferably formed according to the previously outlined method, wherein the heat conductive layers are preferably copper, and they are preferably coupled together by a brazing process. Further, the lid, manifold and flat base structures are preferably coupled with the HSVRM structure by a brazing process using a silver-based brazing material. Silver is preferably plated onto the lid, manifold and base structures in a thickness between about 1 and about 10 micrometers. Preferably, the heat conductive layers that compose the HSVRM structure are plated with about 1 micrometer of silver and the manifold, lid and base structures are plated with about 4 micrometers of silver. In other embodiments of the brazing process, the manifold is plated with about 4 micrometers of silver and the heat conducting HSVRM structure is plated with 1 micrometer of silver while the lid and flat base structures remain unplated.

Preferably, the flat base structure is lapped to a fine finish following assembly of the micro-heat exchanger. Further, the assembled micro-heat exchanger provides a fluid-tight structure for fluid facilitated heat exchange, except for a plurality of ports that are preferably formed in the lid or manifold structure to allow fluid flow, preferably from an external fluid network.

In the preferred embodiment of the present invention, the number and thickness of the plurality of heat conductive layers that compose the composite HSVRM structure are chosen to optimize pressure drop and thermal resistance characteristics of the micro-heat exchanger.

In a further aspect of the present invention, a microstructured heat exchanger comprises a plurality of heat conductive layers, each having a plurality of elongated microscaled apertures formed therethrough, wherein the plurality of elongated microscaled apertures are aligned and the plurality of heat conductive layers are coupled together to form a HSVRM structure, wherein each elongated aperture in a first heat conductive layer is in communication with more than three elongated apertures of at least one adjacent heat conductive layer.

The microstructured heat exchanger preferably comprises heat conductive layers that include copper, and which are coupled together by a brazing process. Further, the microscaled apertures are preferably formed by an isotropic wet etching process as in the previously described embodiments of the present invention, though they can be formed through a variety of alternative processes. Further, the number and thickness of the plurality of heat conductive layers are preferably chosen to optimize pressure drop and thermal resistance characteristics of the microstructured heat exchanger.

In a still further aspect of to the present invention, a microstructured heat exchanger comprises a plurality of heat conductive layers, each having a plurality of elongated microscaled apertures formed therethrough, wherein the plurality of elongated microscaled apertures are aligned and the plurality of heat conductive layers are coupled together to form a HSVRM structure, wherein each elongated aperture in a first heat conductive layer is in communication with only one elongated aperture of any adjacent heat conductive layer.

The plurality of elongated microscaled apertures are preferably the same in each of the plurality of heat conductive layers. Again, the microscaled apertures are preferably formed by an isotropic wet etching process carried out on a plurality of heat conductive layers comprising copper, which are later joined together by a brazing process using a brazing material comprising silver. Preferably, the number and thickness of the plurality of heat conductive layers are chosen to optimize pressure drop and thermal resistance characteristics of the microstructured heat exchanger.

In alternative embodiments of the present invention, the plurality of windowed layers are formed by material deposition methods, such as CVD, PVD, molecular beam epitaxy, sputter deposition, evaporative deposition or plating, and coupled together in the manner described above.

The present invention can be used to form a wide variety of heat exchanging structures. For example, the present invention includes formation through the means discussed above and in more detail below of heat exchanging structures taught in the parent applications. These include the structures taught in co-pending U.S. patent application Ser. No. 10/439,635, filed on May 16, 2003 and titled "METHODS FOR FLEXIBLE FLUID DELIVERY AND HOTSPOT COOLING OF MICROCHANNEL HEATSINKS," those taught in co-pending U.S. patent application Ser. No. 10/439,912 filed on May 16, 2003 and entitled "INTERWOVEN MANIFOLDS FOR PRESSURE DROP REDUCTION IN MICROCHANNEL HEAT EXCHANGERS," those taught in co-pending U.S. patent application Ser. No. 10/680,584, filed Oct. 6, 2003 and entitled "METHOD AND APPARATUS FOR EFFICIENT VERTICAL FLUID DELIVERY FOR COOLING A HEAT PRODUCING DEVICE," and those taught in co-pending U.S. patent application Ser. No. 10/612,241, filed on Jul. 1, 2003 and entitled "MULTI-LEVEL MICROCHANNEL HEAT EXCHANGERS."

DETAILED DESCRIPTION OF THE EMBODIMENTS OF THE INVENTION

Figure 1A:
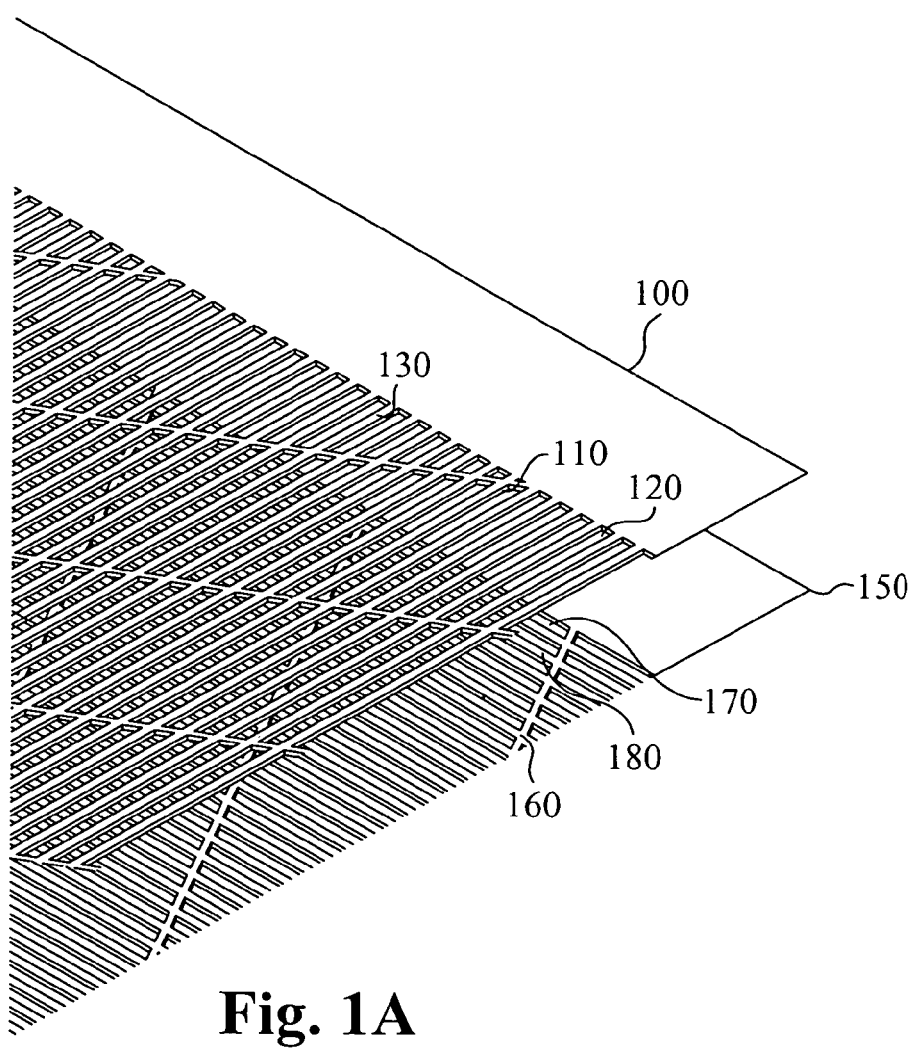
FIG. 1A shows a partial cross section view of two heat conductive layers formed using two micropatterns in accordance with an embodiment of the present invention.
Figure 1B:
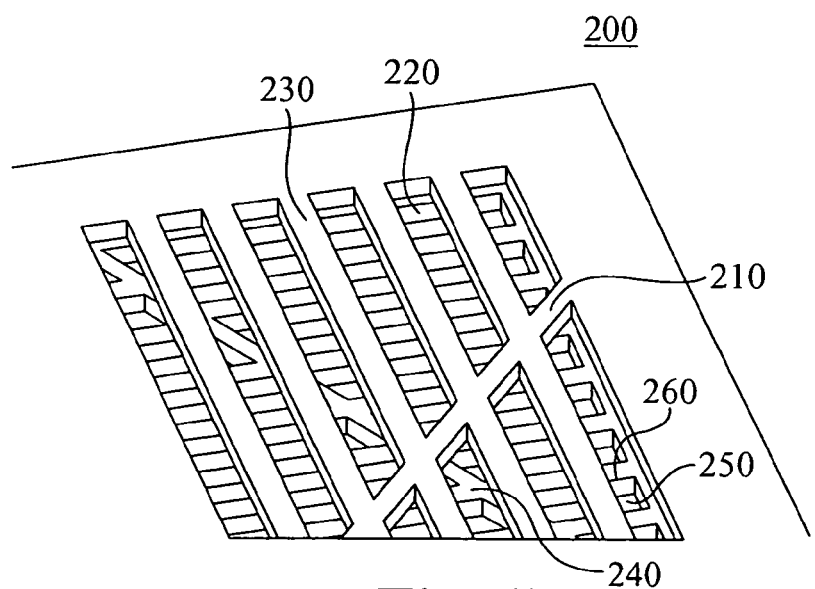
FIG. 1B shows a perspective view of a heat conductive layer formed using two micropattern in accordance with an embodiment of the present invention.
Figure 1C:
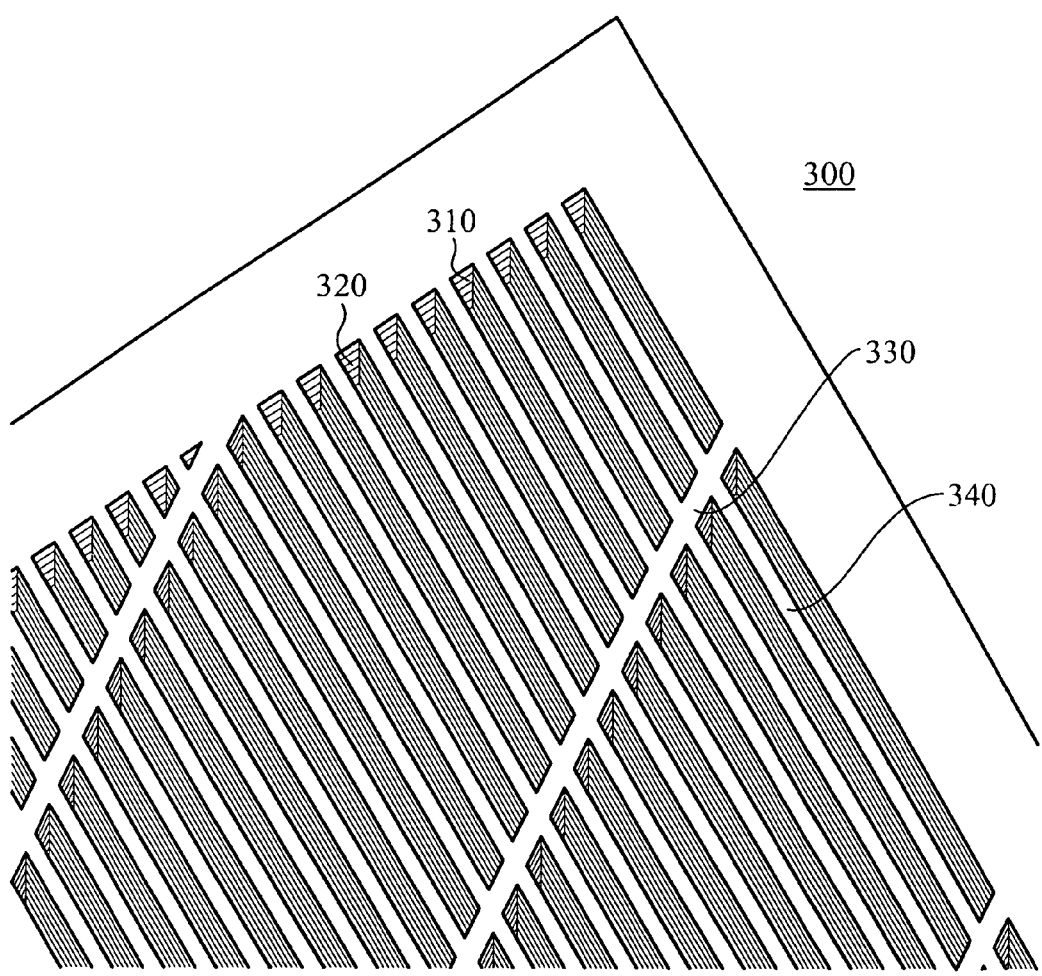
FIG. 1C shows a perspective view of a HSVRM structure formed from a plurality of heat conductive layers in accordance with the present invention.

The present invention describes a method of forming heat conductive layers and coupling a plurality of such layers together to form a three dimensional microstructured region. In accordance with the present invention, the microstructured region comprises micromesh, microchannels, or some other microstructure. FIG. 1A shows a first embodiment of a micromesh region, FIG. 1B shows a second embodiment of a micromesh region. FIG. 1C shows a plurality of layers formed and coupled together to create microchannels in accordance with the embodiments of the present invention.

FIG. 1A shows two windowed layers 100, 150 which have been formed in accordance with the present invention from two heat conductive layers. Preferably, the two heat conductive layers are formed using a wet etching process wherein photo tools are used which determine the locations and patterns of the microscaled apertures 120, 170 of the windowed layers 100, 150. The two windowed layers comprise a plurality of thick solid bars 110, 160 and thin solid bars 130, 180 which form the microscaled apertures 120, 170.

In the embodiment illustrated in FIG. 1A, the microscaled apertures 120 of the windowed layer 100 and the microscaled apertures 170 of the windowed layer 150 are configured to overlap one another so that each aperture 120 in the windowed layer 100 is in communication with more than three of the apertures 170 of the windowed layer 150. In this embodiment, the windowed layer 100 is formed using a first micropattern and the windowed layer 150 is formed using a second micropattern. The first and second micropatterns are designed to form the overlapping micromesh structure illustrated in FIG. 1A when the layers 100 and 150 are coupled together.

FIG. 1B shows a single windowed layer 200, formed from a heat conductive layer in accordance with the present invention. The layer 200 comprises a first sublayer of microscaled thick solid bars 210 and thin solid bars 230, which form the microscaled apertures 220 and a second sublayer of microscaled thick solid bars 260 and thin solid bars 240 which form the microscaled apertures 250

In the embodiment illustrated in FIG. 1B, the microscaled apertures 220 and the microscaled apertures 250 are elongated and are formed to overlap one another so that each aperture 220 is in communication with more than three of the apertures 250. In this embodiment, the apertures 220 are formed in a first side of the heat conductive layer using a first micropattern and the apertures 250 are formed in a second side of the heat conductive layer from which the windowed layer 200 is formed using a second micropattern. In the formation of the windowed layer 200 the first and second micropatterns used are designed to form the overlapping micromesh structure illustrated in FIG. 1B within the single windowed layer 200.

FIG. 1C illustrates a microstructured material structure 300 comprising a plurality of windowed layers 310 coupled together to form a plurality of high aspect ratio microchannels 320. Each windowed layer 310 comprises a microstructured region comprising thick solid bars 330 and thin solid bars 340. The bars 330, 340 form the microchannels 320 when the windowed layers 310 are assembled into the structure 300. According to the present invention, the microchannels 320 in each windowed layer 310 are aligned before coupling the plurality of windowed layers 310 together. This alignment ensures that the composite microstructure resulting from the combination of the plurality of heat conductive layers has desired characteristics. Due to the alignment the microchannel structures 320 have aspect ratios that depend primarily on the number of windowed layers 310 bonded together.

In the preferred embodiment of the present invention, the windowed layers 310 comprise copper, and are coupled together by a brazing process. The brazing is preferably conducted in a furnace under vacuum or reducing atmosphere such as forming gas or pure hydrogen gas. Preferably the brazing is done with a brazing material comprising silver. Using silver, the furnace is preferably heated to around 850° C., a temperature at which silver diffuses into copper, forming a Cu—Ag inter-metallic complex alloy, which melts and provides an excellent thermal and mechanical bond.

Because of the microscopic length scales of the apertures formed in the heat conductive layers, the brazing process is carefully controlled so that the brazing material does not completely or partially obstruct the apertures. Preferably, prior to brazing, silver is plated onto the windowed layers 310 to a thickness varying between about 0.25 and about 2 micrometers for windowed layers 310 of about 150 micrometer thickness.

Figure 2A:
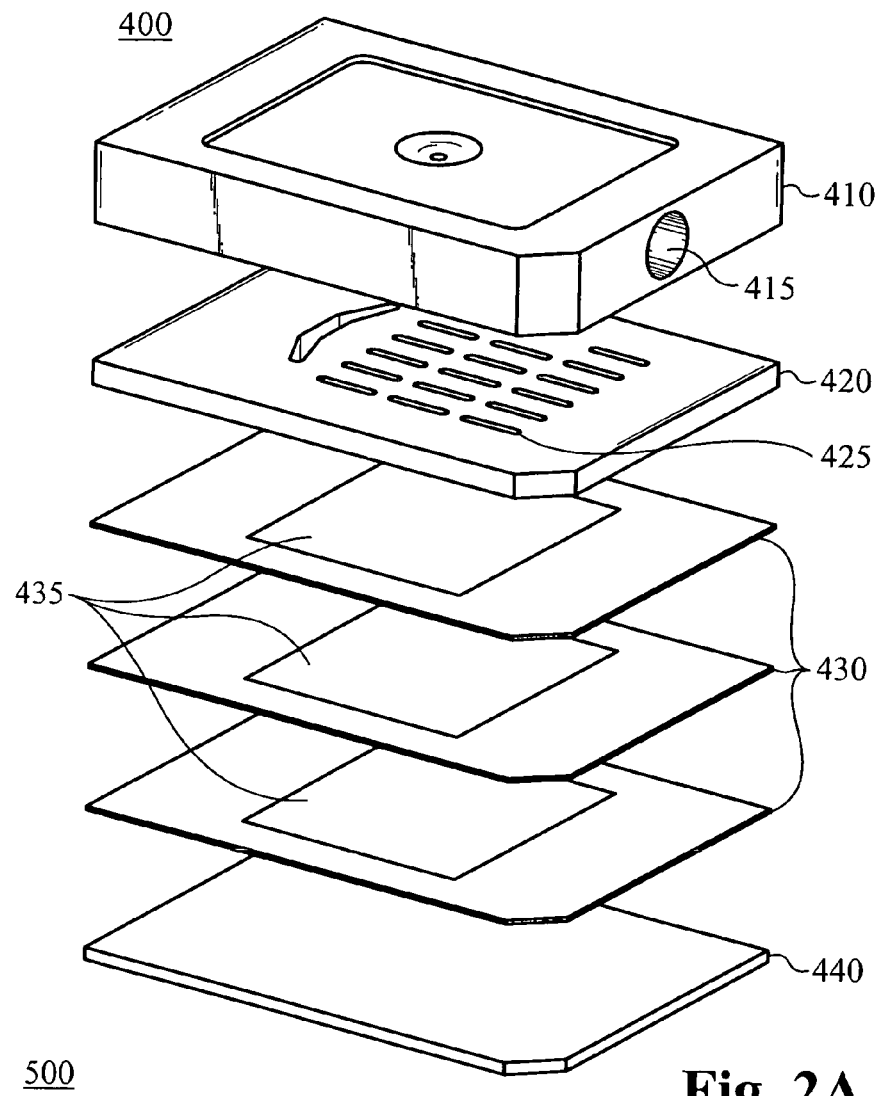
FIG. 2A shows an exploded view of a micro-heat exchanger in accordance with the embodiments of the present invention.

FIG. 2A illustrates an exploded view of a micro-heat exchanger 400 comprising a heat conductive (HSVRM) according to the present invention. The micro-heat exchanger 400 comprises a lid structure 410 coupled with a manifold structure 420, a plurality of windowed layers 430, and a flat base structure 440. The manifold layer 420 is configured to distribute cooling fluid. Preferably, all the components of the micro-heat exchanger 400 are coupled together by brazing. The plurality of windowed layers 430 each contain a microscaled aperture region 435. When the plurality of windowed layers 430 are coupled together they form a composite HSVRM structure comprising a heat conductive material from which the windowed layers 430 are formed.

The lid structure 410, the manifold structure 420, and the flat base structure 440 are preferably coupled with the HSVRM structure formed by the coupling of the windowed layers 430 by a brazing process using a silver-based brazing material. Silver is plated onto the lid structure 410, the manifold structure 420, and the flat base structure 440 in a thickness between about 1 and about 10 micrometers. More preferably, the heat conductive layers 430 that compose the HSVRM structure are plated with about 1 micrometers of silver and the manifold structure 420, lid structure 410, and base structure 440 are plated with about 4 micrometers of silver. In some other embodiments, the manifold structure 420 is plated with about 4 micrometers of silver while the lid structure 410 and the flat base structure 440 are unplated.

Preferably, the flat base structure 440 is lapped to a fine finish following assembly of the micro-heat exchanger 400. Further, the assembled micro-heat exchanger 400 provides a fluid-tight structure for fluid facilitated heat exchange, except for a plurality of ports 415 that are preferably formed in the lid structure 410 to allow fluid flow into the features 425 of the manifold structure 420 and subsequently to the HSVRM structure. Preferably, fluid flows from an external fluid network.

In the preferred embodiment of the present invention, the number and thickness of the plurality of windowed layers 430 that compose the composite HSVRM structure are chosen to optimize pressure drop and thermal resistance characteristics of the micro-heat exchanger 400.

Figure 2B:
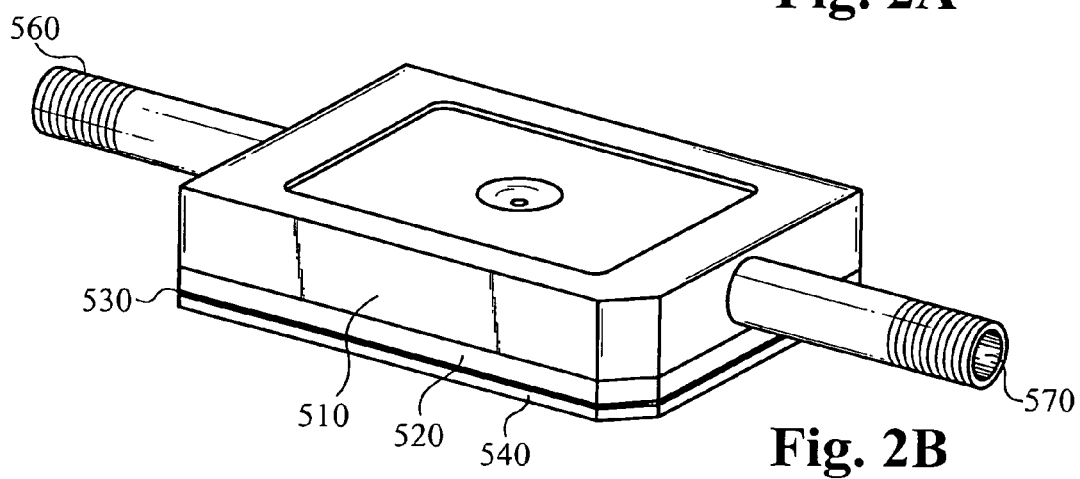
FIG. 2B shows a perspective view of an assembled micro-heat exchanger in accordance with the embodiments of the present invention.

FIG. 2B is a perspective view of a micro-heat exchanger 500 in accordance with the present invention. The micro-heat exchanger 500 comprises a lid structure 510, a manifold structure 520, a base structure 540, and a plurality of heat conductive layers 530, each having a plurality of elongated microscaled apertures formed therethrough. The plurality of elongated microscaled apertures are aligned and the plurality of heat conductive layers are coupled together to form a HSVRM structure. Further, the lid structure 510 includes a plurality of fluid ports 560, 570 to allow fluid flow through the manifold structure 520 and the HSVRM structure.

In the embodiments of the present invention, the windowed layers illustrated in FIGS. 1A-2B are preferably formed by a wet etching process. Preferably, the wet etching process used is an isotropic wet etching process. In the preferred embodiment, where the heat conductive layers comprise copper, the process may be through mask chemical etching (also known as Photo Chemical Machining or PCM), through mask electrochemical etching (also known as electroetching or electrochemical micromachining), or some other suitable wet etching process.

Also according to the present invention, the windowed layers shown in FIGS. 1A-2B preferably have a thickness between about 50 and about 250 micrometers. Further, the microscaled apertures formed in the heat conductive layers to create the windowed layers preferably have hole and line dimensions between about 50 and about 300 micrometers.

It will be appreciated that interface layers and manifold layers can be formed and combined in other ways in accordance with the present invention. For example, the windowed layers can be formed through any one of a variety of processes including those based on material deposition, those based on material removal and those based on material deformation. Though a HARM process can be used, the present invention allows construction of high aspect ratio structures from the windowed layers even though each layer is not produced through a HARM process. Exemplary processes include but are not limited to laser drilling, laser machining, wet etching, LIGA, radiolithography, ion beam etching, chemical vapor deposition, physical vapor deposition, sputter deposition, evaporative deposition, molecular beam epitaxy, electroless plating and electrolytic plating. Also, stamping can be used. Alternatively, these structures can be formed using metal injection molding (MIM), plastic injection molding, other forms of molding, or by many other means.

Heat exchangers in accordance with the present invention provide smooth flow paths and highly branched flow patterns in which cooling materials travel. Such structures reduce the load on the pumps pumping the cooling material through the heat exchanger. The method of manufacturing heat exchangers in accordance with the embodiments the present invention are relatively inexpensive. Wet etching is a chemical etching process, preferably using wet chemistries, to form trenches that ultimately form the flow paths. The use of wet chemistries is inexpensive and quick compared to other device fabrication processes. The present invention can thus be used to inexpensively fabricate heat exchangers used to cool a variety of devices, such as semiconductor processing devices, motors, light-emitting devices, batteries, walls of process chambers, MEMS, and any device that generates heat. Many forms of cooling materials can be transmitted through the heat exchangers including, but not limited to, liquids such as water, air, other gases, vapors, refrigerants such as Freon, or any material or combination of materials that can absorb and transport heat efficiently.

Figure 3A:
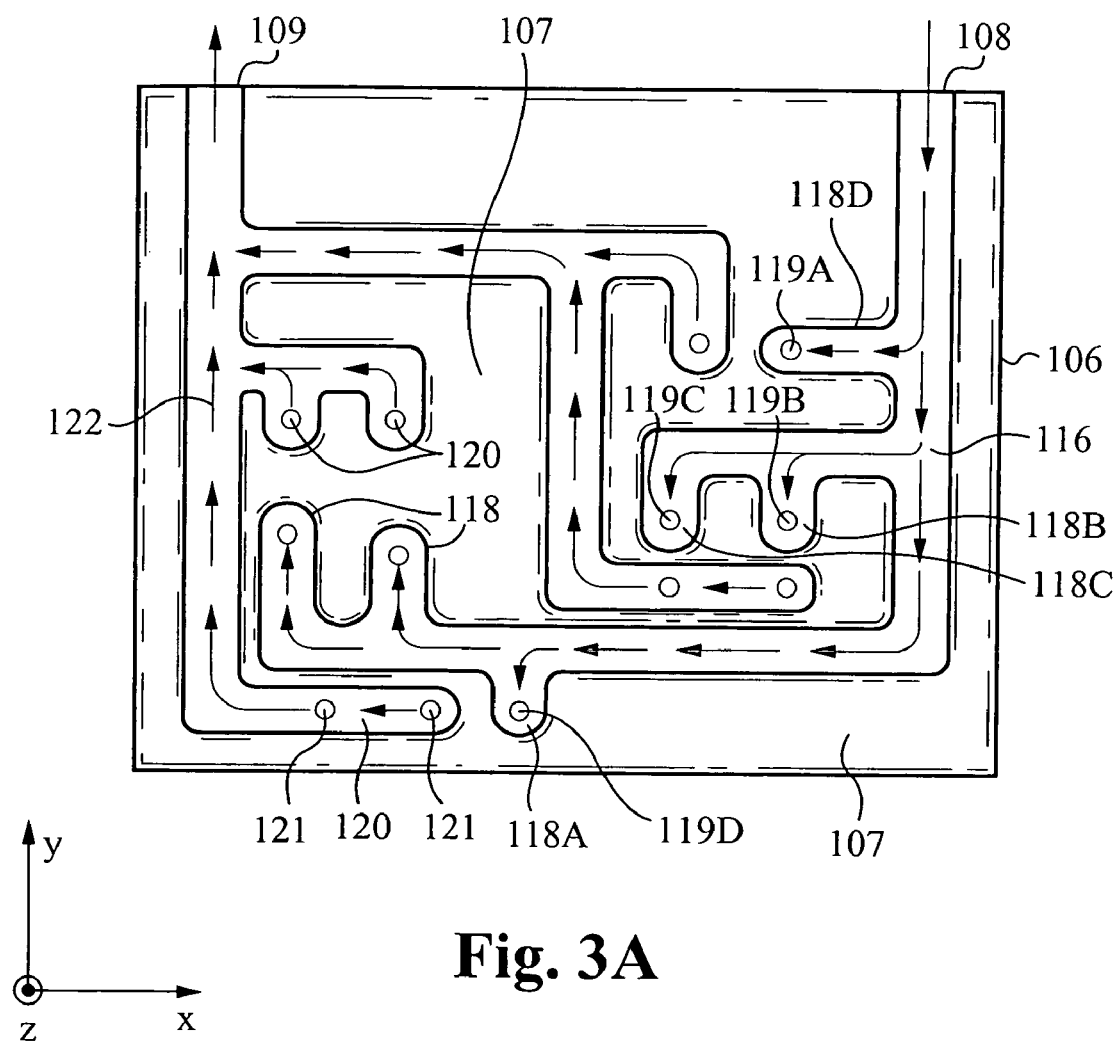
FIG. 3A illustrates a top view of the alternative manifold layer of the heat exchanger in accordance with the present invention.
Figure 3B:
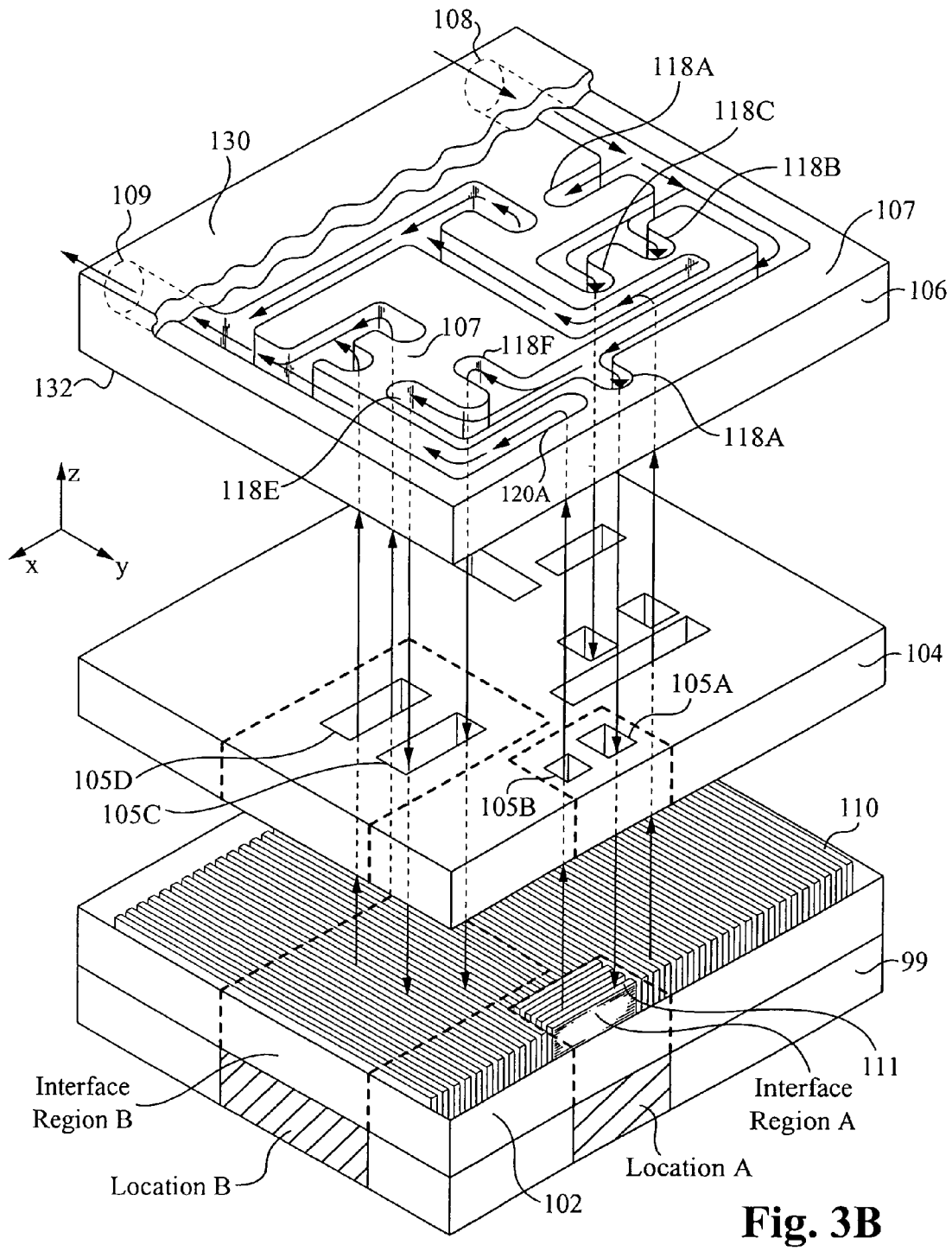
FIG. 3B illustrates an exploded view of the alternative heat exchanger with the alternative manifold layer in accordance with the present invention.

FIG. 3B illustrates an exploded view of the alternative three tier heat exchanger 100 with the alternative manifold layer in accordance with the present invention. The alternative embodiment, as shown in FIG. 3B, is a three level heat exchanger 100 which includes an interface layer 102, at least one intermediate layer 104 and at least one manifold layer 106. Alternatively, as discussed below, the heat exchanger 100 is a two level apparatus which includes the interface layer 102 and the manifold layer 106.

FIG. 3A illustrates a top view of the alternate manifold layer 106 of the present invention. In particular, as shown in FIG. 3B, the manifold layer 106 includes four sides as well as a top surface 130 and a bottom surface 132. However, the top surface 130 is removed in FIG. 3A to adequately illustrate and describe the workings of the manifold layer 106. As shown in FIG. 3A, the manifold layer 106 has a series of channels or passages 116, 118, 120, 122 as well as ports 108, 109 formed therein. The fingers 118, 120 extend completely through the body of the manifold layer 106 in the Z-direction as shown in FIG. 3B. Alternatively, the fingers 118 and 120 extend partially through the manifold layer 106 in the Z-direction and have apertures as shown in FIG. 3A. In addition, passages 116 and 122 extend partially through the manifold layer 106. The remaining areas between the inlet and outlet passages 116, 120, designated as 107, extend from the top surface 130 to the bottom surface 132 and form the body of the manifold layer 106.

As shown in FIG. 3A, the fluid enters manifold layer 106 via the inlet port 108 and flows along the inlet channel 116 to several fingers 118 which branch out from the channel 116 in several directions in the X and/or Y directions to apply fluid to selected regions in the interface layer 102. The fingers 118 are arranged in different predetermined directions to deliver fluid to the locations in the interface layer 102 corresponding to the areas at or near the hot spots in the heat source. These locations in the interface layer 102 are hereinafter referred to as interface hot spot regions. The fingers are configured to cool stationary as well as temporally varying interface hot spot regions. As shown in FIG. 3A, the channels 116, 122 and fingers 118, 120 are disposed in the X and/or Y directions in the manifold layer 106. Thus, the various directions of the channels 116, 122 and fingers 118, 120 allow delivery of fluid to cool hot spots in the heat source 99 and/or minimize pressure drop within the heat exchanger 100. Alternatively, channels 116, 122 and fingers 118, 120 are periodically disposed in the manifold layer 106 and exhibit a pattern, as in the example shown in FIG. 5.

The arrangement as well as the dimensions of the fingers 118, 120 are determined in light of the hot spots in the heat source 99 that are desired to be cooled. The locations of the hot spots as well as the amount of heat produced near or at each hot spot are used to configure the manifold layer 106 such that the fingers 118, 120 are placed above or proximal to the interface hot spot regions in the interface layer 102. The manifold layer 106 preferably allows one phase and/or two-phase fluid to circulate to the interface layer 102 without allowing a substantial pressure drop from occurring within the heat exchanger 100. The fluid delivery to the interface hot spot regions creates a uniform temperature at the interface hot spot region as well as areas in the heat source adjacent to the interface hot spot regions.

The dimensions as well as the number of channels 116 and fingers 118 depend on a number of factors. In one embodiment, the inlet and outlet fingers 118, 120 have the same width dimensions. Alternatively, the inlet and outlet fingers 118, 120 have different width dimensions. The width dimensions of the fingers 118, 120 are within the range of and including 0.25-0.50 millimeters. In one embodiment, the inlet and outlet fingers 118, 120 have the same length and depth dimensions. Alternatively, the inlet and outlet fingers 118, 120 have different length and depth dimensions. In another embodiment, the inlet and outlet fingers 118, 120 have varying width dimensions along the length of the fingers. The length dimensions of the inlet and outlet fingers 118, 120 are within the range of and including 0.5 millimeters to three times the size of the heat source length. In addition, the fingers 118, 120 have a height or depth dimension within the range and including 0.25-0.50 millimeters. In addition, less than 10 or more than 30 fingers per centimeter are alternatively disposed in the manifold layer 106. However, it is apparent to one skilled in the art that between 10 and 30 fingers per centimeter in the manifold layer is also contemplated.

It is contemplated within the present invention to tailor the geometries of the fingers 118, 120 and channels 116, 122 to be in non-periodic arrangement to aid in optimizing hot spot cooling of the heat source. In order to achieve a uniform temperature across the heat source 99, the spatial distribution of the heat transfer to the fluid is matched with the spatial distribution of the heat generation. As the fluid flows along the interface layer through the microchannels 110, its temperature increases and as it begins to transform to vapor under two-phase conditions. Thus, the fluid undergoes a significant expansion which results in a large increase in velocity. Generally, the efficiency of the heat transfer from the interface layer to the fluid is improved for high velocity flow. Therefore, it is possible to tailor the efficiency of the heat transfer to the fluid by adjusting the cross-sectional dimensions of the fluid delivery and removal fingers 118, 120 and channels 116, 122 in the heat exchanger 100.

For example, a particular finger can be designed for a heat source where there is higher heat generation near the inlet. In addition, it may be advantageous to design a larger cross section for the regions of the fingers 118, 120 and channels 116, 122 where a mixture of fluid and vapor is expected. Although not shown, a finger can be designed to start out with a small cross sectional area at the inlet to cause high velocity flow of fluid. The particular finger or channel can also be configured to expand to a larger cross-section at a downstream outlet to cause a lower velocity flow. This design of the finger or channel allows the heat exchanger to minimize pressure drop and optimize hot spot cooling in areas where the fluid increases in volume, acceleration and velocity due to transformation from liquid to vapor in two-phase flow.

In addition, the fingers 118, 120 and channels 116, 122 can be designed to widen and then narrow again along their length to increase the velocity of the fluid at different places in the microchannel heat exchanger 100. Alternatively, it is appropriate to vary the finger and channel dimensions from large to small and back again many times over in order to tailor the heat transfer efficiency to the expected heat dissipation distribution across the heat source 99. It should be noted that the above discussion of the varying dimensions of the fingers and channels also apply to the other embodiments discussed and is not limited to this embodiment.

Alternatively, as shown in FIG. 3A, the manifold layer 106 includes one or more apertures 119 in the inlet fingers 118. In the three tier heat exchanger 100, the fluid flowing along the fingers 118 flows down the apertures 119 to the intermediate layer 104. Alternatively, in the two-tier heat exchanger 100, the fluid flowing along the fingers 118 flows down the apertures 119 directly to the interface layer 102. In addition, as shown in FIG. 3A. the manifold layer 106 includes apertures 121 in the outlet fingers 120. In the three tier heat exchanger 100, the fluid flowing from the intermediate layer 104 flows up the apertures 121 into the outlet fingers 120. Alternatively, in the two-tier heat exchanger 100, the fluid flowing from the interface layer 102 flows directly up the apertures 121 into the outlet fingers 120.

In the alternative embodiment, the inlet and outlet fingers 118, 120 are open channels which do not have apertures. The bottom surface 132 of the manifold layer 106 abuts against the top surface of the intermediate layer 104 in the three tier exchanger 100 or abuts against the interface layer 102 in the two tier exchanger. Thus, in the three-tier heat exchanger 100, fluid flows freely to and from the intermediate layer 104 and the manifold layer 106. The fluid is directed to and from the appropriate interface hot spot region by conduits 105 the intermediate layer 104. It is apparent to one skilled in the art that the conduits 105 are directly aligned with the fingers, as described below or positioned elsewhere in the three tier system.

Although FIG. 3B shows the alternative three tier heat exchanger 100 with the alternative manifold layer, the heat exchanger 100 is alternatively a two layer structure which includes the manifold layer 106 and the interface layer 102, whereby fluid passes directly between the manifold layer 106 and interface layer 102 without passing through the intermediate layer 104. It is apparent to one skilled in the art that the configuration of the manifold, intermediate and interface layers are shown for exemplary purposes and is thereby not limited to the configuration shown.

As shown in FIG. 3B, the intermediate layer 104 includes a plurality of conduits 105 which extend therethrough. The inflow conduits 105 direct fluid entering from the manifold layer 106 to the designated interface hot spot regions in the interface layer 102. Similarly, the apertures 105 also channel fluid flow from the interface layer 102 to the exit fluid port(s) 109. Thus, the intermediate layer 104 also provides fluid delivery from the interface layer 102 to the exit fluid port 109 where the exit fluid port 109 is in communication with the manifold layer 106.

The conduits 105 are positioned in the intermediate layer 104 in a predetermined pattern based on a number of factors including, but not limited to, the locations of the interface hot spot regions, the amount of fluid flow needed in the interface hot spot region to adequately cool the heat source 99 and the temperature of the fluid. The conduits have a width dimension of 100 microns, although other width dimensions are contemplated up to several millimeters. In addition, the conduits 105 have other dimensions dependent on at least the above mentioned factors. It is apparent to one skilled in the art that each conduit 105 in the intermediate layer 104 has the same shape and/or dimension, although it is not necessary. For instance, like the fingers described above, the conduits alternatively have a varying length and/or width dimension. Additionally, the conduits 105 have a constant depth or height dimension through the intermediate layer 104. Alternatively, the conduits 105 have a varying depth dimension, such as a trapezoidal or a nozzle-shape, through the intermediate layer 104. Although the horizontal shape of the conduits 105 are shown to be rectangular in FIG. 3B, the conduits 105 alternatively have any other shape including, but not limited to, circular (FIG. 3A), curved, elliptical. Alternatively, one or more of the conduits 105 are shaped and contour with a portion of or all of the finger or fingers above.

The intermediate layer 104 is horizontally positioned within the heat exchanger 100 with the conduits 105 positioned vertically. Alternatively, the intermediate layer 104 is positioned in any other direction within the heat exchanger 100 including, but not limited to, diagonal and curved forms. Alternatively, the conduits 105 are positioned within the intermediate layer 104 in a horizontally, diagonally, curved or any other direction. In addition, the intermediate layer 104 extends horizontally along the entire length of the heat exchanger 100, whereby the intermediate layer 104 completely separates the interface layer 102 from the manifold layer 106 to force the fluid to be channeled through the conduits 105. Alternatively, a portion of the heat exchanger 100 does not include the intermediate layer 104 between the manifold layer 106 and the interface layer 102, whereby fluid is free to flow therebetween. Further, the intermediate layer 104 alternatively extends vertically between the manifold layer 106 and the interface layer 102 to form separate, distinct intermediate layer regions. Alternatively, the intermediate layer 104 does not fully extend from the manifold layer 106 to interface layer 102.

FIG. 3B illustrates a perspective view of another embodiment of the interface layer 102 in accordance with the present invention. As shown in FIG. 3B, the interface layer 102 includes a bottom surface 103 and a plurality of microchannel walls 110, whereby the area in between the microchannel walls 110 channels or directs fluid along a fluid flow path. The bottom surface 103 is flat and has a high thermal conductivity to allow sufficient heat transfer from the heat source 99. Alternatively, the bottom surface 103 includes troughs and/or crests designed to collect or repel fluid from a particular location. The microchannel walls 110 are configured in a parallel configuration, as shown in FIG. 3B, whereby fluid flows between the microchannel walls 110 along a fluid path.

It is apparent to one skilled in the art that the microchannel walls 110 are alternatively configured in any other appropriate configuration depending on the factors discussed above. For instance, the interface layer 102 alternatively has grooves in between sections of microchannel walls 110, as shown in FIG. 8C. In addition, the microchannel walls 110 have dimensions which minimize the pressure drop or differential within the interface layer 102. It is also apparent that any other features, besides microchannel walls 110 are also contemplated, including, but not limited to roughed surfaces and a micro-porous structure, such as sintered metal and silicon foam. However, for exemplary purposes, the parallel microchannel walls 110 shown in FIG. 3B is used to describe the interface layer 102 in the present invention. Alternatively, the microchannel walls 110 have non-parallel configurations.

The microchannel walls 110 allow the fluid to undergo thermal exchange along the selected hot spot locations of the interface hot spot region to cool the heat source 99 in that location. The microchannel walls 110 have a width dimension within the range of 20-300 microns and a height dimension within the range of 100 microns to one millimeter, depending on the power of the heat source 99. The microchannel walls 110 have a length dimension which ranges between 100 microns and several centimeters, depending on the dimensions of the heat source, as well as the size of the hot spots and the heat flux density from the heat source. Alternatively, any other microchannel wall dimensions are contemplated. The microchannel walls 110 are spaced apart by a separation dimension range of 50-500 microns, depending on the power of the heat source 99, although any other separation dimension range is contemplated.

Referring back to the assembly in FIG. 3B, the top surface of the manifold layer 106 is cut away to illustrate the channels 116, 122 and fingers 118, 120 within the body of the manifold layer 106. The locations in the heat source 99 that produce more heat are hereby designated as hot spots, whereby the locations in the heat source 99 which produce less heat are hereby designated as warm spots. As shown in FIG. 3B, the heat source 99 is shown to have a hot spot region, namely at location A, and a warm spot region, namely at location B. The areas of the interface layer 102 which abut the hot and warm spots are accordingly designated interface hot spot regions. As shown in FIG. 3B, the interface layer 102 includes interface hot spot region A, which is positioned above location A and interface hot spot region B, which is positioned above location B.

As shown in FIGS. 3A and 3B, fluid initially enters the heat exchanger 100 through one inlet port 108. The fluid then flows to one inlet channel 116. Alternatively, the heat exchanger 100 includes more than one inlet channel 116. As shown in FIGS. 3A and 3B, fluid flowing along the inlet channel 116 from the inlet port 108 initially branches out to finger 118D. In addition, the fluid which continues along the rest of the inlet channel 116 flows to individual fingers 118B and 118C and so on.

In FIG. 3B, fluid is supplied to interface hot spot region A by flowing to the finger 118A, whereby fluid flows down through finger 118A to the intermediate layer 104. The fluid then flows through the inlet conduit 105A, positioned below the finger 118A, to the interface layer 102, whereby the fluid undergoes thermal exchange with the heat source 99. As described, the microchannels in the interface layer 102 are configurable in any direction. Thus, the microchannels 111 in interface region A are positioned perpendicular to the rest of the microchannels 110 in the interface layer 102. Thus, the fluid from conduit 105A travels along the microchannels 111 as shown in FIG. 3B, although the fluid travel in other directions along the remaining areas of the interface layer 102. The heated liquid then travels upward through the conduit 105B to the outlet finger 120A.

Similarly, fluid flows down in the Z-direction through fingers 118E and 118F to the intermediate layer 104. The fluid then flows through the inlet conduit 105C down in the Z-direction to the interface layer 102. The heated fluid then travels upward in the Z-direction from the interface layer 102 through the outlet conduit 105D to the outlet fingers 120E and 120F. The heat exchanger 100 removes the heated fluid in the manifold layer 106 via the outlet fingers 120, whereby the outlet fingers 120 are in communication with the outlet channel 122. The outlet channel 122 allows fluid to flow out of the heat exchanger through one outlet port 109.

It is preferred that the inflow and outflow conduits 105 are also positioned directly or nearly directly above the appropriate interface hot spot regions to directly apply fluid to hot spots in the heat source 99. In addition, each outlet finger 120 is configured to be positioned closest to a respective inlet finger 118 for a particular interface hot spot region to minimize pressure drop therebetween. Thus, fluid enters the interface layer 102 via the inlet finger 118A and travels the least amount of distance along the bottom surface 103 of the interface layer 102 before it exits the interface layer 102 to the outlet finger 120A. It is apparent that the amount of distance which the fluid travels along the bottom surface 103 adequately removes heat generated from the heat source 99 without generating an unnecessary amount of pressure drop. In addition, as shown in FIGS. 3A and 3B, the corners in the fingers 118, 120 are curved to reduce pressure drop of the fluid flowing along the fingers 118.

It is apparent to one skilled in the art that the configuration of the manifold layer 106 shown in FIGS. 3A and 3B is only for exemplary purposes. The configuration of the channels 116 and fingers 118 in the manifold layer 106 depend on a number of factors, including but not limited to, the locations of the interface hot spot regions, amount of flow to and from the interface hot spot regions as well as the amount of heat produced by the heat source in the interface hot spot regions.

For instance, one possible configuration of the manifold layer 106 includes an interdigitated pattern of parallel inlet and outlet fingers that are alternatively arranged along the width of the manifold layer, as shown in FIGS. 4-7A and discussed below. Nonetheless, any other configuration of channels 116 and fingers 118 is contemplated.

Figure 4:
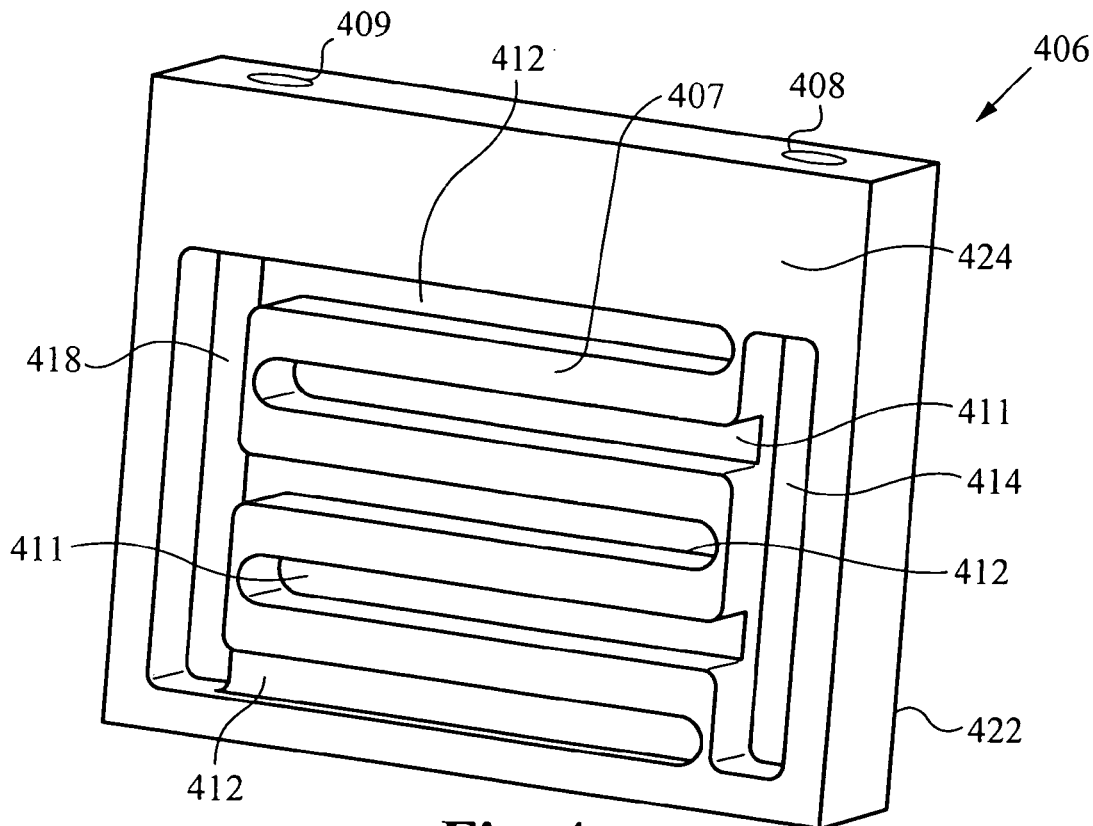
FIG. 4 illustrates a perspective view of the an interwoven manifold layer in accordance with the present invention.

FIG. 4 illustrates a perspective view of an alternative manifold layer 406 in accordance with the heat exchanger of the present invention. The manifold layer 406 in FIG. 4 includes a plurality of interwoven or inter-digitated parallel fluid fingers 411, 412 which allow one phase and/or two-phase fluid to circulate to the interface layer 402 without allowing a substantial pressure drop from occurring within the heat exchanger 400. As shown in FIG. 4, the inlet fingers 411 are arranged alternately with the outlet fingers 412. However, it is contemplated by one skilled in the art that a certain number of inlet or outlet fingers can be arranged adjacent to one another and is thereby not limited to the alternating configuration shown in FIG. 4. In addition, the fingers are alternatively designed such that a parallel finger branches off from or is linked to another parallel finger. Thus, it is possible to have many more inlet fingers than outlet fingers and vice versa.

The inlet fingers or passages 411 supply the fluid entering the heat exchanger to the interface layer 402, and the outlet fingers or passages 412 remove the fluid from the interface layer 402 which then exits the heat exchanger 400. The shown configuration of the manifold layer 406 allows the fluid to enter the interface layer 402 and travel a very short distance in the interface layer 402 before it enters the outlet passage 412. The substantial decrease in the length that the fluid travels along the interface layer 402 substantially decreases the pressure drop in the heat exchanger 400.

Figure 5:
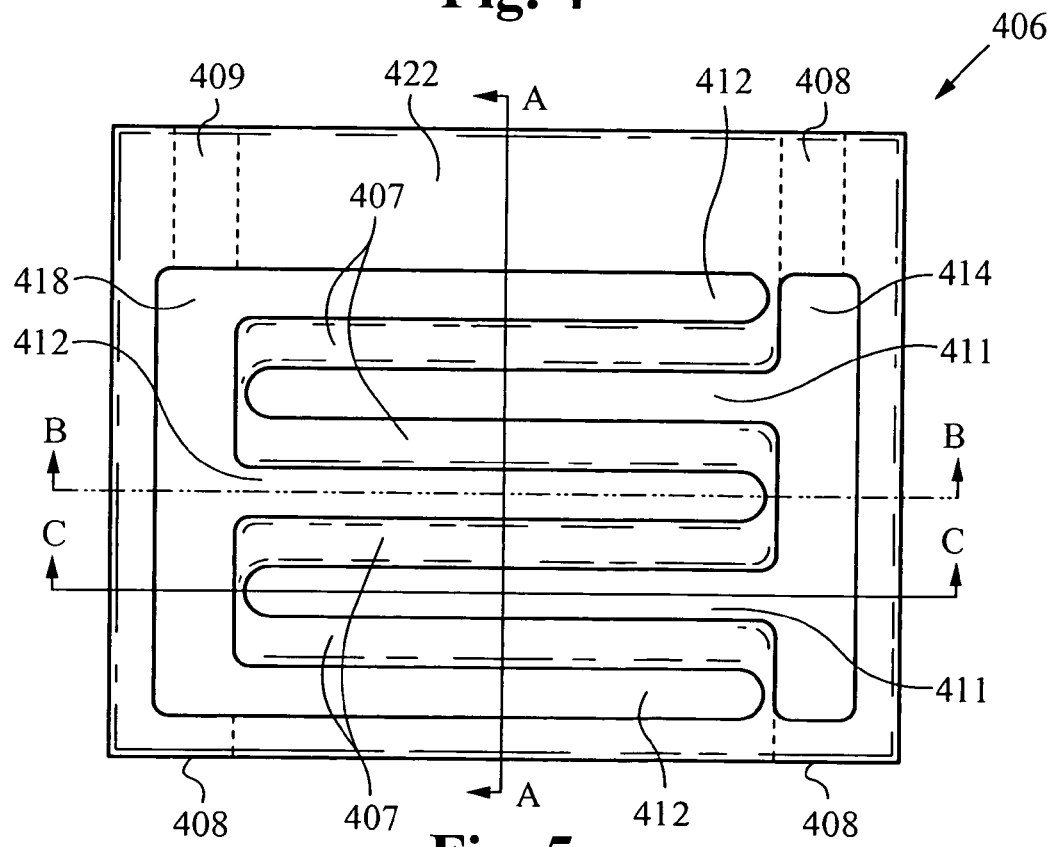
FIG. 5 illustrates a top view of the interwoven manifold layer with interface layer in accordance with the present invention.

As shown in FIGS. 4-5, the alternative manifold layer 406 includes a passage 414 which is in communication with two inlet passages 411 and provides fluid thereto. As shown in FIGS. 4-5 the manifold layer 406 includes three outlet passages 412 which are in communication with passage 418. The passages 414 in the manifold layer 406 have a flat bottom surface which channels the fluid to the fingers 411, 412. Alternatively, the passage 414 has a slight slope which aids in channeling the fluid to selected fluid passages 411. Alternatively, the inlet passage 414 includes one or more apertures in its bottom surface which allows a portion of the fluid to flow down to the interface layer 402. Similarly, the passage 418 in the manifold layer has a flat bottom surface which contains the fluid and channels the fluid to the port 408. Alternatively, the passage 418 has a slight slope which aids in channeling the fluid to selected outlet ports 408. In addition, the passages 414, 418 have a dimension width of approximately 2 millimeters, although any other width dimensions are alternatively contemplated.

The passages 414, 418 are in communication with ports 408, 409 whereby the ports are coupled to fluid lines in a cooling system. The manifold layer 406 includes horizontally configured fluid ports 408, 409. Alternatively, the manifold layer 406 includes vertically and/or diagonally configured fluid ports 408, 409, as discussed below, although not shown in FIG. 4-7. Alternatively, the manifold layer 406 does not include passage 414. Thus, fluid is directly supplied to the fingers 411 from the ports 408. Again, the manifold layer 411 alternatively does not include passage 418, whereby fluid in the fingers 412 directly flows out of the heat exchanger 400 through ports 409. It is apparent that although two ports 408, 409 are shown in communication with the passages 414, 418, any other number of ports are alternatively utilized.

The inlet passages 411 have dimensions which allow fluid to travel to the interface layer without generating a large pressure drop along the passages 411. The inlet passages 411 have a width dimension in the range of and including 0.25-5.00 millimeters, although any other width dimensions are alternatively contemplated. In addition, the inlet passages 411 have a length dimension in the range of and including 0.5 millimeters to three times the length of the heat source. Alternatively, other length dimensions are contemplated. In addition, as stated above, the inlet passages 411 extend down to or slightly above the height of the microchannels 410 such that the fluid is channeled directly to the microchannels 410. The inlet passages 411 have a height dimension in the range of and including 0.25-5.00 millimeters. It is apparent to one skilled in the art that the passages 411 do not extend down to the microchannels 410 and that any other height dimensions are alternatively contemplated. It is apparent to one skilled in the art that although the inlet passages 411 have the same dimensions, it is contemplated that the inlet passages 411 alternatively have different dimensions. In addition, the inlet passages 411 alternatively have varying widths, cross sectional dimensions and/or distances between adjacent fingers. In particular, the passage 411 has areas with a larger width or depths as well as areas with narrower widths and depths along its length. The varied dimensions allow more fluid to be delivered to predetermined interface hot spot regions in the interface layer 402 through wider portions while restricting flow to warm spot interface hot spot regions through the narrow portions.

In addition, the outlet passages 412 have dimensions which allow fluid to travel to the interface layer without generating a large pressure drop along the passages 412. The outlet passages 412 have a width dimension in the range of and including 0.25-5.00 millimeters, although any other width dimensions are alternatively contemplated. In addition, the outlet passages 412 have a length dimension in the range of and including 0.5 millimeters to three times the length of the heat source. In addition, the outlet passages 412 extend down to the height of the microchannels 410 such that the fluid easily flows upward in the outlet passages 412 after horizontally flowing along the microchannels 410. The inlet passages 411 have a height dimension in the range of and including 0.25-5.00 millimeters, although any other height dimensions are alternatively contemplated. It is apparent to one skilled in the art that although outlet passages 412 have the same dimensions, it is contemplated that the outlet passages 412 alternatively have different dimensions. Again, the inlet passage 412 alternatively have varying widths, cross sectional dimensions and/or distances between adjacent fingers.

The inlet and outlet passages 411, 412 are segmented and distinct from one another, as shown in FIGS. 4 and 5, whereby fluid among the passages do not mix together. In particular, as shown in FIGS. 4 and 5, two outlet passages are located along the outside edges of the manifold layer 406, and one outlet passage 412 is located in the middle of the manifold layer 406. In addition, two inlet passages 411 are configured on adjacent sides of the middle outlet passage 412. This particular configuration causes fluid entering the interface layer 402 to travel a short distance in the interface layer 402 before it flows out of the interface layer 402 through the outlet passage 412. However, it is apparent to one skilled in the art that the inlet passages and outlet passages are positioned in any other appropriate configuration and is thereby not limited to the configuration shown and described in the present disclosure. The number of inlet and outlet fingers 411, 412 are more than three within the manifold layer 406 but less than 10 per centimeter across the manifold layer 406. It is also apparent to one skilled in the art that any other number of inlet passages and outlet passages are used and thereby is not limited to the number shown and described in the present disclosure.

Figure 6A:
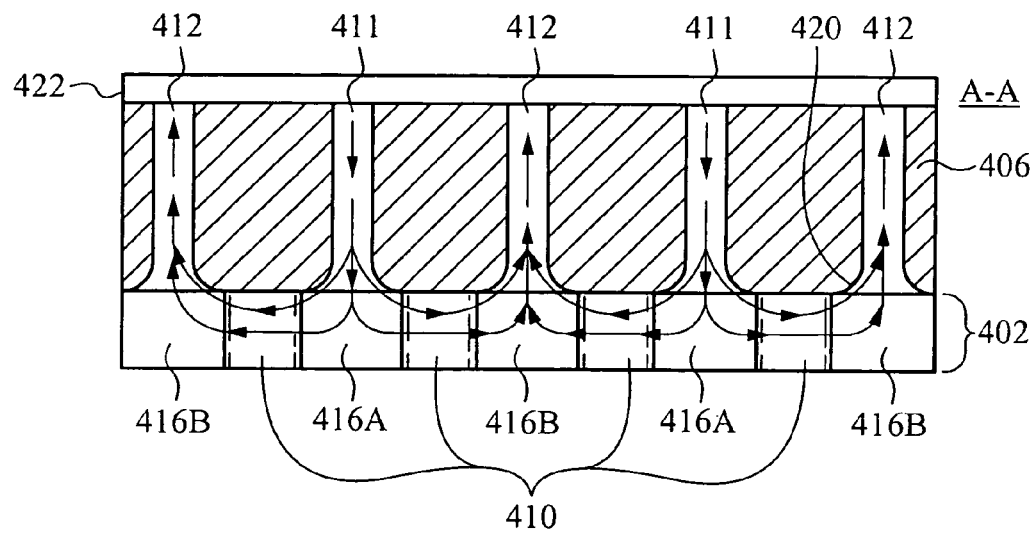
FIG. 6A illustrates a cross-sectional view of the interwoven manifold layer with interface layer of the present invention along lines A-A.
Figure 6B:
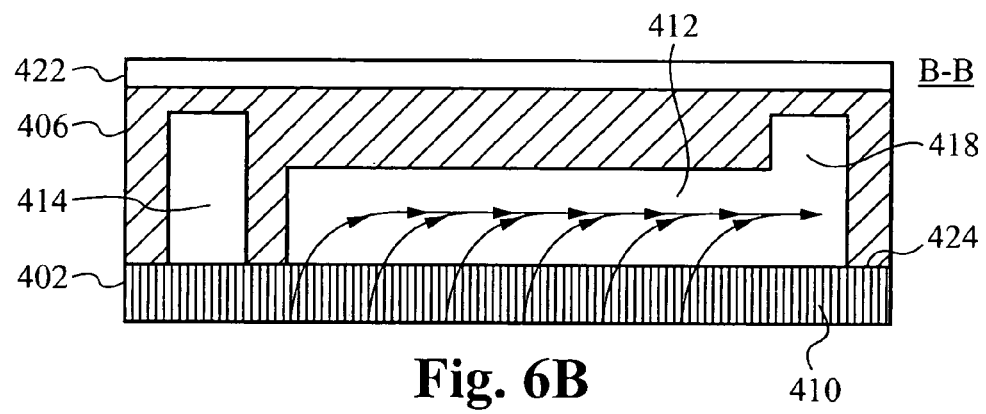
FIG. 6B illustrates a cross-sectional view of the interwoven manifold layer with interface layer of the present invention along lines B-B.
Figure 6C:
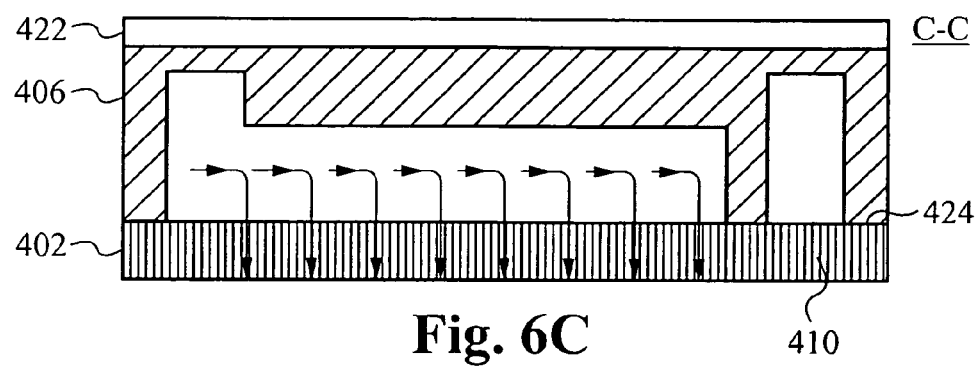
FIG. 6C illustrates a cross-sectional view of the interwoven manifold layer with interface layer of the present invention along lines C-C.
Figure 7A:
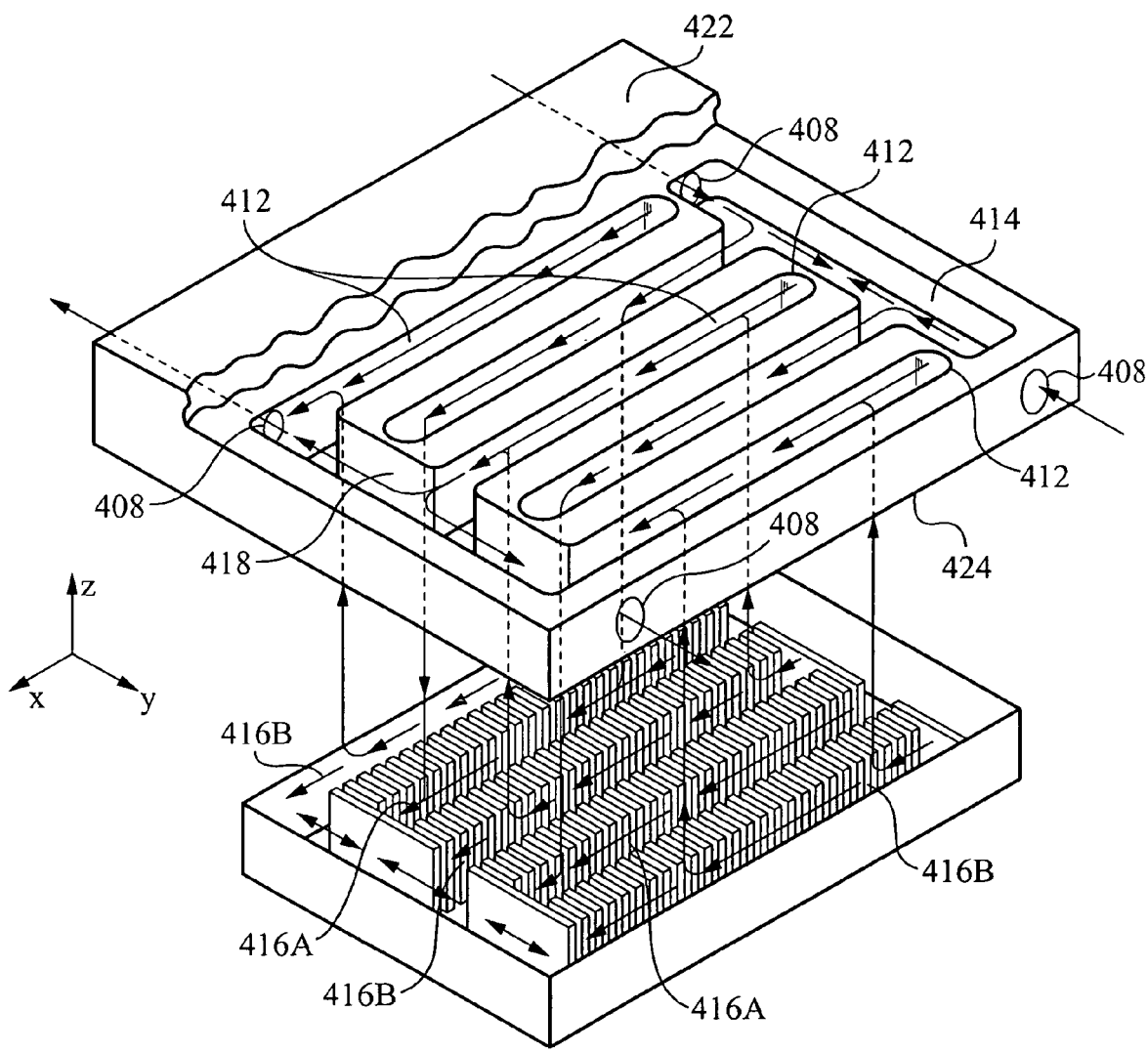
FIG. 7A illustrates an exploded view of the interwoven manifold layer with interface layer of the present invention.

The manifold layer 406 is coupled to the intermediate layer (not shown), whereby the intermediate layer (not shown) is coupled to the interface layer 402 to form a three-tier heat exchanger 400. The intermediate layer discussed herein is referred to above in the embodiment shown in FIG. 3B. The manifold layer 406 is alternatively coupled to the interface layer 402 and positioned above the interface layer 402 to form a two-tier heat exchanger 400, as shown in FIG. 7A. FIGS. 6A-6C illustrate cross-sectional schematics of the alternative manifold layer 406 coupled to the interface layer 402 in the two tier heat exchanger. Specifically, FIG. 6A illustrates the cross section of the heat exchanger 400 along line A-A in FIG. 5. In addition, FIG. 6B illustrates the cross section of the heat exchanger 400 along line B-B and FIG. 6C illustrates the cross section of the heat exchanger 400 along line C-C in FIG. 5. As stated above, the inlet and outlet passages 411, 412 extend from the top surface to the bottom surface of the manifold layer 406. When the manifold layer 406 and the interface layer 402 are coupled to one another, the inlet and outlet passages 411, 412 are at or slightly above the height of the microchannels 410 in the interface layer 402. This configuration causes the fluid from the inlet passages 411 to easily flow from the passages 411 through the microchannels 410. In addition, this configuration causes fluid flowing through the microchannels to easily flow upward through the outlet passages 412 after flowing through the microchannels 410.

In the alternative embodiment, the intermediate layer 104 (FIG. 3B) is positioned between the manifold layer 406 and the interface layer 402, although not shown in the figures. The intermediate layer 104 (FIG. 3B) channels fluid flow to designated interface hot spot regions in the interface layer 402. In addition, the intermediate layer 104 (FIG. 3B) can be utilized to provide a uniform flow of fluid entering the interface layer 402. Also, the intermediate layer 104 is utilized to provide fluid to interface hot spot regions in the interface layer 402 to adequately cool hot spots and create temperature uniformity in the heat source 99. The inlet and outlet passages 411, 412 are positioned near or above hot spots in the heat source 99 to adequately cool the hot spots, although it is not necessary.

FIG. 7A illustrates an exploded view of the alternate manifold layer 406 with the an alternative interface layer 402 of the present invention. The interface layer 402 includes continuous arrangements of microchannel walls 110, as shown in FIG. 3B. In general operation, similar to the manifold layer 106 shown in FIG. 3B, fluid enters the manifold layer 406 at fluid port 408 and travels through the passage 414 and towards the fluid fingers or passages 411. The fluid enters the opening of the inlet fingers 411 and flows the length of the fingers 411 in the X-direction, as shown by the arrows. In addition, the fluid flows downward in the Z direction to the interface layer 402 which is positioned below to the manifold layer 406. As shown in FIG. 7A, the fluid in the interface layer 402 traverses along the bottom surface in the X and Y directions of the interface layer 402 and performs thermal exchange with the heat source 99. The heated fluid exits the interface layer 402 by flowing upward in the Z-direction via the outlet fingers 412, whereby the outlet fingers 412 channel the heated fluid to the passage 418 in the manifold layer 406 in the X-direction. The fluid then flows along the passage 418 and exits the heat exchanger by flowing out through the port 409.

The interface layer, as shown in FIG. 7A, includes a series of grooves 416 disposed in between sets of microchannels 410 which aid in channeling fluid to and from the passages 411, 412. In particular, the grooves 416A are located directly beneath the inlet passages 411 of the alternate manifold layer 406, whereby fluid entering the interface layer 402 via the inlet passages 411 is directly channeled to the microchannels adjacent to the groove 416A. Thus, the grooves 416A allow fluid to be directly channeled into specific designated flow paths from the inlet passages 411, as shown in FIG. 5. Similarly, the interface layer 402 includes grooves 416B which are located directly beneath the outlet passages 412 in the Z-direction. Thus, fluid flowing horizontally along the microchannels 410 toward the outlet passages are channeled horizontally to the grooves 416B and vertically to the outlet passage 412 above the grooves 416B.

FIG. 6A illustrates the cross section of the heat exchanger 400 with manifold layer 406 and interface layer 402. In particular, FIG. 6A shows the inlet passages 411 interwoven with the outlet passages 412, whereby fluid flows down the inlet passages 411 and up the outlet passages 412. In addition, as shown in FIG. 6A, the fluid flows horizontally through the microchannel walls 410 which are disposed between the inlet passages and outlet passages and separated by the grooves 416A, 416B. Alternatively, the microchannel walls are continuous (FIG. 3B) and are not separated by the microchannels 410. As shown in FIG. 6A, either or both of the inlet and outlet passages 411, 412 have a curved surface 420 at their ends at the location near the grooves 416. The curved surface 420 directs fluid flowing down the passage 411 towards the microchannels 410 which are located adjacent to the passage 411. Thus, fluid entering the interface layer 102 is more easily directed toward the microchannels 410 instead of flowing directly to the groove 416A. Similarly, the curved surface 420 in the outlet passages 412 assists in directing fluid from the microchannels 410 to the outer passage 412.

Figure 7B:
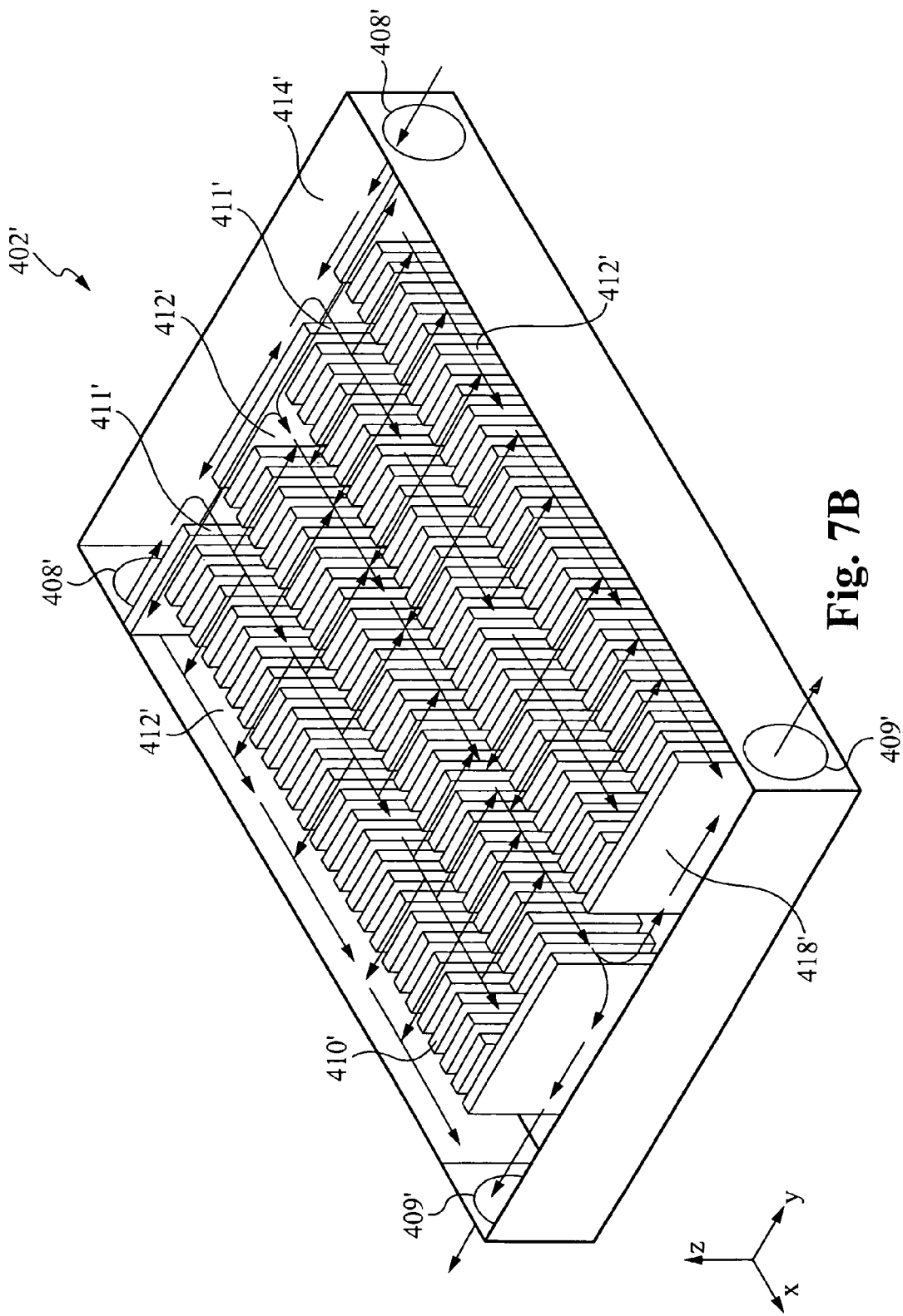
FIG. 7B illustrates a perspective view of an alternative embodiment of the interface layer of the present invention.

In an alternative embodiment, as shown in FIG. 7B, the interface layer 402' includes the inlet passages 411' and outlet passages 412' discussed above with respect to the manifold layer 406 (FIGS. 8-9). In the alternative embodiment, the fluid is supplied directly to the interface layer 402' from the port 408'. The fluid flows along the passage 414' towards the inlet passages 411'. The fluid then traverses laterally along the sets of microchannels 410' and undergoes heat exchange with the heat source (not shown) and flows to the outlet passages 412'. The fluid then flows along the outlet passages 412' to passage 418', whereby the fluid exits the interface layer 402' by via the port 409'. The ports 408', 409' are configured in the interface layer 402' and are alternatively configured in the manifold layer 406 (FIG. 7A).

It is apparent to one skilled in the art that although all of the heat exchangers in the present application are shown to operate horizontally, the heat exchanger alternatively operates in a vertical position. While operating in the vertical position, the heat exchangers are alternatively configured such that each inlet passage is located above an adjacent outlet passage. Therefore, fluid enters the interface layer through the inlet passages and is naturally channeled to an outlet passage. It is also apparent that any other configuration of the manifold layer and interface layer is alternatively used to allow the heat exchanger to operate in a vertical position.

Figure 8A:
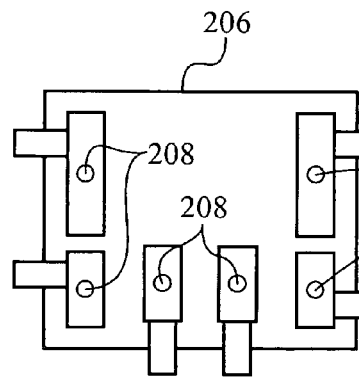
FIG. 8A illustrates a top view diagram of an alternate manifold layer in accordance with the present invention.
Figure 8B:
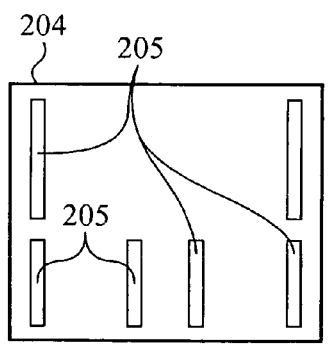
FIG. 8B illustrates a top view diagram of the interface layer in accordance with the present invention.
Figure 8C:
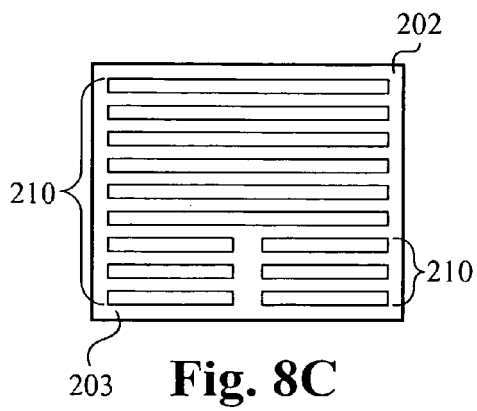
FIG. 8C illustrates a top view diagram of the interface layer in accordance with the present invention.

FIGS. 8A-8C illustrate top view diagrams of another alternate embodiment of the heat exchanger in accordance with the present invention. In particular, FIG. 8A illustrates a top view diagram of an alternate manifold layer 206 in accordance with the present invention. FIGS. 8B and 8C illustrate a top view of an intermediate layer 204 and interface layer 202. In addition, FIG. 9A illustrates a three tier heat exchanger utilizing the alternate manifold layer 206, whereas FIG. 9B illustrates a two-tier heat exchanger utilizing the alternate manifold layer 206.

Figure 9A:
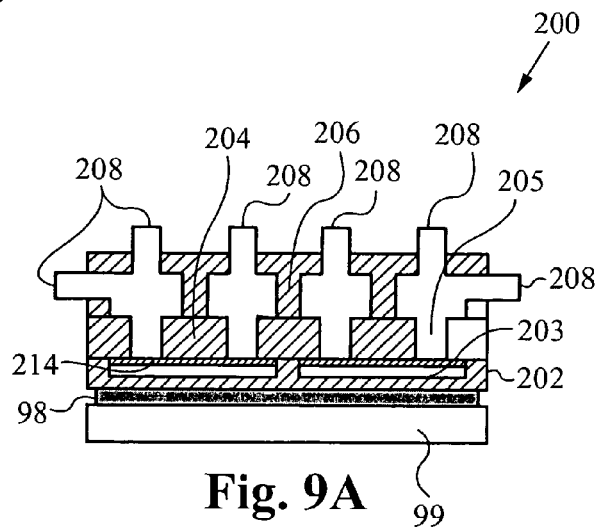
FIG. 9A illustrates a side view diagram of the alternative embodiment of the three tier heat exchanger in accordance with the present invention.
Figure 9B:
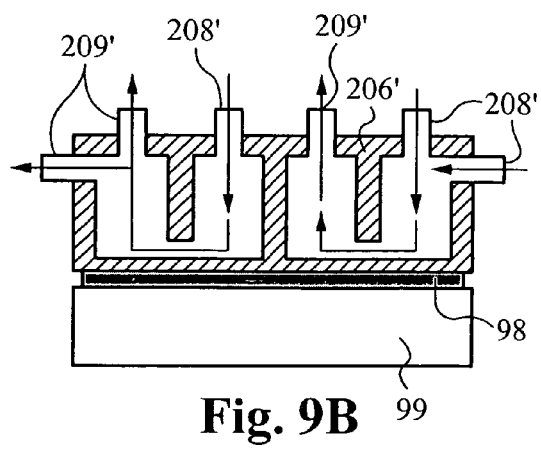
FIG. 9B illustrates a side view diagram of the alternative embodiment of the two tier heat exchanger in accordance with the present invention.

As shown in FIGS. 8A and 9A, the manifold layer 206 includes a plurality of fluid ports 208 configured horizontally and vertically. Alternatively, the fluid ports 208 are positioned diagonally or in any other direction with respect to the manifold layer 206. The fluid ports 208 are placed in selected locations in the manifold layer 206 to effectively deliver fluid to the predetermined interface hot spot regions in the heat exchanger 200. The multiple fluid ports 208 provide a significant advantage, because fluid can be directly delivered from a fluid port to a particular interface hot spot region without significantly adding to the pressure drop to the heat exchanger 200. In addition, the fluid ports 208 are also positioned in the manifold layer 206 to allow fluid in the interface hot spot regions to travel the least amount of distance to the exit port 208 such that the fluid achieves temperature uniformity while maintaining a minimal pressure drop between the inlet and outlet ports 208. Additionally, the use of the manifold layer 206 aids in stabilizing two phase flow within the heat exchanger 200 while evenly distributing uniform flow across the interface layer 202. It should be noted that more than one manifold layer 206 is alternatively included in the heat exchanger 200, whereby one manifold layer 206 routes the fluid into and out-of the heat exchanger 200 and another manifold layer (not shown) controls the rate of fluid circulation to the heat exchanger 200. Alternatively, all of the plurality of manifold layers 206 circulate fluid to selected corresponding interface hot spot regions in the interface layer 202.

The alternate manifold layer 206 has lateral dimensions which closely match the dimensions of the interface layer 202. In addition, the manifold layer 206 has the same dimensions of the heat source 99. Alternatively, the manifold layer 206 is larger than the heat source 99. The vertical dimensions of the manifold layer 206 are within the range of 0.1 and 10 millimeters. In addition, the apertures in the manifold layer 206 which receive the fluid ports 208 are within the range between 1 millimeter and the entire width or length of the heat source 99.

Figure 10A:
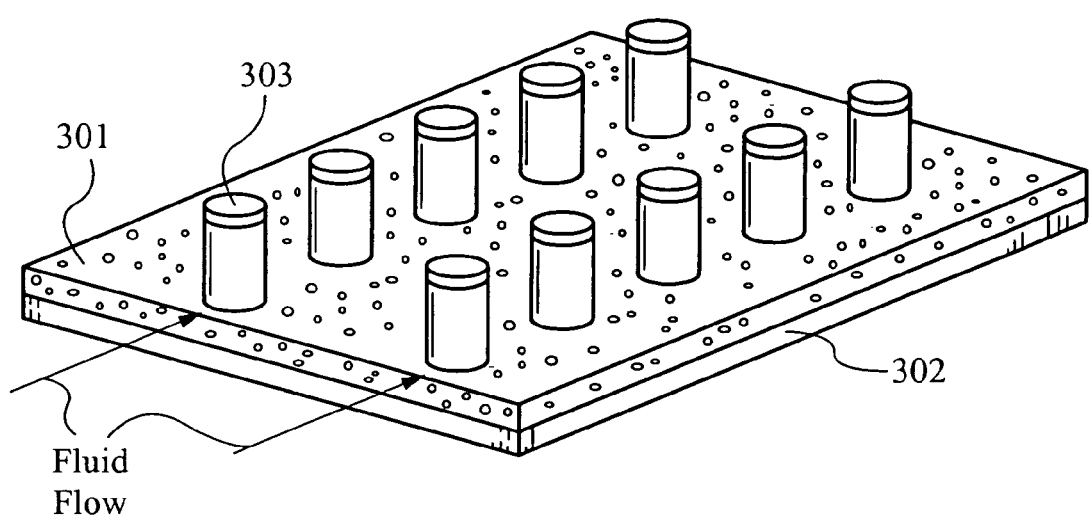
FIGS. 10A-10E illustrate a perspective view of the interface layer having different micro-pin arrays in accordance with the present invention.

FIG. 10A illustrates a perspective view of an embodiment of the interface layer 302 in accordance with the present invention. As shown in FIG. 10A, the interface layer 302 includes a series of pillars 303 which extend upwards from the bottom surface 301 of the interface layer 302. In addition, FIG. 10A illustrates a microporous structure disposed on the bottom surface 301 of the interface layer 302. It is apparent that the interface layer 302 can include only the microporous structure as well as a combination of the microporous structure with any other interface layer feature (e.g. microchannels, pillars, etc.).

Figure 12A:
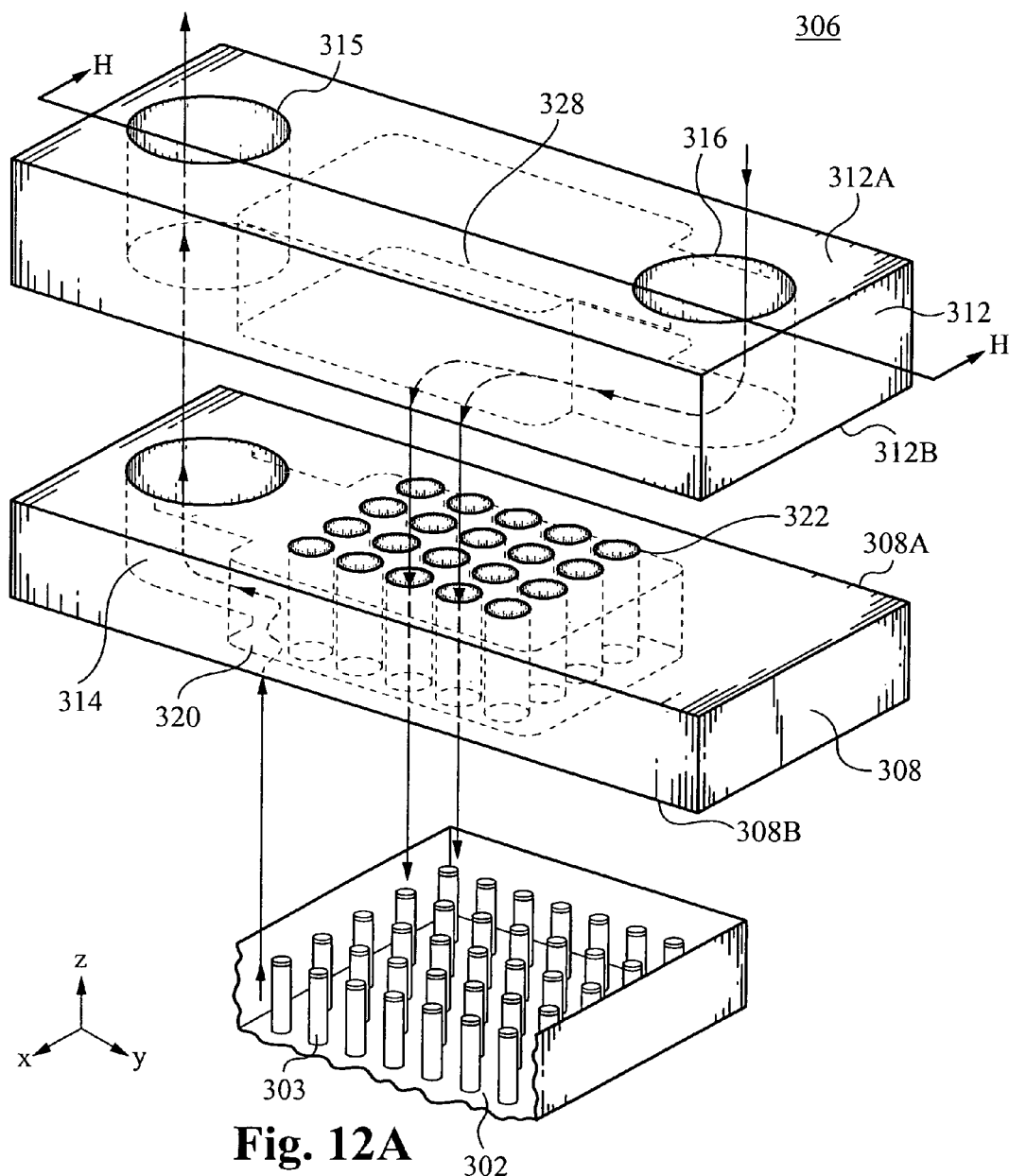
FIG. 12A illustrates an exploded view of a heat exchanger in accordance with the present invention.

The interface layer 302 includes the pillars 303 rather than microchannels due to the flow of the fluid from the inlet apertures to the surrounding outlet apertures in the manifold layer 302 (FIG. 12A). As will be discussed in more detail below, the fluid travels down to the interface layer 302 via a series of inlet apertures, whereby the fluid then exits from the interface layer 302 via a series of outlet apertures which are spaced an optimal distance to the inlet apertures. In other words, the fluid travels away from each inlet aperture toward the closest outlet aperture. In this embodiment, each inlet aperture is surrounded by outlet apertures. Thus, fluid entering the interface layer 302 will flow in the direction toward the surrounding outlet apertures. Accordingly, the pillars 303 in the interface layer 302 accommodate sufficient heat transfer to the fluid as well as allow the fluid to experience the lease amount of pressure drop while flowing from the inlet apertures to the outlet apertures.

Figure 10B:
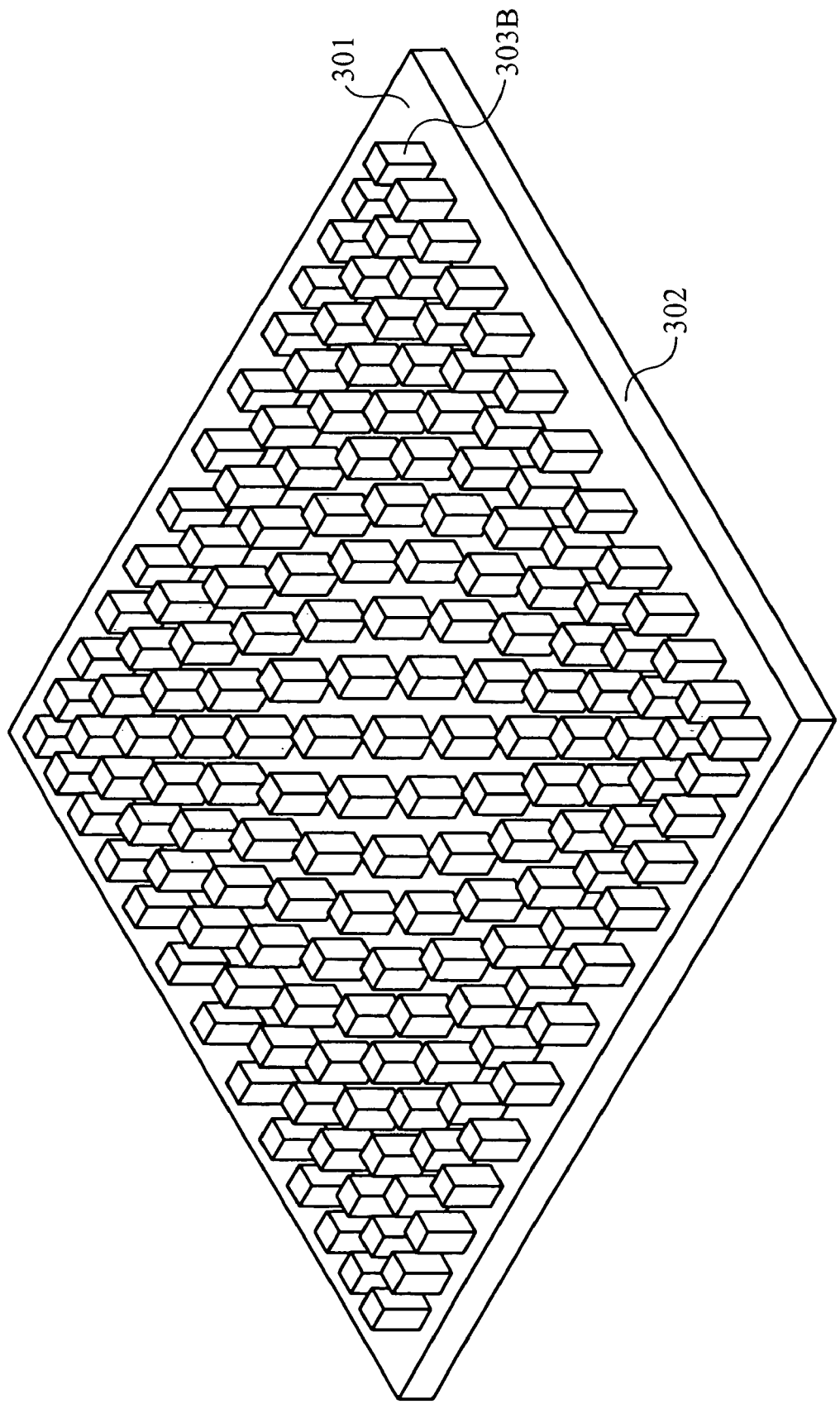

The interface layer 302 includes a dense array of tall, narrow pillars 303 which extend perpendicular from the bottom surface 301 are in contact with the bottom surface of the manifold layer. Alternatively, the pillars 303 are not in contact with the bottom surface of the manifold layer. In addition, at least one of the pillars 303 alternatively extend at an angle with respect to the bottom surface 301 of the interface layer 302. The pillars 303 are also equidistantly spaced from one another along the interface layer 302 such that the heat transfer capabilities of the interface layer 302 are uniform across its bottom surface 301. Alternatively, the pillars 303B are spaced apart non-equidistantly as shown in FIG. 10B, in which the pillars 303B in the middle of the interface layer 302 are spaced further apart than the pillars 303B at the edges. The pillars 303B are spaced apart depending on the dimensions of the heat source 99, and the flow resistance to the fluid as well as the size and locations of the hot spots and the heat flux density from the heat source 99. For instance, a lower density of pillars 303B will offer less resistance to the flow, but will also offer less surface area for heat transfer from the interface layer 302 to the fluid. It should be noted that the configuration of the non-periodically spaced pillars 303B shown in the embodiment in FIG. 10B are not limited thereto and are configured in any other arrangement depending on the conditions of the heat source as well as the desired operation of the cooling system.

Figure 10C:
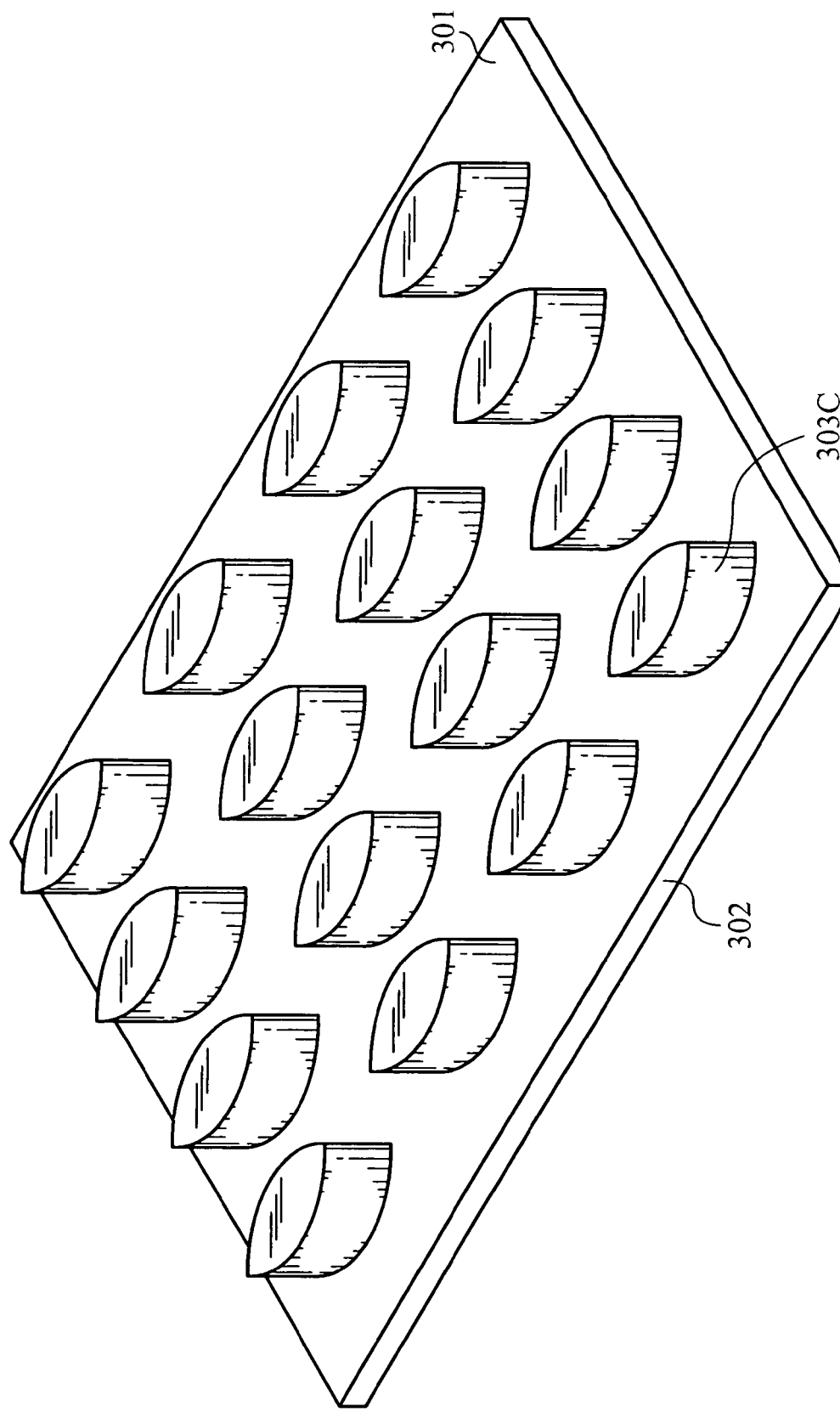
Figure 10D:
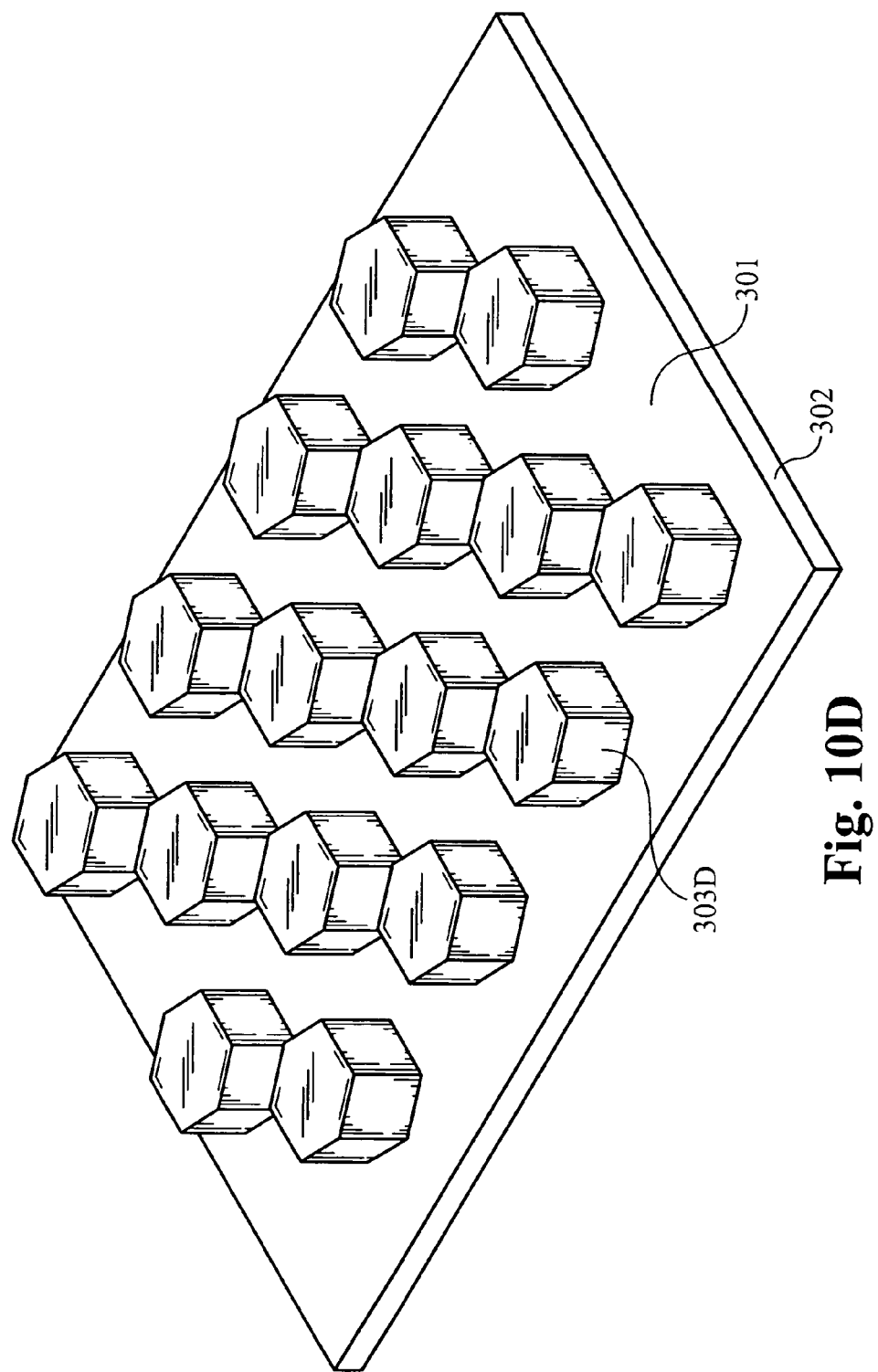

In addition, the pillars 303 are preferably circular cylinders as shown in FIG. 10A to allow the fluid to flow from the inlet apertures to the outlet apertures with least amount of resistance. However, the pillars 303 alternatively have shapes including, but not limited to squared 303B (FIG. 10B), diamond, elliptical 303C (FIG. 10C), hexagonal 303D (FIG. 10D) or any other shape. In addition, the interface layer 302 alternatively has a combination of differently shaped pillars along the bottom surface 301.

Figure 10E:
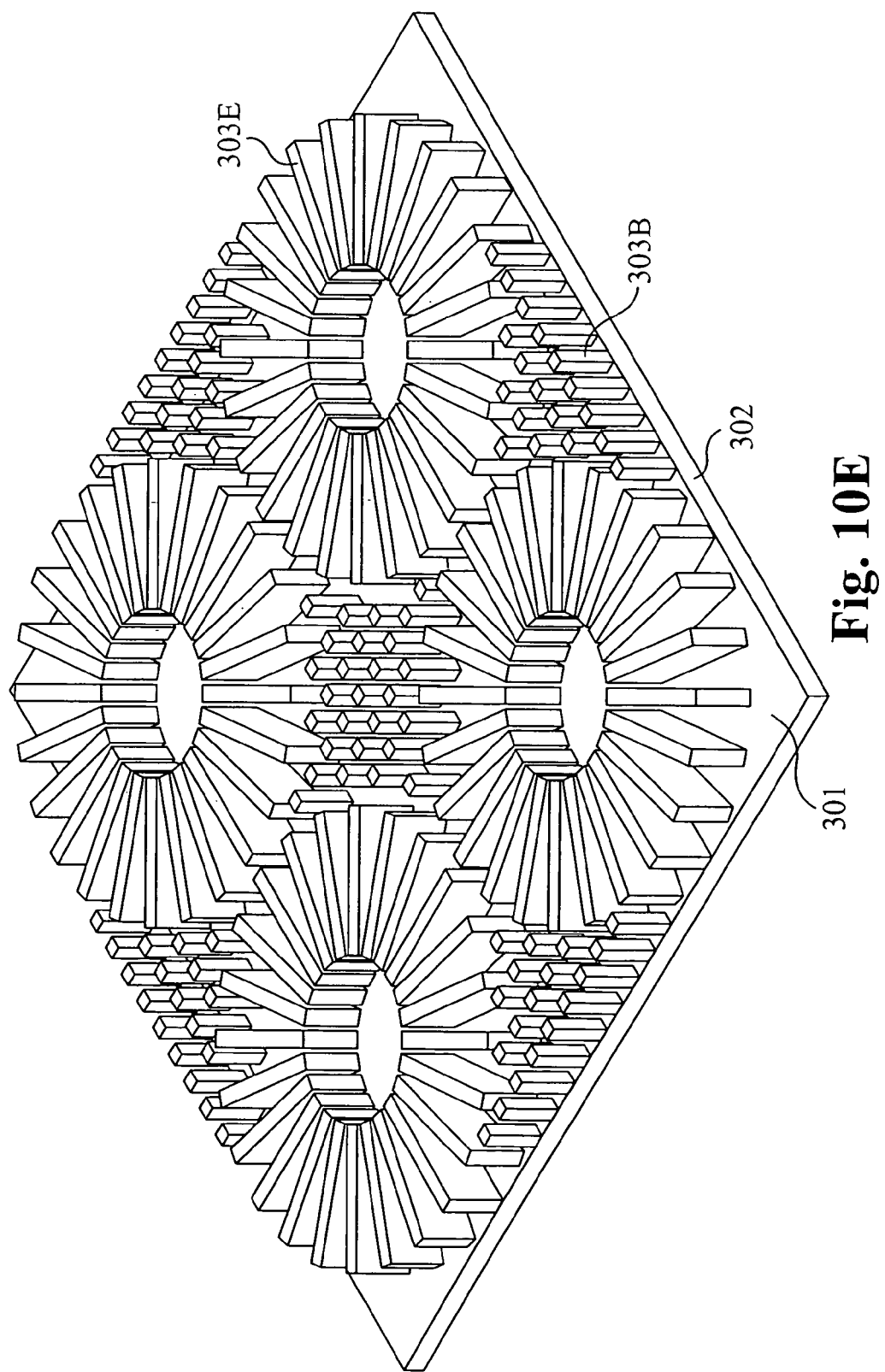

For instance, as shown in FIG. 10E, the interface layer 302 includes several sets of rectangular fins 303E which are radially disposed with respect to one another in their respective set. In addition, the interface layer 302 includes several pillars 303B disposed in between the sets of rectangular fins 303E. In one embodiment, the open circular areas within the radially arranged rectangular fins 303E are placed below each inlet aperture, whereby the fins 303E assist in guiding the flow to the outlet apertures. Thus, the radially distributed fins 303E assist in minimizing the pressure drop while allowing nearly uniform distribution of cooling fluid throughout the interface layer 302. Depending on the size and relative placement of the inlet and outlet apertures, there are many possible configurations of the pillars and/or fins, and the selection of the optimal arrangement of the interface layer 302 depends on whether the fluid undergoes single-phase flow or two-phase flow conditions. It is apparent to one skilled in the art that the various pin 303 configurations can be incorporated with any of the embodiments and variations thereof discussed herein.

Figure 11:
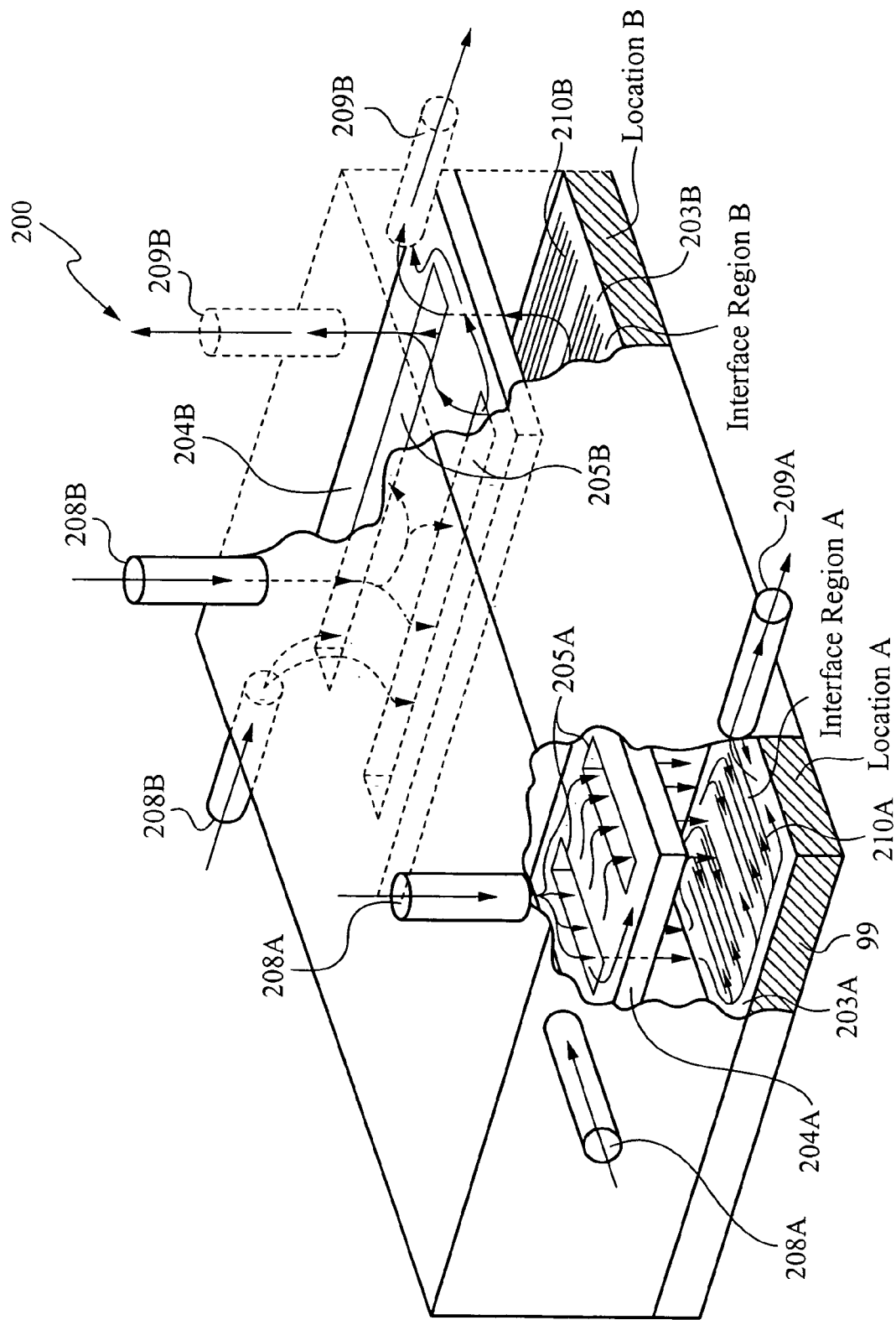
FIG. 11 illustrates a cut-away perspective view diagram of the alternate heat exchanger in accordance with the present invention.

FIG. 11 illustrates a broken-perspective view of a three tier heat exchanger 200 having the alternate manifold layer 206 in accordance with the present invention. As shown in FIG. 11, the heat exchanger 200 is divided into separate regions dependent on the amount of heat produced along the body of the heat source 99. The divided regions are separated by the vertical intermediate layer 204 and/or microchannel wall features 210 in the interface layer 202. However, it is apparent to one skilled in the art that the assembly shown in FIG. 11 is not limited to the configuration shown and is for exemplary purposes. The heat exchanger 200 is coupled to one or more pumps, whereby by one pump is coupled to the inlets 208A and another pump is coupled to the inlet 208B.

As shown in FIG. 3B, the heat source 99 has a hot spot in location A and a warm spot, location B, whereby the hot spot in location A produces more heat than the warm spot in location B. It is apparent that the heat source 99 alternatively has more than one hot spot and warm spot at any location at any given time. In the example, since location A is a hot spot and more heat in location A transfers to the interface layer 202 above location A (designated in FIG. 11 as interface hot spot region A), more fluid and/or a higher rate of liquid flow is provided to interface hot spot region A in the heat exchanger 200 to adequately cool location A. It is apparent that although interface hot spot region B is shown to be larger than interface hot spot region A, interface hot spot regions A and B, as well as any other interface hot spot regions in the heat exchanger 200, can be any size and/or configuration with respect to one another.

Alternatively, as shown in FIG. 11, the fluid enters the heat exchanger via fluid ports 208A is directed to interface hot spot region A by flowing along the intermediate layer 204 to the inflow conduits 205A. The fluid then flows down the inflow conduits 205A in the Z-direction into interface hot spot region A of the interface layer 202. The fluid flows in between the micro channels 210A whereby heat from location A transfers to the fluid by conduction through the interface layer 202. The heated fluid flows along the interface layer 202 in interface hot spot region A toward exit port 209A where the fluid exits the heat exchanger 200. It is apparent to one skilled in the art that any number of inlet ports 208 and exit ports 209 are utilized for a particular interface hot spot region or a set of interface hot spot regions. In addition, although the exit port 209A is shown near the interface layer 202, the exit port 209A is alternatively positioned in any other location vertically, including but not limited to the manifold layer 206.

Similarly, in the example shown in FIG. 11, the heat source 99 has a warm spot in location B which produces less heat than location A of the heat source 99. Fluid entering through the port 208B is directed to interface hot spot region B by flowing along the intermediate layer 204 to the inflow conduits 205B. The fluid then flows down the inflow conduits 205B in the Z-direction into interface hot spot region B of the interface layer 202. The fluid flows in between the microchannels 210 in the X and Y directions, whereby heat generated by the heat source in location B is transferred into the fluid. The heated fluid flows along the entire interface layer 202 in interface hot spot region B upward to exit ports 209B in the Z-direction via the outflow conduits 205B in the intermediate layer 204 whereby the fluid exits the heat exchanger 200.

Alternatively, as shown in FIG. 9A, the heat exchanger 200 alternatively includes a vapor permeable membrane 214 positioned above the interface layer 202. The vapor permeable membrane 214 is in sealable contact with the inner side walls of the heat exchanger 200. The membrane is configured to have several small apertures which allow vapor produced along the interface layer 202 to pass therethrough to the port 209. The membrane 214 is also configured to be hydrophobic to prevent liquid fluid flowing along the interface layer 202 from passing through the apertures of the membrane 214. More details of the vapor permeable membrane 214 is discussed in co-pending U.S. application Ser. No. 10/366,128, filed Feb. 12, 2003 and entitled, "VAPOR ESCAPE MICROCHANNEL HEAT EXCHANGER" which is hereby incorporated by reference.

Figure 12B:
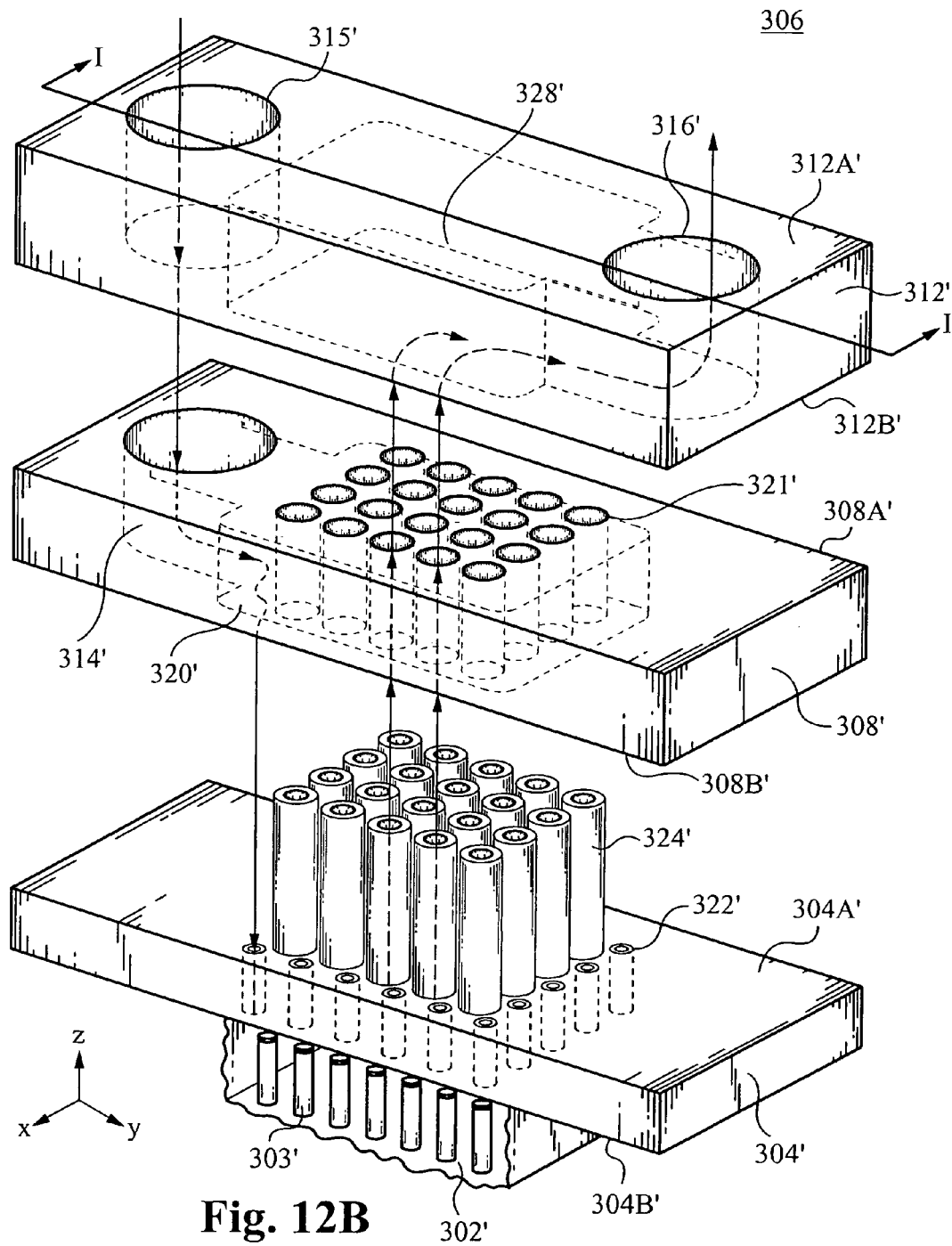
FIG. 12B illustrates an exploded view of an alternative heat exchanger in accordance with the present invention.

FIG. 12A illustrates an exploded view of the heat exchanger 300 in accordance with the present invention. FIG. 12B illustrates an exploded view of an alternative heat exchanger 300' in accordance with the present invention. As shown in FIGS. 12A and 12B, the heat exchanger 300, 300' includes the interface layer 302, 302' and the manifold layer 306, 306' coupled thereto. As stated above, the heat exchanger 300, 300' is coupled to the heat source (not shown) or alternatively fully integrated within the heat source (e.g. embedded in a microprocessor). It is apparent to one skilled in the art that the interface layer 302, 302' is substantially enclosed, and is only shown exposed in FIG. 12A for exemplary purposes only. It is preferred that the interface layer 302, 302' includes a plurality of pillars 303 disposed along the bottom surface 301. In addition, the pillars 303 alternatively has any shape, as discussed in relation to FIGS. 10A-10E and/or radially distributed fins 303E. Again, the interface layer 302 alternatively has any other features as discussed above (e.g. microchannels, roughened surfaces). The interface layer 302 as well as the features within the layer 302 also preferably has the same thermal conductivity characteristics as discussed above and will not be discussed again. Although the interface layer 302 is shown as smaller compared to the manifold layer 306, it is apparent to one skilled in the art that the interface layer 302 and manifold layer 306 can be any other size with respect to each other and the heat source 99. The remaining features of the interface layer 302, 302' has the same characteristics as the interface layers described above and will not be discussed in any more detail.

Generally, the heat exchanger 300 minimizes the pressure drop within the heat exchanger using the delivery channels 322 in the manifold layer 306. The delivery channels 322 are vertically positioned within the manifold layer 306 and vertically provide fluid to the interface layer 302 to reduce the pressure drop in the heat exchanger 300. As stated above, pressure drop is created or increased in the heat exchanger 300 due to fluid flowing along the interface layer in the X and Y directions for a substantial amount of time and/or distance. The manifold layer 306 minimizes the flow in the X and Y directions by vertically forcing the fluid onto the interface layer 302 by the several delivery channels 322. In other words, several individual jets of fluid are applied directly onto the interface layer 302 from above. The delivery channels 322 are positioned an optimal distance from one another to allow fluid to flow minimally in the X and Y directions and vertically upward out of the interface layer 302. Therefore, the force of individual fluid paths from the optimally positioned channels 322 naturally cause the fluid to flow in an upward fluid path away from the interface layer 302. In addition, the individual channels 322 maximize the division of fluid flow among the several channels 322 in the interface layer 302, thereby reducing the pressure drop in the heat exchanger 300 while effectively cooling the heat source 99. In addition, the configuration of the heat exchanger 300 allows the heat exchanger 300 to be smaller in size than other heat exchangers, because fluid does not need to travel a large amount of distance in the lateral X and Y directions to adequately cool the heat source 99.

The manifold layer 306 shown in FIG. 12A includes two individual levels. In particular, the manifold layer 306 includes a level 308 and a level 312. The level 308 is coupled to the interface layer 302 and the level 312. Although FIG. 12A illustrates that the level 312 is positioned above the level 308, it is contemplated by one skilled in the art that the level 308 is alternatively positioned above the level 312. It is also apparent to one skilled in the art that any number of levels are alternatively implemented in accordance with the present invention.

The alternative manifold layer 306' shown in FIG. 12B includes three individual levels. In particular, the manifold layer 306' includes a circulation level 304', a level 308' and a level 312'. The circulation level 304' is coupled to the interface layer 302' as well as the level 308'. The level 308' is coupled to the circulation level 304' and the level 312'. Although FIG. 12B illustrates that the level 312' positioned above the level 308', it is contemplated by one skilled in the art that the level 308' is alternatively positioned above the level 312'. It is also apparent to one skilled in the art that any number of levels are alternatively implemented in accordance with the present invention.

Figure 12C:
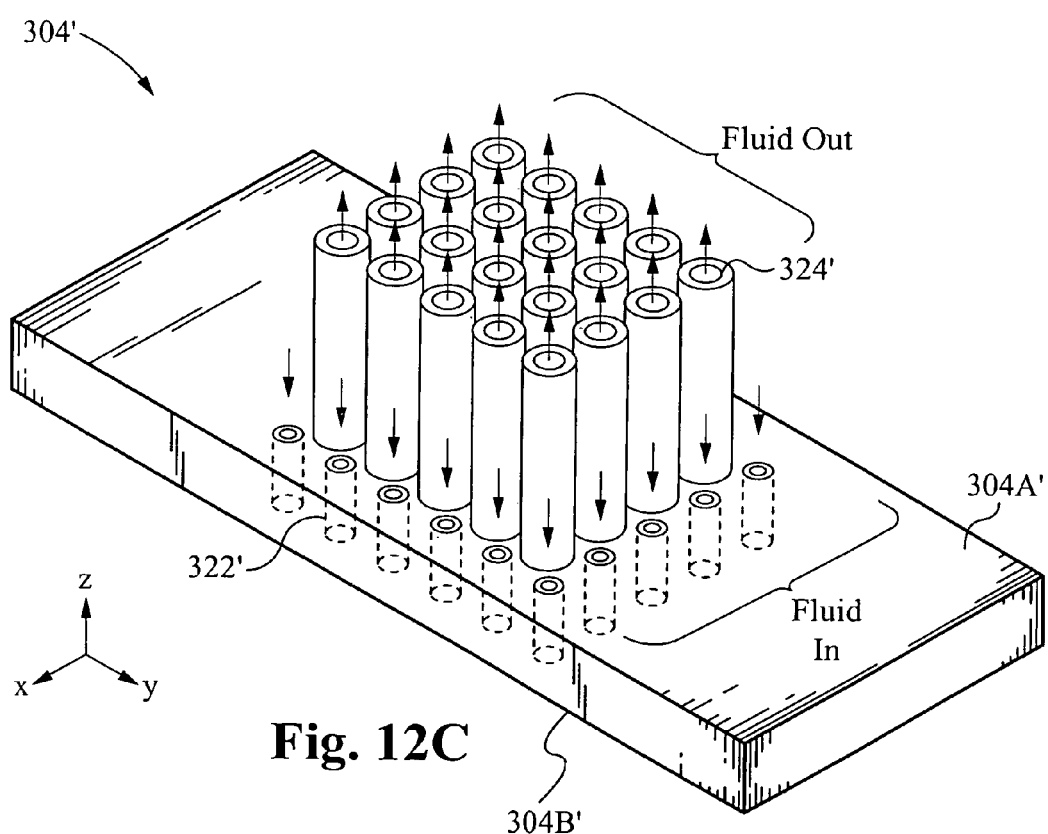
FIG. 12C illustrates a perspective view of the alternative circulation level in accordance with the present invention.

FIG. 12C illustrates a perspective view of the circulation level 304' in accordance with the present invention. The circulation level 304' includes a top surface 304A' and a bottom surface 304B'. As shown in FIGS. 12B and 12C, the circulation level 304' includes several apertures 322' which extend therethrough. In one embodiment, the openings of the apertures 322' are flush with the bottom surface 304B'. Alternatively, the apertures 322' extend beyond the bottom surface 304B' to apply fluid closer to the interface layer 302'. In addition, the circulation level 304' includes several apertures 324' which extend therethrough from the top surface 304A' to the bottom surface 304B' as well as protrude vertically as cylindrical protrusions in the Z-direction a predetermined distance. It is apparent to one skilled in the art that the apertures 322', 324' alternatively extend at an angle through the circulation level and do not need to be completely vertical. As stated above, in one embodiment, the interface layer 302' (FIG. 12B) is coupled to the bottom surface 304B' of the circulation level 304'. Thus, fluid enters the interface layer 302' by flowing only through the apertures 322' in the Z-direction and exits the interface layer 302' by flowing only through the apertures 324' in the Z-direction. As discussed below, fluid entering the interface layer 302' via the apertures 322' is kept separate from fluid exiting the interface layer 302' via the apertures 324' through the circulation level 304'.

Figure 12D:
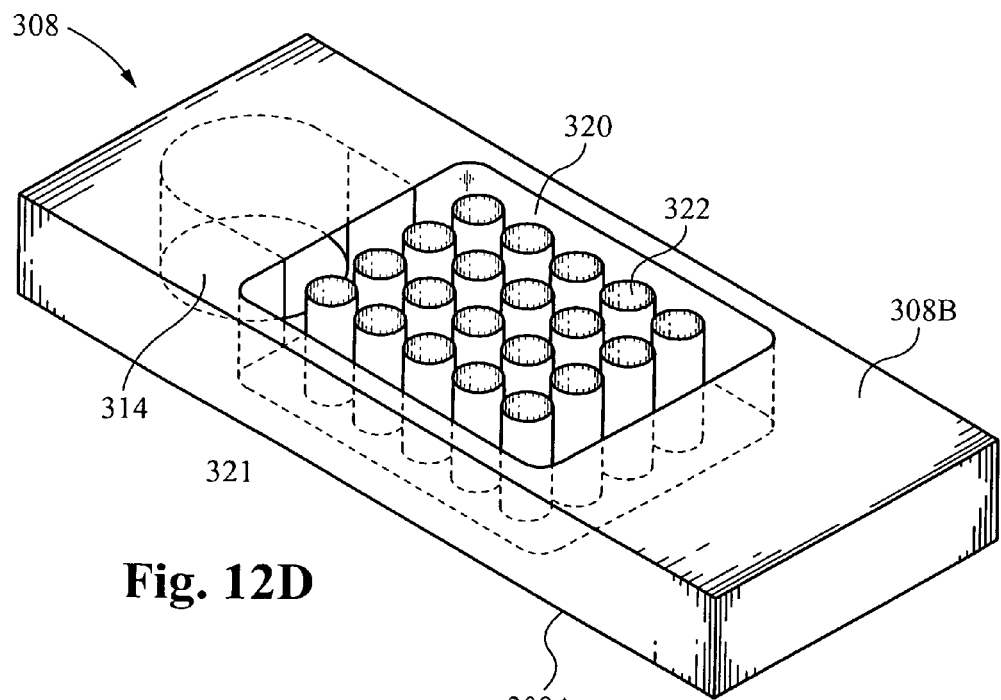
FIG. 12D illustrates a perspective view of the underside of an inlet level in accordance with the present invention.
Figure 12E:
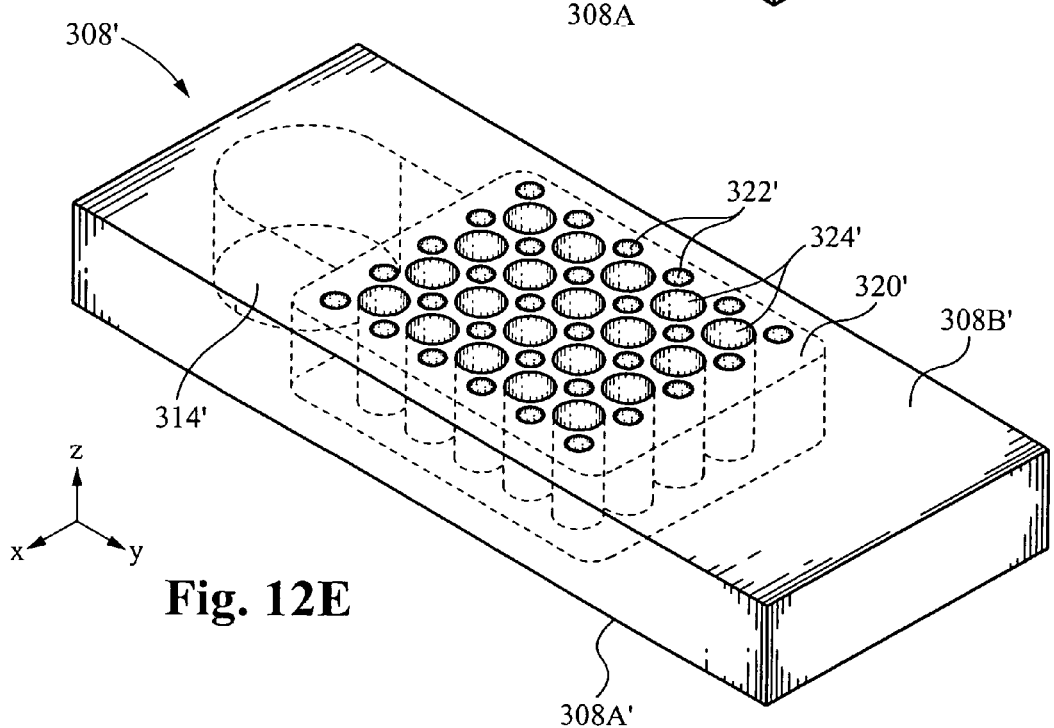
FIG. 12E illustrates a perspective view of the underside of an alternative inlet level in accordance with the present invention.
Figure 12F:
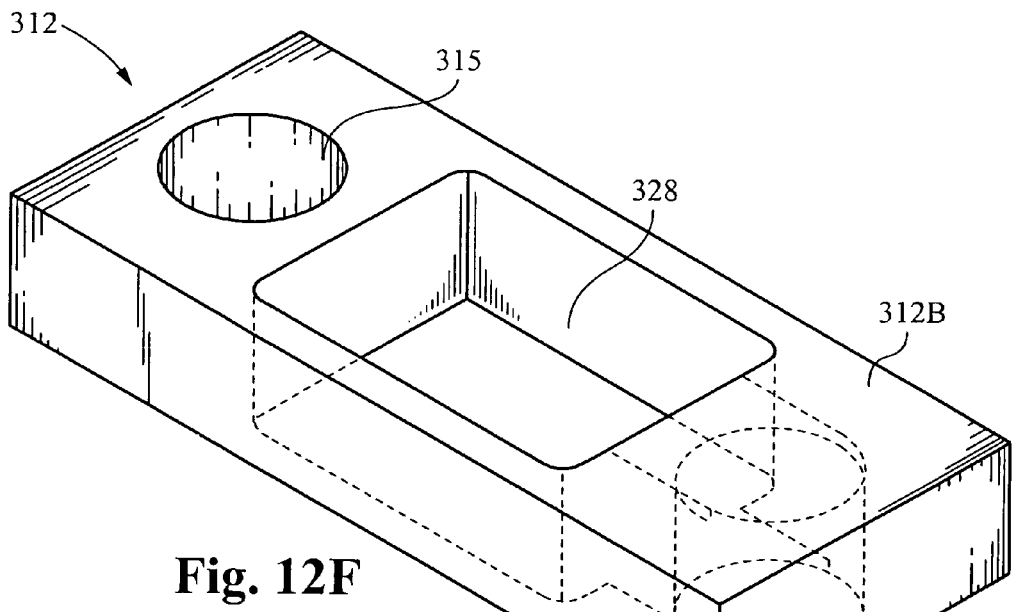
FIG. 12F illustrates a perspective view of the underside of an outlet level in accordance with the present invention.
Figure 12G:
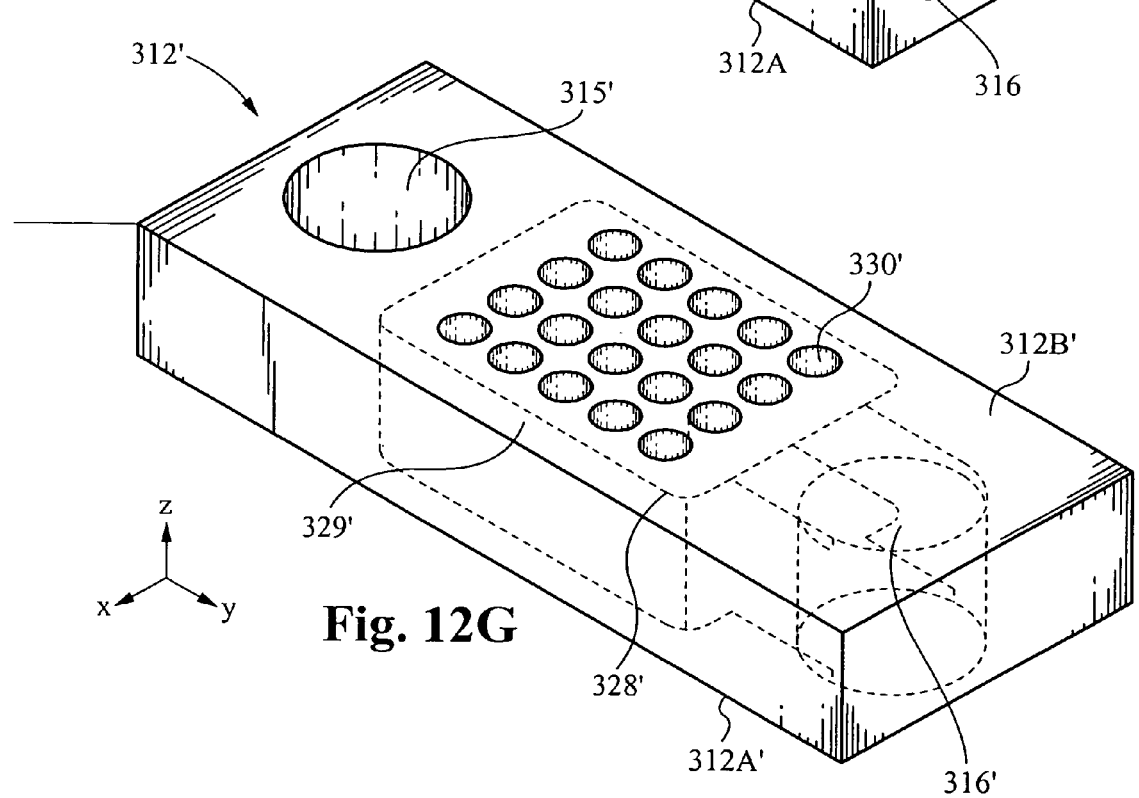
FIG. 12G illustrates a perspective view of the underside of an alternative outlet level in accordance with the present invention.

As shown in FIG. 12C, a portion of the apertures 324' preferably have cylindrical members extending from the top surface 304A' in the Z-direction from the circulation level 304', such that fluid flows through the apertures 324' directly to the corridor 326' in the level 312' (FIGS. 12F and 12G). Preferably, the cylindrical protrusions are circular as in FIG. 12C, but alternatively has any other shape. Along the interface layer 302', however, the fluid flows from each aperture 322' to the adjacent apertures 324' in the lateral and vertical directions. It is preferred that the apertures 322' and the apertures 324' are thermally insulated from one another so that heat from the heated fluid exiting the interface layer 302' through the manifold layer 306' does not propagate to the cooled fluid flowing to the interface layer 302' through the manifold layer 306'.

FIG. 12D illustrates an embodiment of the level 308 in accordance with the present invention. As shown in FIG. 12D, the level 308 includes a top surface 308A and a bottom surface 308B. Preferably, the bottom surface 308B of the level 308 is coupled directly to the interface layer 302, as shown in FIG. 12A. The level 308 includes a recessed corridor 320 which includes several fluid delivery channels 322 which preferably deliver fluid to the interface layer 302. The recessed corridor 320 is in sealable contact with the interface layer 302, wherein fluid exiting the interface layer 302 flows around and between the channels 322 in the corridor 320 and out through the port 314. It should be noted that fluid exiting the interface layer 302 does not enter the delivery channels 322.

FIG. 12E illustrates a perspective view of the underside of alternative embodiment of the level 308' in accordance with the present invention. The level 308' includes a top surface 308A' and a bottom surface 308B', whereby the bottom surface of the level 308B' is coupled directly to the circulation level 304' (FIG. 12C). The level 308' preferably includes a port 314', a corridor 320' and a plurality of apertures 322', 324' in the bottom surface 308B'. It is apparent to one skilled in the art that the level 308' includes any number of ports and corridors. The apertures 322', 324' in FIG. 12E are configured to face the circulation level 304'. In particular, as shown in FIG. 12E, the apertures 322' direct fluid entering the corridor 320' to flow into the interface layer 302', whereas the apertures 324' direct fluid from the interface layer 302' to flow to the level 312'. The apertures 324' extend completely through the corridor 320' in the level 308'. The apertures 324' are individualized and separated, such that fluid flowing through the apertures 324' does not mix or come into contact with the fluid flowing through the cylinders associated with the apertures 324'. The apertures 324' are also individualized to ensure that fluid entering through each aperture 324' flows along the fluid path provided by the aperture 324'. Preferably, the apertures 324' are vertically configured. Therefore, the fluid is channeled vertically through a substantial portion of the manifold layer 306'. It is apparent that the same applies to the apertures 322', especially in the case in which the level is positioned between the interface layer and the level.

Although the apertures or holes 322 are shown as having the same size, the apertures 322 can have different or varying diameters along a length. For instance, the holes 322 closer to the port 314 can have a smaller diameter to restrict fluid flow therethrough. The smaller holes 322 thus force the fluid to flow down the apertures 322 which are further away from the port 314. This variation in the diameters in the holes 322 allow a more uniform distribution of fluid into the interface layer 302. It is apparent to one skilled in the art that the hole 322 diameters are alternatively varied to address cooling in known interface hot spot regions in the interface layer 302. It is apparent to one skilled in the art that the above discussion is applicable to the apertures 324', whereby the dimensions of the apertures 324' vary or are different to accommodate uniform outflow from the interface layer 302.

In one embodiment, the port 314 provides fluid to the level 308 and to the interface layer 302. The port 314 in FIG. 12D preferably extends from the top surface 308A through a portion of the body of the level 308 to the corridor 320. Alternatively, the port 314 extends to the corridor 320 from the side or the bottom of the level 308. It is preferred that the port 314 is coupled to the port 315 in the level 312 (FIGS. 12A-12B). The port 314 leads to the corridor 320 which is enclosed, as shown in FIG. 12C, or recessed, as in FIG. 12D. The corridor 320 preferably serves to channel fluid to the port 314 from the interface layer 302. The corridor 320 alternatively channels fluid from the port 314 to the interface layer 302.

As shown in FIGS. 12F and 12G, the port 315 in the level 312 is preferably aligned with and in communication with the port 314. In relation to FIG. 12A, fluid preferably enters the heat exchanger 300 via port 316 and flows through the corridor 328 down to the delivery channels 322 in the level 308 eventually to the interface layer 302. In relation to FIG. 12B, fluid alternatively enters the heat exchanger 300' preferably enters via the port 315' and flows through the port 314' in the level 308' and eventually to the interface layer 302'. The port 315 in FIG. 12F preferably extends from the top surface 312A through the body of the level 312. Alternatively, the port 315 extends from a side of the level 312. Alternatively, the level 312 does not include the port 315, whereby the fluid enters the heat exchanger 300 via the port 314 (FIGS. 12D and 12E). In addition, the level 312 includes a port 316 which preferably channels the fluid to the corridor 328'. It is apparent to one skilled in the art that the level includes any number of ports and corridors. The corridor 328 preferably channels fluid to the delivery channels 322 and eventually to the interface layer 302.

FIG. 12G illustrates a perspective underside view of an alternative embodiment of the level 312' in accordance with the present invention. The level 312' is preferably coupled to the level 308' in FIG. 12G. As shown in FIG. 12F, the level 312' includes a recessed corridor area 328' within the body which is exposed along the bottom surface 312B'. The recessed corridor 328' is in communication with the port 316', whereby fluid travels directly from the recessed corridor 328' to the port 316'. The recessed corridor 328' is positioned above the top surface 308A' of the level 308' to allow fluid to freely travel upward from the apertures 324' to the corridor 328'. The perimeter of the recessed corridor 320' and bottom surface 312B' is sealed against the top surface 308A' of the level 312' such that all of the fluid from the apertures 324' flows to the port 316' via the corridor 328'. Each of the apertures 330' in the bottom surface 312B' is aligned with and in communication with a corresponding aperture 321' in the level 308' (FIG. 12E), whereby the apertures 330' are positioned flush with the top surface 308A' of the level 308' (FIG. 12E). Alternatively, the apertures 330 have a diameter slightly larger than the diameter of the corresponding aperture 324', whereby the apertures 324' extend through the apertures 330' into the corridor 328'.

Figure 12H:
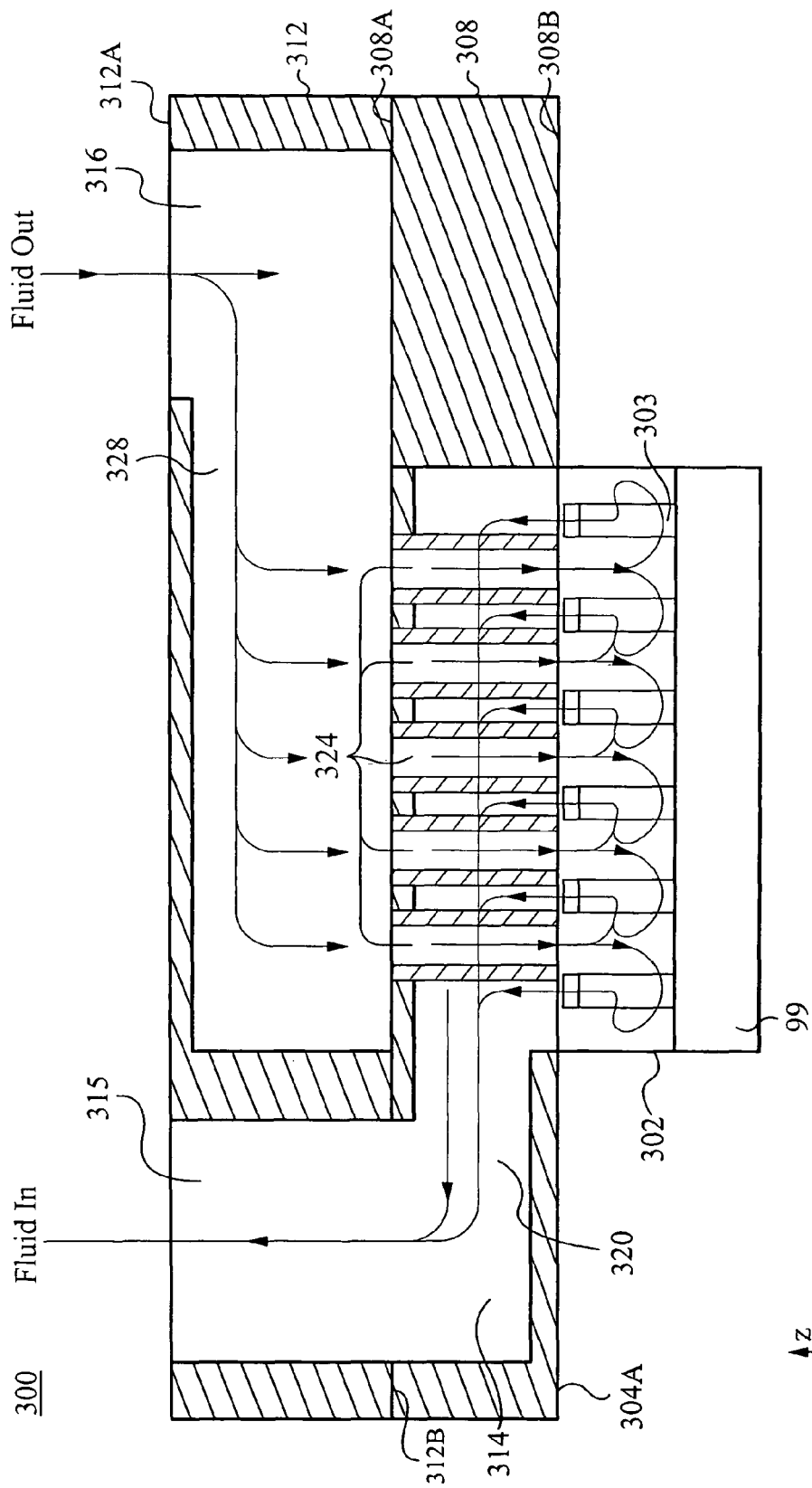
FIG. 12H illustrates a cross sectional view of a heat exchanger in accordance with the present invention.

FIG. 12H illustrates a cross sectional view of the heat exchanger in FIG. 12A along lines H-H in accordance with the present invention. As shown in FIG. 12H, the interface layer 302 is coupled to a heat source 99. As stated above, the heat exchanger 300 is alternatively integrally formed with the heat source 99 as one component. The interface layer 302 is coupled to the bottom surface 308B' of the level 308. In addition, the level 312 is preferably coupled to the level 308, whereby the top surface 308A of the level 308 is sealed against the bottom surface 312B of the level 312. The perimeter of the corridor 320 of the level 308 is in communication with the interface layer 302. In addition, the corridor 328 in the level 312 is in communication with the apertures 322 in the level 308. The bottom surface 312B of the level 312 is sealed against the top surface 308A of the level 308 such that fluid does not leak between the two levels 308, 312.

Figure 12I:
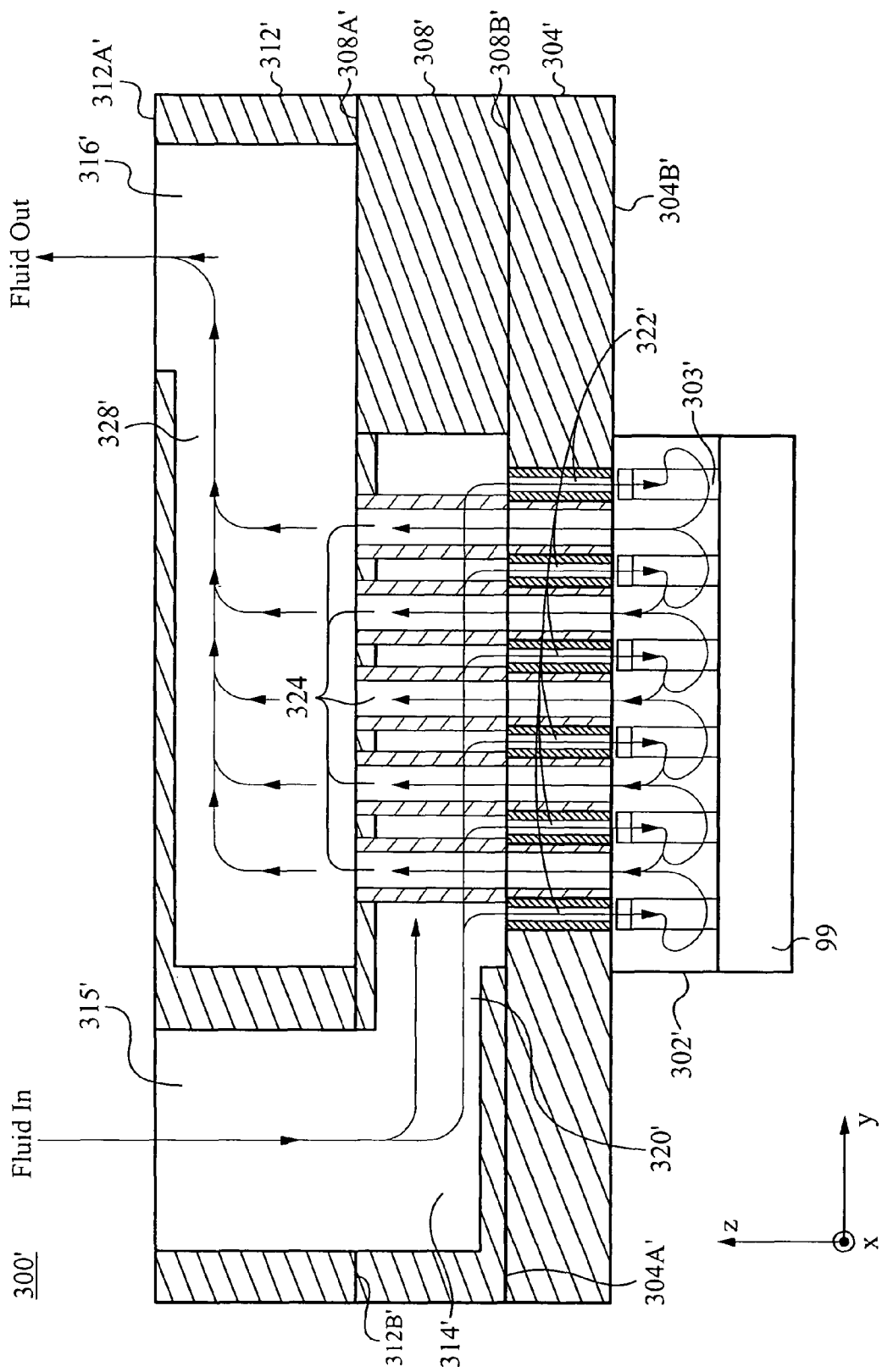
FIG. 12I illustrates a cross sectional view of the alternative heat exchanger in accordance with the present invention.

FIG. 12I illustrates a cross sectional view of the alternative heat exchanger in FIG. 12B along lines I-I in accordance with the present invention. As shown in FIG. 12I, the interface layer 302' is coupled to a heat source 99'. The interface layer 302' is coupled to the bottom surface 304B' of the circulation level 304'. Also, the circulation level 304 is coupled to the level 308', whereby the top surface 304A' of the circulation level 304' is sealed against the bottom surface 308B' of the level 308'. In addition, the level 312' is preferably coupled to the level 308', whereby the top surface 308A' of the level 308' is sealed against the bottom surface 312B' of the level 312'. The perimeter of the corridor 320' of the level 308' is in communication with the apertures in the top surface 304A' of the circulation level 304' such that fluid does not leak between the two levels. In addition, the perimeter of the corridor 328' in the level 312' is in communication with the apertures in the top surface 308A' of the circulation level 308' such that fluid does not leak between the two levels.

In operation, as shown by the arrows in FIGS. 12A and 12H, cooled fluid enters the heat exchanger 300 through the port 316 in the level 312'. The cooled fluid travels down the port 316 to the corridor 328 and flows downward to the interface layer 302 via the delivery channels 322. The cooled fluid in the corridor 320 does not mix or come into contact with any heated fluid exiting the heat exchanger 300. The fluid entering the interface layer 302 undergoes thermal exchange with and absorbs the heat produced in the heat source 99. The apertures 322 are optimally arranged such that the fluid travels the least amount of distance in the X and Y direction in the interface layer 302 to minimize the pressure drop in the heat exchanger 300 while effectively cooling the heat source 99. The heated fluid then travels upward in the Z-direction from the interface layer 302 to the corridor 320 in the level 308. The heated fluid exiting the manifold layer 306 does not mix or come into contact with any cooled fluid entering the manifold layer 306. The heated fluid, upon entering the corridor 320 flows to the ports 314 and 315 and exits the heat exchanger 300. It is apparent to one skilled in the art that the fluid alternatively flows opposite the way shown in FIGS. 12A and 12H without departing from the scope of the present invention.

In the alternative operation, as shown by the arrows in FIGS. 12B and 12I, cooled fluid enters the heat exchanger 300' through the port 316' in the level 312'. The cooled fluid travels down the port 315' to the port 314' in the level 308'. The fluid then flows into the corridor 320' and flows downward to the interface layer 302' via the apertures 322' in the circulation level 304'. However, the cooled fluid in the corridor 320' does not mix or come into contact with any heated fluid exiting the heat exchanger 300'. The fluid entering the interface layer 302' undergoes thermal exchange with and absorbs the heat produced in the heat source 99. As discussed below, the apertures 322' and apertures 324' are arranged such that the fluid travels the optimal closest distance along the interface layer 302' from each aperture 322' to an adjacent aperture 324' to reduce the pressure drop therebetween while effectively cooling the heat source 99. The heated fluid then travels upward in the Z-direction from the interface layer 302' through the level 308' via the several apertures 324' to the corridor 328' in the level 312'. The heated fluid does not mix or come into contact with any cooled fluid entering the manifold layer 306' as it travels up the apertures 324'. The heated fluid, upon entering the corridor 328' in the level 312' flows to the port 316' and exits the heat exchanger 300'. It is apparent to one skilled in the art that the fluid alternatively flows opposite the way shown in FIGS. 12B and 12I without departing from the scope of the present invention.

In the manifold layer 306, the apertures 322 are arranged such that the distance which the fluid flows in the interface layer 302 is minimized while adequately cooling the heat source 99. In the alternative manifold layer 306', the apertures 322' and apertures 324' are arranged such that the distance which the fluid flows in the interface layer 302' is minimized while adequately cooling the heat source 99. Specifically, the and apertures 322', 324' provide substantially vertical fluid paths, such that the flow is minimize in the X and Y lateral directions in the heat exchanger 300'. Thus, the heat exchanger 300, 300' greatly reduces the distance that the fluid must flow to adequately cool the heat source 99, which in turn, greatly reduces the pressure drop generated within the heat exchanger 300, 300'.

The specific arrangement and cross-sectional sizes of the apertures 322 and/or apertures 324 depend on a variety of factors, including, but not limited to, flow conditions, temperature, heat generated by the heat source 99 and fluid flow-rate. It is noted that although the following discussion relates to apertures 322 and 324, it is apparent that the discussion also applies to only apertures 322 or apertures 324.

The apertures 322, 324 are spaced apart from each other an optimal distance whereby the pressure drop is minimized as the heat source 99 is adequately cooled to a desired temperature. The arrangement and optimal distance of the apertures 322 and/or apertures 324 in this embodiment also allows independent optimization of the apertures 322, 324 and fluid paths, in general, through the interface layer 302 by changing the dimensions and locations of the individual apertures. In addition, the arrangement of the apertures in this embodiment also significantly increases the division of total flow entering the interface layer as well as the amount of area cooled by the fluid entering through each aperture 322.

Figure 13:
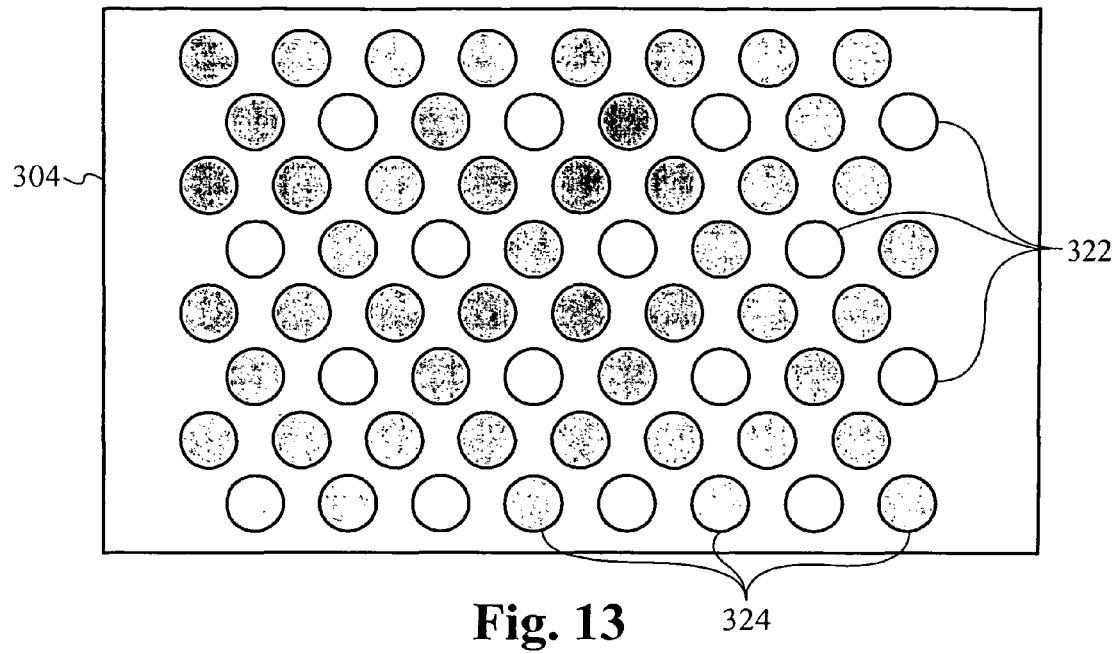
FIG. 13 illustrates a top view of the circulation level having an arrangement of inlet and outlet apertures for single phase fluid flow in accordance with the present invention.
Figure 14:
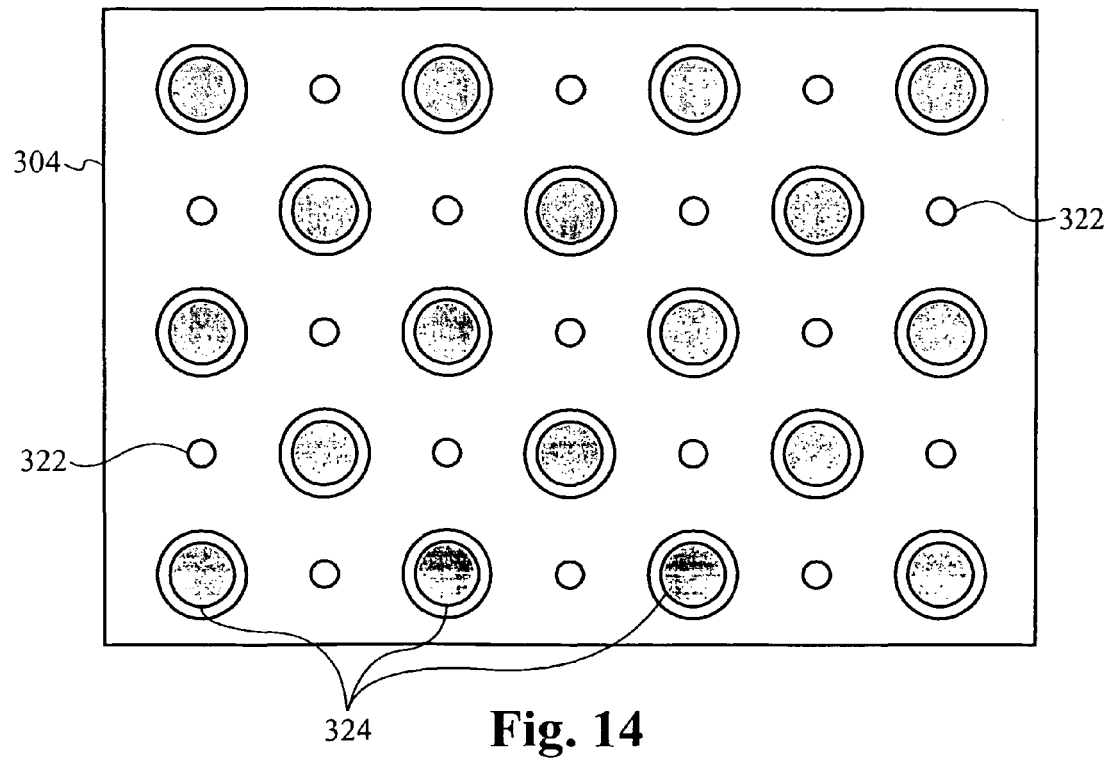
FIG. 14 illustrates a top view of the circulation level having an arrangement of inlet and outlet apertures for two phase fluid flow in accordance with the present invention.

In one embodiment, the apertures 322, 324 are disposed in an alternating configuration or a 'checkerboard' pattern in the manifold layer 306, as shown in FIGS. 13 and 14. Each of the apertures 322, 324 are separated by the least amount of distance that the fluid must travel in the checkerboard pattern. However, the apertures 322, 324 must be separated a distance large enough from each other to provide the cooling liquid to the interface layer 302 for a sufficient amount of time. As shown in FIGS. 13 and 14, it is preferred that one or more of the apertures 322 are disposed adjacent to a corresponding number of apertures or vice versa such that the fluid entering the interface layer 302 travels the least amount of distance along the interface layer 302 before exiting the interface layer 302. Thus, as shown in the figures, it is preferred that the apertures 322, 324 are radially distributed around each other to assist the fluid in traveling the least amount of distance from any aperture 322 to the closest aperture 324. For example, as shown in FIG. 13, fluid entering the interface layer 302 via one specific aperture 322 experiences the path of least resistance to an adjacent aperture 324. In addition, the apertures 322, 324 are preferably circular in shape, although the apertures can have any other shape.

In addition, as stated above, although the apertures 324 shown in the figures protrude from the circulation level 304 or level 308, 312 as a cylindrical member, the apertures alternatively do not protrude from any of the levels in the manifold layer 306. It is also preferred that the manifold layer 306 has rounded surfaces around the areas where fluid changes direction to aid in reducing the pressure drop in the heat exchanger 300.

The optimal distance configuration as well as the dimensions of the apertures 322, 324 depend on the amount of temperature that the fluid is exposed to along the interface layer 302. It is also important that the cross sectional dimensions for the fluid paths in the apertures 322, 324 are large enough to reduce pressure drop in the heat exchanger 300. For the case in which fluid experiences only single-phase flow along the interface layer 302, each aperture 322 is preferably surrounded by several adjacent apertures 324 in a symmetrical hexagonal arrangement, as shown in FIG. 13. In addition, for single-phase flow, it is preferred that the number of apertures are approximately equal in the circulation level 304. Additionally, for single-phase flow, the apertures 322, 324 are preferably the same diameter. It is apparent to one skilled in the art that other arrangements as well as any ratio of apertures 322, 324 are alternatively contemplated.

For the case in which the fluid experiences two-phase flow along the interface layer 302, non-symmetric arrangements of the apertures 322, 324 are preferred to accommodate acceleration of the two-phase fluid. However, symmetric arrangements of the apertures 322, 324 are also contemplated for two-phase flow. For instance, the apertures 322, 324 can be symmetrically arranged in the circulation level 304, whereby the apertures 324 have larger openings than the apertures 322. Alternatively, the hexagonal symmetrical arrangement shown in FIG. 13 are used in the circulation level 304 for two-phase flow, whereby more apertures 324 are present in the circulation level 304 than apertures 322.

It is should be noted that the apertures 322, 324 in the circulation level can alternatively be arranged to cool hot spots in the heat source 99. Thus, for example, two apertures 322 are alternatively positioned immediately next to each other in the circulation level 304, whereby both apertures 322 are positioned near or above an interface hot spot region. It is apparent that the appropriate number of apertures 324 are positioned adjacent to both apertures 322 to reduce the pressure drop in the interface layer 302. Therefore, the two apertures 322 supply cool fluid to the interface hot spot region to compel the interface hot spot region, discussed above, to be a uniform, substantially equal temperature.

As stated above, the heat exchanger 300 has significant advantages over other heat exchangers. The configuration of the heat exchanger 300 is alternatively utilized with a modest-performance pump due to the reduction of pressure drop caused by the vertical fluid paths. In addition, the configuration of the heat exchanger 300 allows independent optimization of the inlet, and fluid paths along the interface layer 302. Additionally, the separate levels allow a customizable design foundation to optimize the uniformity of heat transfer, reduction of pressure drop and dimensions of the individual components therein. The configuration of the heat exchanger 300 also reduces the pressure drop in systems in which the fluid undergoes two phase flow and thereby can be used in single phase and two phase systems. Further, as discussed below, the heat exchanger accommodates many different manufacturing methods and allows adjustment of component geometry for tolerance purposes.

The details of how the heat exchanger 100 as well as the individual layers in the heat exchanger 100 are fabricated and manufactured are discussed below. The following discussion applies to the heat exchangers of the present invention, although the heat exchanger 100 in FIG. 3B and individual layers therein are expressly referred to for simplicity. It is also apparent to one skilled in the art that although the fabrication/manufacturing details are described in relation to the present invention, the fabrication and manufacturing details also alternatively apply to conventional heat exchangers as well as two and three-tier heat exchangers utilizing one fluid inlet port and one fluid port as shown in FIGS. 1A-1C.

Preferably, the interface layer has a coefficient of thermal expansion (CTE) which is approximate or equal to that of the heat source 99. Thus, the interface layer preferably expands and contracts accordingly with the heat source 99. Alternatively, the material of the interface layer 302 has a CTE which is different than the CTE of the heat source material. An interface layer 302 made from a material such as Silicon has a CTE that matches that of the heat source 99 and has sufficient thermal conductivity to adequately transfer heat from the heat source 99 to the fluid. However, other materials are alternatively used in the interface layer 302 which have CTEs that match the heat source 99.

The interface layer preferably has a high thermal conductivity for allowing sufficient conduction to pass between the heat source 99 and fluid flowing along the interface layer 302 such that the heat source 99 does not overheat. The interface layer is preferably made from a material having a high thermal conductivity of 100 W/m-K. However, it is apparent to one skilled in the art that the interface layer 302 has a thermal conductivity of more or less than 100 W/m-K and is not limited thereto.

To achieve the preferred high thermal conductivity, the interface layer is preferably made from copper. Alternatively, the interface layer is made from any other material including, but not limited to single-crystalline dielectric materials, metals, aluminum, nickel, a semiconductor substrate, such as Silicon, Kovar, graphite, diamond, composites and any appropriate alloys. An alternative material of the interface layer 302 is a patterned or molded organic mesh.

The present invention has been described in terms of specific embodiments incorporating details to facilitate the understanding of the principles of construction and operation of the invention. As such, references herein to specific embodiments and details thereof are not intended to limit the scope of the claims appended hereto. It will be apparent to those skilled in the art that modifications can be made to the embodiments chosen for illustration without departing from the spirit and scope of the invention.

We claim:

1. A method of fabricating a heat exchanger comprising microstructures, the method comprising:
    a. forming a plurality of microscaled apertures through a plurality of heat conductive layers using a material removal process to form a plurality of windowed layers; and
    b. forming a micromesh within a composite microstructure by coupling the plurality of windowed layers together to form the composite microstructure, wherein each microscaled aperture of a windowed layer is in communication with a plurality of microscaled apertures of an adjacent windowed layer.

2. The method of fabricating a heat exchanger of claim 1, wherein the plurality of windowed layers are coupled together by brazing.

3. The method of fabricating a heat exchanger of claim 2, wherein the brazing is done with a brazing material comprising silver.

4. The method of fabricating a heat exchanger of claim 2, wherein one or more of the plurality of windowed layers are plated with a brazing material prior to brazing.

5. The method of fabricating a heat exchanger of claim 1, wherein the step of forming the plurality of microscaled apertures through each of the plurality of heat conductive layers using a material removal process comprises forming a first micropattern in a first side of each heat conductive layer and a second micropattern in a second side of each heat conductive layer.

6. The method of fabricating a heat exchanger of claim 5, wherein the first and second micropatterns are complementary to form continuous microchannels in the heat conductive layer.

7. The method of fabricating a heat exchanger of claim 5, wherein the first and second micropatterns are designed to form an overlapping micromesh structure in the heat conductive layer.

8. The method of fabricating a heat exchanger of claim 1, wherein the material removal process is an isotropic wet etching process.

9. The method of fabricating a heat exchanger of claim 8, wherein the isotropic wet etching process is selected from a group consisting of photo chemical machining, through mask chemical etching, through mask electrochemical etching, electroetching, and electrochemical micromachining.

10. The method of fabricating a heat exchanger of claim 1, wherein the heat conductive layers comprise copper.

11. The method of fabricating a heat exchanger of claim 1, further comprising a step of aligning apertures in each of the plurality of windowed layers before coupling the plurality of windowed layers together.

12. The method of fabricating a heat exchanger of claim 1, wherein the micromesh is integrally formed with the composite microstructure.

13. The method of fabricating a heat exchanger of claim 1, wherein the composite microstructure comprises a plurality of microchannels.

14. The method of fabricating a heat exchanger of claim 1, wherein the heat conductive layers have a thickness between about 50 and about 250 micrometers.

15. The method of fabricating a heat exchanger of claim 1, wherein the microscaled apertures formed in the heat conductive layers have length and width dimensions between about 50 and about 300 micrometers.

16. A method of fabricating a heat exchanger comprising microstructures, the method comprising:
    a. forming a plurality of elongated and parallel microscaled apertures through a plurality of heat conductive layers using a material removal process to form a plurality of windowed layers; and
    b. forming a micromesh within a composite microstructure by coupling the plurality of windowed layers together to form the composite microstructure, wherein microscaled apertures of a first windowed layer are non-parallel with microscaled apertures of an adjacent windowed layer.

* * * * *